(12) United States Patent
Ohno et al.

(10) Patent No.: US 10,861,733 B2
(45) Date of Patent: Dec. 8, 2020

(54) MANUFACTURING METHOD OF SEMICONDUCTOR DEVICE

(71) Applicant: Semiconductor Energy Laboratory Co., Ltd., Atsugi (JP)

(72) Inventors: Masakatsu Ohno, Utsunomiya (JP); Seiji Yasumoto, Tochigi (JP); Naoki Ikezawa, Tochigi (JP); Satoru Idojiri, Tochigi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1 day.

(21) Appl. No.: 15/664,367

(22) Filed: Jul. 31, 2017

(65) Prior Publication Data

US 2018/0047609 A1 Feb. 15, 2018

(30) Foreign Application Priority Data

Aug. 9, 2016 (JP) .................................. 2016-156143

(51) Int. Cl.
*H01L 27/12* (2006.01)
*H01L 21/683* (2006.01)
(Continued)

(52) U.S. Cl.
CPC ........ *H01L 21/6835* (2013.01); *H01L 21/481* (2013.01); *H01L 21/7806* (2013.01);
(Continued)

(58) Field of Classification Search
CPC ........... H01L 21/02118; H01L 21/7806; H01L 2221/68318; H01L 2221/68386; H01L 27/1218; H01L 27/1262; H01L 51/0097
See application file for complete search history.

(56) References Cited

U.S. PATENT DOCUMENTS 4,618,878 A * 10/1986 Aoyama ............. H01L 23/5329
252/79.1
5,952,708 A 9/1999 Yamazaki
(Continued)

FOREIGN PATENT DOCUMENTS

CN 101785086 A 7/2010
CN 103887440 A 6/2014
(Continued)

OTHER PUBLICATIONS

International Search Report (Application No. PCT/IB2017/052785) dated Jul. 4, 2017.
(Continued)

*Primary Examiner* — Bryan R Junge
(74) *Attorney, Agent, or Firm* — Robinson Intellectual Property Law Office; Eric J. Robinson

(57) ABSTRACT

The yield of a manufacturing process of a display device is increased. The productivity of a display device is increased. A hydrogen-containing layer is formed over a substrate. Then, an oxygen-containing layer is formed over the hydrogen-containing layer. After that, a first layer is formed over the oxygen-containing layer with the use of a material containing a resin or a resin precursor. Subsequently, first heat treatment is performed on the first layer, so that a resin layer is formed. Next, a layer to be peeled is formed over the resin layer. The layer to be peeled and the substrate are separated from each other. The first heat treatment is performed in an oxygen-containing atmosphere.

16 Claims, 32 Drawing Sheets

(51) Int. Cl.
| | |
|---|---|
| *H01L 21/78* | (2006.01) |
| *H01L 21/48* | (2006.01) |
| *H01L 29/66* | (2006.01) |
| *H01L 29/786* | (2006.01) |
| H01L 21/02 | (2006.01) |
| G02F 1/1335 | (2006.01) |
| G02F 1/1343 | (2006.01) |
| G02F 1/1368 | (2006.01) |
| H01L 27/32 | (2006.01) |
| H01L 51/00 | (2006.01) |
| H01L 51/56 | (2006.01) |

(52) U.S. Cl.
CPC ...... *H01L 27/1218* (2013.01); *H01L 27/1266* (2013.01); *H01L 29/66969* (2013.01); *H01L 29/7869* (2013.01); *G02F 1/1368* (2013.01); G02F 1/13439 (2013.01); G02F 1/133553 (2013.01); G02F 2201/123 (2013.01); H01L 21/02422 (2013.01); H01L 21/02488 (2013.01); H01L 21/02565 (2013.01); H01L 21/02631 (2013.01); H01L 21/02664 (2013.01); H01L 27/1222 (2013.01); H01L 27/1225 (2013.01); H01L 27/1274 (2013.01); H01L 27/3262 (2013.01); H01L 29/78648 (2013.01); H01L 51/0097 (2013.01); H01L 51/56 (2013.01); H01L 2221/6835 (2013.01); H01L 2221/68345 (2013.01); H01L 2221/68381 (2013.01); H01L 2221/68386 (2013.01); H01L 2251/5338 (2013.01)

(56) References Cited

U.S. PATENT DOCUMENTS

| | | |
|---|---|---|
| 5,969,463 A | 10/1999 | Tomita et al. |
| 5,990,542 A | 11/1999 | Yamazaki |
| 6,127,199 A | 10/2000 | Inoue et al. |
| 6,372,608 B1 | 4/2002 | Shimoda et al. |
| 6,521,511 B1 | 2/2003 | Inoue et al. |
| 6,645,830 B2 | 11/2003 | Shimoda et al. |
| RE38,466 E | 3/2004 | Inoue et al. |
| 6,707,614 B2 | 3/2004 | Tanaka |
| 6,818,530 B2 | 11/2004 | Shimoda et al. |
| 6,870,125 B2 | 3/2005 | Doi et al. |
| 6,946,361 B2 | 9/2005 | Takayama et al. |
| 7,050,835 B2 | 5/2006 | Hack et al. |
| 7,094,665 B2 | 8/2006 | Shimoda et al. |
| 7,285,476 B2 | 10/2007 | Shimoda et al. |
| 7,335,573 B2 | 2/2008 | Takayama et al. |
| RE40,601 E | 12/2008 | Inoue et al. |
| 7,468,308 B2 | 12/2008 | Shimoda |
| 7,473,928 B1 | 1/2009 | Yamazaki et al. |
| 7,547,866 B2 | 6/2009 | Tanaka et al. |
| 7,591,863 B2 | 9/2009 | Watanabe et al. |
| 7,709,309 B2 | 5/2010 | Moriwaka |
| 7,726,013 B2 | 6/2010 | Kimura |
| 7,791,072 B2 | 9/2010 | Kumomi et al. |
| 7,833,871 B2 | 11/2010 | Kawakami et al. |
| 7,879,687 B2 | 2/2011 | Yamada |
| 7,968,388 B2 | 6/2011 | Komatsu |
| 8,048,777 B2 | 11/2011 | Eguchi et al. |
| 8,110,442 B2 | 2/2012 | Jinbo |
| 8,123,896 B2 | 2/2012 | Watanabe et al. |
| 8,168,511 B2 | 5/2012 | Nishiki et al. |
| 8,173,519 B2 | 5/2012 | Morisue et al. |
| 8,199,269 B2 | 6/2012 | Hattori et al. |
| 8,202,365 B2 | 6/2012 | Umeda et al. |
| 8,211,725 B2 | 7/2012 | Park et al. |
| 8,222,092 B2 | 7/2012 | Yamazaki et al. |
| 8,227,353 B2 | 7/2012 | Omata et al. |
| 8,237,166 B2 | 8/2012 | Kumomi et al. |
| 8,274,079 B2 | 9/2012 | Yamazaki |
| 8,597,965 B2 | 12/2013 | Hatano et al. |
| 8,816,349 B2 | 8/2014 | Yamazaki et al. |
| 8,895,974 B2 | 11/2014 | Sugimoto et al. |
| 8,969,128 B2 | 3/2015 | Cho et al. |
| 8,981,359 B2 | 3/2015 | Kum et al. |
| 9,000,443 B2 | 4/2015 | Hatano |
| 9,268,162 B2 | 2/2016 | Haskal |
| 9,427,949 B2 | 8/2016 | Ohno et al. |
| 9,437,831 B2 | 9/2016 | Yamazaki et al. |
| 9,770,894 B2 | 9/2017 | Ohno et al. |
| 2002/0146893 A1 | 10/2002 | Shimoda et al. |
| 2003/0032210 A1 | 2/2003 | Takayama et al. |
| 2003/0144034 A1 | 7/2003 | Hack et al. |
| 2004/0209442 A1 | 10/2004 | Takakuwa et al. |
| 2008/0042168 A1 | 2/2008 | Watanabe et al. |
| 2009/0269621 A1 | 10/2009 | Lifka et al. |
| 2010/0073615 A1 | 3/2010 | Yaguchi et al. |
| 2011/0084267 A1 | 4/2011 | Yamazaki et al. |
| 2011/0156062 A1 | 6/2011 | Kim et al. |
| 2011/0204361 A1* | 8/2011 | Nishiki ........... H01L 21/268 257/52 |
| 2011/0294244 A1 | 12/2011 | Hattori et al. |
| 2012/0034451 A1 | 2/2012 | Seo et al. |
| 2012/0187399 A1* | 7/2012 | Fukuda ........... H01L 29/78603 257/43 |
| 2012/0228617 A1 | 9/2012 | Ko et al. |
| 2012/0280229 A1 | 11/2012 | Suzuki et al. |
| 2013/0341629 A1 | 12/2013 | Seo et al. |
| 2014/0113440 A1 | 4/2014 | Tanaka et al. |
| 2014/0234664 A1 | 8/2014 | Yasumoto et al. |
| 2014/0339517 A1 | 11/2014 | Park et al. |
| 2015/0060778 A1 | 3/2015 | Kim et al. |
| 2015/0123106 A1* | 5/2015 | Yasumoto ........... B32B 43/006 257/40 |
| 2015/0151514 A1 | 6/2015 | Kikuchi et al. |
| 2015/0151531 A1 | 6/2015 | Ohno et al. |
| 2015/0183932 A1* | 7/2015 | Katayama ........... C08J 5/18 257/40 |
| 2015/0210048 A1 | 7/2015 | Jeong et al. |
| 2015/0303408 A1 | 10/2015 | Lee et al. |
| 2015/0372255 A1* | 12/2015 | Fukumoto ........... H01L 51/5253 257/40 |
| 2016/0079320 A1* | 3/2016 | Kim ........... H01L 27/3244 257/88 |
| 2016/0133864 A1* | 5/2016 | Kim ........... C08G 79/00 257/88 |
| 2016/0222165 A1* | 8/2016 | Wakita ........... G02B 5/20 |
| 2017/0110620 A1 | 4/2017 | Hino et al. |
| 2017/0200891 A1 | 7/2017 | Suga et al. |
| 2018/0165996 A1* | 6/2018 | Ochi ........... G09F 9/30 |

FOREIGN PATENT DOCUMENTS

| | | |
|---|---|---|
| CN | 105206677 A | 12/2015 |
| CN | 105762161 A | 7/2016 |
| CN | 106537555 A | 3/2017 |
| EP | 3125308 A | 2/2017 |
| EP | 3171390 A | 5/2017 |
| JP | 2013-038229 A | 2/2013 |
| JP | 2014-187356 A | 10/2014 |
| JP | 2015-223823 A | 12/2015 |
| JP | 2016-036005 A | 3/2016 |
| KR | 2015-0064671 A | 6/2015 |
| KR | 2015-0120376 A | 10/2015 |
| KR | 2017-0034386 A | 3/2017 |
| TW | 201438115 | 10/2014 |
| TW | 201529329 | 8/2015 |
| TW | 201611372 | 3/2016 |
| WO | WO-2013/035298 | 3/2013 |
| WO | WO-2014/129519 | 8/2014 |
| WO | WO-2015/147106 | 10/2015 |
| WO | WO-2016/010106 | 1/2016 |

OTHER PUBLICATIONS

Written Opinion (Application No. PCT/IB2017/052785) dated Jul. 4, 2017.

Kusunoki.K et al., "Transmissive OLED and Reflective LC Hybrid

(56) References Cited

OTHER PUBLICATIONS (TR-Hybrid) Display", SID Digest '16 : SID International Symposium Digest of Technical Papers, May 22, 2016, vol. 47, pp. 57-60.
Sakuishi.T et al., "Transmissive OLED and Reflective LC Hybrid (TR-Hybrid) Display with High Visibility and Low Power Consumption", SID DIGEST '16 : SID International Symposium Digest of Technical Papers, May 22, 2016, vol. 47, pp. 735-738.
Ohide.T et al., "Application of Transfer Technology to Manufacturing of Transmissive OLED and Reflective LC Hybrid (TR-Hybrid) Display", SID Digest '16 : SID International Symposium Digest of Technical Papers, May 22, 2016, vol. 47, pp. 1002-1004.
Taiwanese Office Action (Application No. 105137944) dated Apr. 30, 2020.
Taiwanese Office Action (Application No. 105137944) dated Aug. 27, 2020.

\* cited by examiner

FIG. 4A1
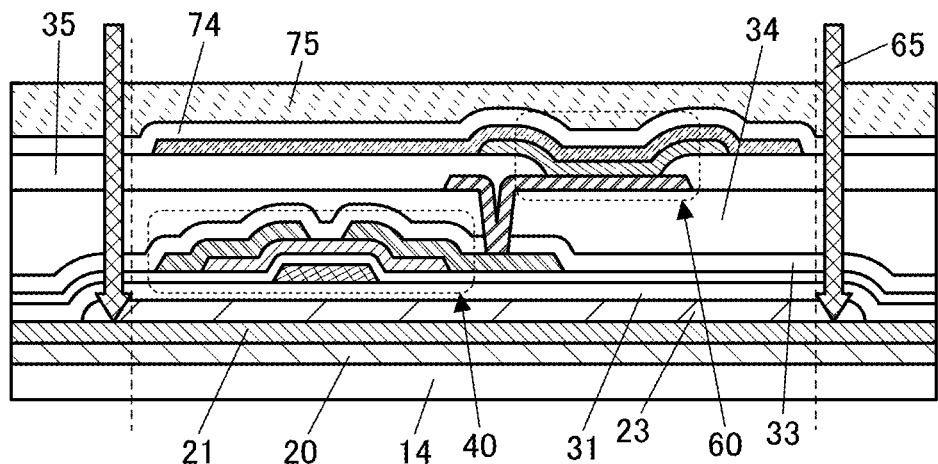
FIG. 4A2
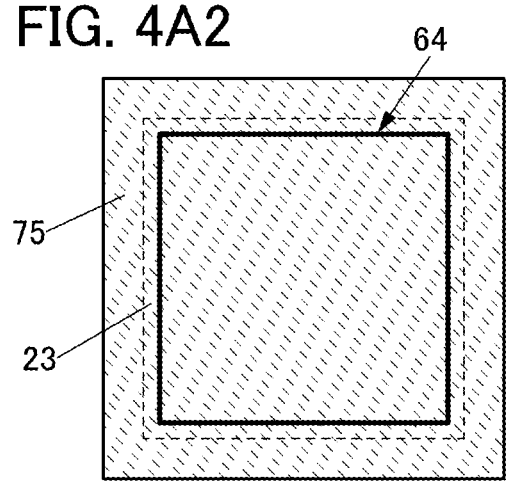
FIG. 4A3
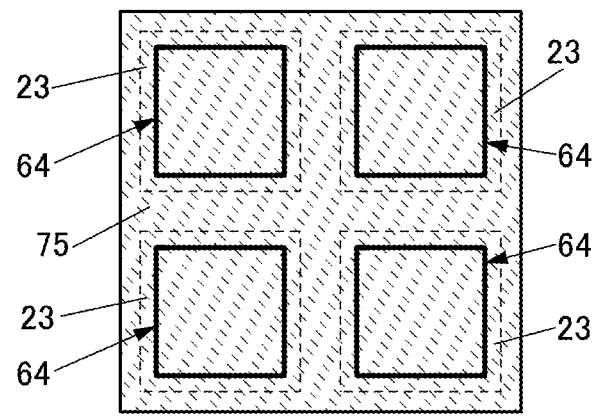
FIG. 4B
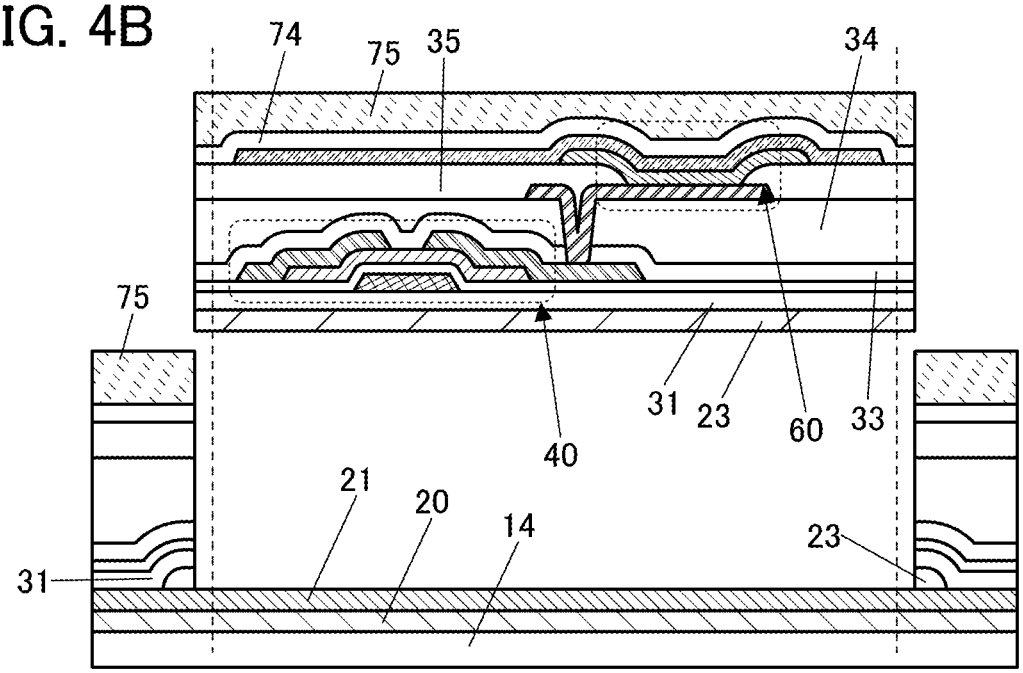

MANUFACTURING METHOD OF SEMICONDUCTOR DEVICE

TECHNICAL FIELD

One embodiment of the present invention relates to a peeling method, a manufacturing method of a semiconductor device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a driving method thereof, and a manufacturing method thereof.

Note that in this specification and the like, a semiconductor device generally means a device that can function by utilizing semiconductor characteristics. A transistor, a semiconductor circuit, a display device, a light-emitting device, an input device, an input/output device, an arithmetic device, a memory device, and the like are each an embodiment of a semiconductor device. In addition, an imaging device, an electro-optical device, a power generation device (e.g., a thin film solar cell and an organic thin film solar cell), and an electronic device each may include a semiconductor device.

BACKGROUND ART

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

A flexible display device can be obtained by formation of a semiconductor element such as a transistor or a display element such as an organic EL element over a flexible substrate (film).

In a manufacturing method of a flexible display device that is disclosed in Patent Document 1, laser light irradiation is performed on a supporting substrate (a glass substrate) over which a sacrifice layer, a heat-resistant resin layer, and an electronic element are provided in that order, and the heat-resistant resin layer is peeled from the glass substrate.

REFERENCE

Patent Document

[Patent Document 1] Japanese Published Patent Application No. 2015-223823

DISCLOSURE OF INVENTION

An object of one embodiment of the present invention is to provide a novel peeling method, a novel manufacturing method of a semiconductor device, or a novel manufacturing method of a display device. Another object of one embodiment of the present invention is to provide a peeling method, a manufacturing method of a semiconductor device, or a manufacturing method of a display device each having a low cost and a high productivity. Another object of one embodiment of the present invention is to provide a high-yield peeling method. Another object of one embodiment of the present invention is to perform peeling using a large-sized substrate. Another object of one embodiment of the present invention is to manufacture a semiconductor device or a display device using a large-sized substrate. Another object of one embodiment of the present invention is to simplify a manufacturing process of a semiconductor device or a display device. Another object of one embodiment of the present invention is to manufacture a semiconductor device or a display device at low temperatures.

Another object of one embodiment of the present invention is to provide a display device with low power consumption. Another object of one embodiment of the present invention is to provide a display device with high visibility regardless of the ambient brightness. Another object of one embodiment of the present invention is to provide an all-weather display device. Another object of one embodiment of the present invention is to provide a display device with high convenience. Another object of one embodiment of the present invention is to provide a display device with high reliability. Another object of one embodiment of the present invention is to reduce the thickness or weight of a display device. Another object of one embodiment of the present invention is to provide a display device having flexibility or a curved surface. Another object of one embodiment of the present invention is to provide a robust display device. Another object of one embodiment of the present invention is to provide a novel display device, a novel input/output device, a novel electronic device, or the like.

Note that the descriptions of these objects do not preclude the existence of other objects. One embodiment of the present invention does not necessarily achieve all the objects. Other objects can be derived from the description of the specification, the drawings, and the claims.

One embodiment of the present invention is a manufacturing method of a semiconductor device, which includes a step of forming a hydrogen-containing layer over a substrate; a step of forming an oxygen-containing layer over the hydrogen-containing layer; a step of forming a first layer over the oxygen-containing layer with the use of a material containing a resin or a resin precursor; a step of performing first heat treatment on the first layer in an oxygen-containing atmosphere to form a resin layer; a step of forming a layer to be peeled over the resin layer; and a step of separating the layer to be peeled and the substrate from each other. In the step of forming the layer to be peeled, for example, an insulating layer covering an end portion of the resin layer can be formed over the substrate and over the resin layer, and a transistor can be formed over the resin layer with the insulating layer provided between the transistor and the resin layer. The layer to be peeled and the substrate are preferably separated from each other after a separation trigger is formed by separation of at least part of the resin layer from the substrate.

Second heat treatment is preferably performed in an oxygen-containing atmosphere after at least part of the layer to be peeled is formed. The second heat treatment is preferably performed at a temperature lower than or equal to the temperature of the first heat treatment. An oxygen-containing gas is preferably supplied in the second heat treatment.

An oxygen-containing gas is preferably supplied in the first heat treatment. The first heat treatment is preferably performed at higher than or equal to 300° C. and lower than or equal to 450° C.

The hydrogen-containing layer is preferably configured to release hydrogen by being heated. The hydrogen-containing layer preferably includes at least one of silicon oxide, silicon oxynitride, and amorphous silicon.

The oxygen-containing layer preferably includes a metal oxide.

The first layer may be formed with the use of a solution with a viscosity of greater than or equal to 5 cP and less than 100 cP. The first layer may be formed with the use of a spin coater.

The resin layer is preferably formed to have a region with a thickness of greater than or equal to 1 μm and less than or equal to 3 μm. The resin layer preferably includes a polyimide.

The layer to be peeled is preferably formed at a temperature lower than or equal to the temperature of the first heat treatment.

According to one embodiment of the present invention, a novel peeling method, a novel manufacturing method of a semiconductor device, or a novel manufacturing method of a display device can be provided. According to one embodiment of the present invention, a peeling method, a manufacturing method of a semiconductor device, or a manufacturing method of a display device each having a low cost and a high productivity can be provided. According to one embodiment of the present invention, a high-yield peeling method can be provided. According to one embodiment of the present invention, peeling can be performed using a large-sized substrate. According to one embodiment of the present invention, a semiconductor device or a display device can be manufactured using a large-sized substrate. According to one embodiment of the present invention, a manufacturing process of a semiconductor device or a display device can be simplified. According to one embodiment of the present invention, a semiconductor device or a display device can be manufactured at low temperatures.

According to one embodiment of the present invention, a display device with low power consumption can be provided. According to one embodiment of the present invention, a display device with high visibility regardless of the ambient brightness can be provided. According to one embodiment of the present invention, an all-weather display device can be provided. According to one embodiment of the present invention, a display device with high convenience can be provided. According to one embodiment of the present invention, a display device with high reliability can be provided. According to one embodiment of the present invention, the thickness or weight of a display device can be reduced. According to one embodiment of the present invention, a display device having flexibility or a curved surface can be provided. According to one embodiment of the present invention, a robust display device can be provided. According to one embodiment of the present invention, a novel display device, a novel input/output device, a novel electronic device, or the like can be provided.

Note that the descriptions of these effects do not preclude the existence of other effects. One embodiment of the present invention does not necessarily have all the effects. Other effects can be derived from the description of the specification, the drawings, and the claims.

BRIEF DESCRIPTION OF DRAWINGS

FIGS. 4A1, 4A2, 4A3, and 4B are cross-sectional views and top views illustrating examples of a manufacturing method of a display device.

BEST MODE FOR CARRYING OUT THE INVENTION

Figure 1A:
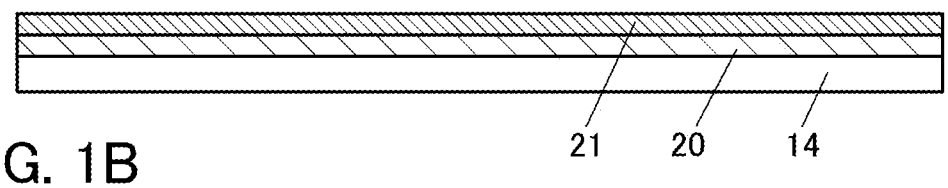
FIGS. 1A to 1F are cross-sectional views illustrating an example of a manufacturing method of a display device.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not denoted by reference numerals in some cases.

The position, size, range, or the like of components illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film," and the term "insulating film" can be changed into the term "insulating layer."

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a peeling method of one embodiment of the present invention and a manufacturing method of a display device of one embodiment of the present invention will be described with reference to FIGS. 1A to 1F, FIGS. 2A to 2E, FIGS. 3A to 3D, FIGS. 4A1, 4A2, 4A3, and 4B, FIGS. 5A to 5C, FIGS. 6A to 6C, FIGS. 7A to 7C, FIGS. 8A and 8B, FIGS. 9A and 9B, FIGS. 10A and 10B, FIGS. 11A and 11B, FIGS. 12A and 12B, FIGS. 13A to 13E, and FIGS. 14A and 14B.

In this embodiment, a display device that includes a transistor and an organic EL element (also referred to as an active matrix organic EL display device) will be described as an example. The display device can have flexibility by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other kinds of functional elements.

In this embodiment, first, a hydrogen-containing layer is formed over a substrate. Then, an oxygen-containing layer is formed over the hydrogen-containing layer. After that, a first layer is formed over the oxygen-containing layer with the use of a material containing a resin or a resin precursor. Subsequently, first heat treatment is performed on the first layer, so that a resin layer is formed. Then, a layer to be peeled is formed over the resin layer. After at least part of the layer to be peeled is formed, second heat treatment is preferably performed. The layer to be peeled and the substrate are separated from each other. Each of the first heat treatment and the second heat treatment is preferably performed in an oxygen-containing atmosphere. During each of the first heat treatment and the second heat treatment, an oxygen-containing gas is preferably supplied.

Depending on conditions or the like, the oxygen-containing gas does not need to be supplied during one of the first heat treatment and the second heat treatment. For example, one of the first heat treatment and the second heat treatment may be performed in a nitrogen atmosphere or a reduced-pressure atmosphere.

The resin layer that is formed by heating the first layer in an atmosphere containing a sufficient amount of oxygen contains a large amount of oxygen. The amount of the oxygen contained in the resin layer is preferably large, in which case the substrate and the resin layer can be easily separated from each other.

The heat treatment makes the hydrogen-containing layer release hydrogen. The hydrogen and the oxygen that is contained in the oxygen-containing layer react with each other to produce water. The water is released from the oxygen-containing layer to the interface between the oxygen-containing layer and the resin layer.

The water existing between the oxygen-containing layer and the resin layer lowers the adhesion between the oxygen-containing layer and the resin layer. As a result, separation can be easily performed at the interface between the oxygen-containing layer and the resin layer.

Furthermore, the heat treatment expands the water between the oxygen-containing layer and the resin layer (the water changes into water vapor to have expanded volume). Accordingly, the adhesion between the oxygen-containing layer and the resin layer can be lowered.

In the peeling method described in this embodiment, the hydrogen-containing layer and the oxygen-containing layer are stacked and the heating conditions are controlled, whereby the resin layer can be easily peeled from the substrate. Accordingly, a step of irradiating the entire area of the resin layer with laser light to increase the peelability of the resin layer is not needed.

When the entire area of the resin layer is irradiated with laser light, a linear laser beam can be suitably used; however, a laser apparatus for linear laser beam irradiation is expensive and has high running costs. The peeling method described in this embodiment does not require the laser apparatus and thus can reduce cost significantly. In addition, the peeling method can be easily applied to a large-sized substrate.

If a foreign matter such as dust is adhered to the surface of the substrate that is subjected to light irradiation at the time of irradiating the resin layer with laser light through the substrate, in some cases, nonuniformity occurs in light irradiation and part of the resin layer has low peelability, leading to a reduction in yield of peeling. In the peeling method described in this embodiment, the heat treatment improves the peelability of the resin layer. Even when a foreign matter is adhered to the substrate, heating nonuniformity does not easily occur in the resin layer, which inhibits a reduction in yield of peeling.

Since a step of irradiating the entire area of the resin layer with laser light through the substrate is not performed, damage to the substrate by laser light irradiation can be prevented. After being used once, the substrate substantially maintains its strength and thus can be reused, which results in cost reduction.

Furthermore, water existing at the peeling interface can suppress an adverse effect of static electricity that is caused at the time of peeling on a functional element included in the layer to be peeled (e.g., damage to a semiconductor element from static electricity).

Alternatively, in this embodiment, first, a hydrogen-containing layer is formed over a substrate. Then, an oxygen-containing layer is formed over the hydrogen-containing layer. After that, a first layer is formed over the oxygen-containing layer with the use of a material containing a resin or a resin precursor. Subsequently, first heat treatment is performed on the first layer, so that a resin layer is formed. Then, a layer to be peeled is formed over the resin layer. In the step of forming the layer to be peeled, an insulating layer covering an end portion of the resin layer is formed and a transistor is formed over the resin layer with the insulating layer provided therebetween. After at least part of the layer to be peeled is formed, second heat treatment is preferably performed. Next, at least part of the resin layer is separated from the substrate, whereby a separation trigger is formed. The layer to be peeled and the substrate are separated from each other. Each of the first heat treatment and the second heat treatment is preferably performed in an oxygen-containing atmosphere. During each of the first heat treatment and the second heat treatment, an oxygen-containing gas is preferably supplied.

The top surface of the oxygen-containing layer includes a portion in contact with the resin layer and a portion in contact with the insulating layer. The insulating layer is provided to cover the end portion of the resin layer. The insulating layer has higher adhesion to the oxygen-containing layer than the resin layer does. When the insulating layer is provided to cover the end portion of the resin layer, unintentional peeling of the resin layer from the oxygen-containing layer can be avoided. For example, peeling of the resin layer during transfer of the substrate can be avoided. In addition, the formation of the separation trigger enables the oxygen-containing layer and the resin layer to be separated from each other at desired timing. In other words, not only is high peelability achieved, but the timing of peeling can be controlled in this embodiment. This can increase the yield of the peeling process and the manufacturing process of a display device.

In one embodiment of the present invention, there is no particular limitation on the material used for a channel formation region of a transistor. For example, silicon or a metal oxide can be used.

When low-temperature polysilicon (LTPS) is used for a channel formation region of a transistor, the resin layer is preferably formed to have a large thickness using a material with high heat resistance. In that case, it is possible to employ a high-temperature process and to reduce damage caused in a laser crystallization step. For example, the temperature of the first heat treatment is preferably higher than or equal to 400° C. and lower than or equal to 600° C., further preferably higher than or equal to 450° C. and lower than or equal to 550° C. The thickness of the resin layer is preferably greater than or equal to 10 µm and less than or equal to 200 µm, further preferably greater than or equal to 10 µm and less than or equal to 100 µm, still further preferably greater than or equal to 10 µm and less than or equal to 50 µm. When the resin layer has a sufficiently large thickness, damage caused in the laser crystallization step can be reduced. The 5% weight loss temperature of the resin layer is preferably higher than or equal to 400° C. and lower than or equal to 600° C., further preferably higher than or equal to 450° C. and lower than or equal to 600° C., still further preferably higher than or equal to 500° C. and lower than or equal to 600° C.

In one embodiment of the present invention, a metal oxide is preferably included in a channel formation region of a transistor. A metal oxide can function as an oxide semiconductor.

In the case where LTPS is used for a channel formation region of a transistor, the resin layer is required to have heat resistance as described above because heat at a temperature of approximately 500° C. to 550° C. needs to be applied. Furthermore, the resin layer needs to have a large thickness so that damage in the laser crystallization step is reduced.

In contrast, a transistor including a metal oxide in a channel formation region can be formed at a temperature lower than or equal to 350° C., or even lower than or equal to 300° C. Therefore, the resin layer is not required to have high heat resistance. Accordingly, the upper temperature limit of the resin layer may be low, and the range of choices for the materials can be widened. Furthermore, the transistor including a metal oxide in the channel formation region does not need a laser crystallization step; thus, the resin layer can be thin. Since the resin layer is not required to have high heat resistance and can be thinned, the manufacturing cost of a device can be significantly reduced. A metal oxide is preferably used, in which case the steps can be simplified as compared with the case where LTPS is used.

In this embodiment, a transistor or the like is formed at a temperature lower than or equal to the upper temperature limit of the resin layer. The heat resistance of the resin layer can be measured by, for example, a weight loss percentage due to heat, specifically, the 5% weight loss temperature. In the peeling method of this embodiment and the manufacturing method of a display device of this embodiment, the maximum temperature in the process can be low. For example, in this embodiment, the 5% weight loss temperature of the resin layer can be higher than or equal to 200° C. and lower than or equal to 550° C., higher than or equal to 200° C. and lower than or equal to 450° C., higher than or equal to 200° C. and lower than or equal to 400° C., or higher greater than or equal to 200° C. and lower than or equal to 350° C. Thus, the range of choices for materials is widened. Note that the 5% weight loss temperature of the resin layer may be higher than 550° C.

Hereinafter, the peeling method of this embodiment and the manufacturing method of the display device of this embodiment will be specifically described.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a blocking mask. A nanoimprinting method, a sandblast method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Peeling Method]

First, a hydrogen-containing layer 20 is formed over a formation substrate 14. Then, an oxygen-containing layer 21 is formed over the hydrogen-containing layer 20 (FIG. 1A).

The formation substrate 14 has rigidity high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

The hydrogen-containing layer 20 has a function of releasing hydrogen in a later heating step. The hydrogen-containing layer 20 may have a function of releasing water in a later heating step.

The hydrogen-containing layer 20 can be formed using, for example, a silicon oxide film, a silicon nitride film, a silicon oxynitride film, or a silicon nitride oxide film. The hydrogen-containing layer 20 preferably contains one or both of oxygen and silicon.

Note that in this specification and the like, "silicon oxynitride" contains more oxygen than nitrogen. In this specification and the like, "silicon nitride oxide" contains more nitrogen than oxygen.

The hydrogen-containing layer 20 can be formed by a sputtering method, a plasma CVD method, or the like. In particular, the silicon oxynitride film included in the hydrogen-containing layer 20 is preferably formed by a plasma CVD method using a deposition gas containing a silane gas and a nitrous oxide gas, in which case a large amount of hydrogen can be contained in the film. In addition, the proportion of the silane gas in the deposition gas is preferably higher, in which case the amount of hydrogen released from the film in a later heating step is increased.

The hydrogen-containing layer 20 can be formed using a silicon film from which hydrogen is released by heating. In particular, a hydrogenated amorphous silicon (a-Si:H) film is preferably used. The hydrogenated amorphous silicon film can be formed by, for example, a plasma CVD method using a deposition gas containing $SiH_4$. The hydrogen-containing layer 20 may be formed using a silicon film having crystallinity. To make the hydrogen content of the hydrogen-containing layer 20 high, heat treatment may be performed in a hydrogen-containing atmosphere after formation of the hydrogen-containing layer 20.

The thickness of the hydrogen-containing layer 20 is preferably large for an increase in the amount of released hydrogen; however, the thickness is preferably determined in consideration of productivity.

The thickness of the silicon oxide film, silicon nitride film, silicon oxynitride film, silicon nitride oxide film, or the like is preferably greater than or equal to 1 nm and less than or equal to 1 μm, further preferably greater than or equal to 50 nm and less than or equal to 800 nm, still further preferably greater than or equal to 100 nm and less than or equal to 600 nm.

The thickness of the hydrogenated amorphous silicon film is preferably greater than or equal to 1 nm and less than or equal to 200 nm, further preferably greater than or equal to 5 nm and less than or equal to 100 nm, for example.

The hydrogen-containing layer 20 preferably includes a region in which the hydrogen concentration measured by secondary ion mass spectrometry (SIMS) is greater than or equal to $1.0\times10^{20}$ atoms/cm$^3$ and less than or equal to $1.0\times10^{22}$ atoms/cm$^3$, preferably greater than or equal to $5.0\times10^{20}$ atoms/cm$^3$ and less than or equal to $5.0\times10^{21}$ atoms/cm$^3$.

The oxygen-containing layer 21 has a function of releasing water produced by a reaction between the hydrogen released from the hydrogen-containing layer 20 and the oxygen in the oxygen-containing layer 21 in a later heating step. The oxygen-containing layer 21 may have a function of releasing oxygen in a later heating step.

A metal oxide can be suitably used as a material for the oxygen-containing layer 21.

As examples of the metal oxide, indium tin oxide containing silicon (ITSO), an In—Ga—Zn oxide, and aluminum oxide can be given.

As other examples of the metal oxide, indium oxide, indium tin oxide (ITO), indium oxide containing tungsten, indium zinc oxide containing tungsten, titanium dioxide, indium oxide containing titanium, ITO containing titanium, indium zinc oxide, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, and the like can be given.

The oxygen-containing layer 21 is preferably formed in an oxygen atmosphere. For example, a metal oxide film is formed by a sputtering method while an oxygen-containing gas is supplied, whereby the oxygen-containing layer 21 can be formed.

Alternatively, a metal film is formed and then oxygen is introduced into the metal film, whereby the oxygen-containing layer 21 can be formed. Oxygen can be introduced by an ion implantation method, an ion doping method, a plasma immersion ion implantation method, plasma treatment, or the like.

The oxygen-containing layer 21 preferably contains oxygen in excess of that in the stoichiometric composition.

The thickness of the oxygen-containing layer 21 is preferably greater than or equal to 1 nm and less than or equal to 200 nm, further preferably greater than or equal to 5 nm and less than or equal to 100 nm, for example.

Figure 1B:
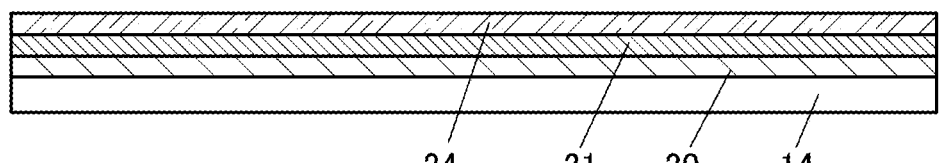

Next, a first layer 24 is formed over the oxygen-containing layer 21 (FIG. 1B).

FIG. 1B illustrates an example in which the first layer 24 is formed over the entire area of the oxygen-containing layer 21 by a coating method. One embodiment of the present invention is not limited to this example and a printing method or the like may be employed to form the first layer 24. The first layer 24 having an island-like shape or the first layer 24 having an opening or unevenness may be formed over the oxygen-containing layer 21.

The first layer 24 can be formed using any of a variety of resin materials (including resin precursors).

The first layer 24 is preferably formed using a thermosetting material.

The first layer 24 may be formed using a material with photosensitivity or a material without photosensitivity (also called a non-photosensitive material).

When a photosensitive material is used, part of the first layer 24 is removed by a photolithography method, whereby a resin layer 23 having a desired shape can be formed.

The first layer 24 is preferably formed using a material containing a polyimide resin or a polyimide resin precursor. The first layer 24 can be formed using, for example, a material containing a polyimide resin and a solvent or a material containing polyamic acid and a solvent. A polyimide is a material that is suitably used for formation of a planarization film or the like of a display device, and therefore, the film formation apparatus and the material can be shared. Thus, there is no need to prepare another apparatus and another material to obtain the structure of one embodiment of the present invention.

Examples of resin materials which can be used to form the first layer 24 include an acrylic resin, an epoxy resin, a polyamide resin, a polyimide-amide resin, a siloxane resin, a benzocyclobutene-based resin, a phenol resin, and precursors of these resins.

The first layer 24 is preferably formed using a spin coater. By a spin coating method, a thin film can be uniformly formed over a large-sized substrate.

The first layer 24 is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the application is. The lower the viscosity of the solution is, the more the entry of air bubbles can be inhibited and thus the higher the quality of a formed film can be.

The first layer 24 can be formed by dipping, spray coating, ink-jetting, dispensing, screen printing, or offset printing, with a doctor knife, a slit coater, a roll coater, a curtain coater, or a knife coater, for example.

Figure 1C:
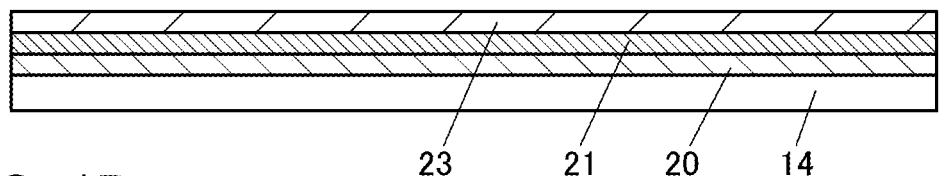

Next, the first heat treatment is performed on the first layer 24, so that the resin layer 23 is formed (FIG. 1C).

The first heat treatment is preferably performed in an oxygen-containing atmosphere.

The larger the amount of oxygen contained in the resin layer 23 is, the smaller the force required to peel the resin layer 23 from the formation substrate 14 can be. The higher the proportion of oxygen in the atmosphere of the first heat treatment is, the higher the oxygen content of the resin layer 23 can be, and thus the higher the peelability of the resin layer 23 can be.

The first heat treatment makes the hydrogen-containing layer 20 release hydrogen. Then, the hydrogen and the oxygen that is contained in the oxygen-containing layer 21 react with each other to produce water. The produced water is released from the oxygen-containing layer 21 to the interface between the oxygen-containing layer 21 and the resin layer 23.

In the case where the hydrogen-containing layer 20 contains hydrogen and oxygen, the first heat treatment sometimes makes the hydrogen-containing layer 20 release water.

The first heat treatment makes the first layer 24 or the resin layer 23 release water in some cases. Furthermore, the first heat treatment makes the oxygen-containing layer 21 release oxygen in some cases. For example, the hydrogen released from the first layer 24 or the resin layer 23 and the oxygen released from the oxygen-containing layer 21 react with each other to produce water in some cases.

In this manner, water can be supplied to the interface between the oxygen-containing layer 21 and the resin layer 23 by the first heat treatment.

The water existing between the oxygen-containing layer 21 and the resin layer 23 lowers the adhesion between the oxygen-containing layer 21 and the resin layer 23. As a result, separation can be easily performed at the interface between the oxygen-containing layer 21 and the resin layer 23.

Furthermore, the first heat treatment expands the water between the oxygen-containing layer 21 and the resin layer 23 (the water changes into water vapor to have expanded volume). Accordingly, the adhesion between the oxygen-containing layer 21 and the resin layer 23 can be lowered.

The first heat treatment can be performed with the atmosphere in a chamber of a heating apparatus set to an oxygen-containing atmosphere, for example. Alternatively, the first heat treatment can be performed in an air atmosphere with the use of a hot plate or the like.

For example, the oxygen partial pressure of the atmosphere during the first heat treatment is preferably higher than or equal to 5% and lower than 100%, further preferably higher than or equal to 10% and lower than 100%, still further preferably higher than or equal to 15% and lower than 100%.

The first heat treatment is preferably performed while an oxygen-containing gas is supplied into the chamber of the heating apparatus. The first heat treatment is preferably performed while only an oxygen gas or a mixed gas containing an oxygen gas is supplied, for example. Specifically, it is possible to use a mixed gas containing oxygen and either nitrogen or a rare gas (e.g., argon).

When the proportion of oxygen in the atmosphere is set high, some heating apparatuses deteriorate. Therefore, when a mixed gas containing an oxygen gas is used, the proportion of the oxygen gas flow rate in the total flow rate of the mixed gas is preferably higher than or equal to 5% and lower than or equal to 50%, further preferably higher than or equal to 10% and lower than or equal to 50%, still further preferably higher than or equal to 15% and lower than or equal to 50%.

The temperature of the first heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

The higher the temperature of the first heat treatment is, the higher the peelability of the resin layer 23 can be.

By the first heat treatment, released gas components (e.g., hydrogen or water) in the resin layer 23 can be reduced. In particular, the first heat treatment is preferably performed at a temperature higher than or equal to the fabricating temperature of each layer formed over the resin layer 23. Thus, a gas released from the resin layer 23 in the manufacturing process of the transistor can be significantly reduced.

For example, in the case where the manufacturing temperature of the transistor is below 350° C., a film to be the resin layer 23 is preferably heated at a temperature higher than or equal to 350° C. and lower than or equal to 450° C., further preferably higher than or equal to 350° C. and lower than or equal to 400° C., still further preferably higher than or equal to 350° C. and lower than or equal to 375° C. Thus, a gas released from the resin layer 23 in the manufacturing process of the transistor can be significantly reduced.

The maximum temperature in the fabrication for the transistor is preferably equal to the temperature of the first heat treatment, in which case it is possible to prevent the first heat treatment from increasing the maximum temperature in the fabrication for a display device.

The longer the duration of the first heat treatment is, the higher the peelability of the resin layer 23 can be.

Even when the heating temperature is relatively low, increasing treatment time enables peelability as high as the peelability that is obtained at higher heating temperatures in some cases. It is thus preferable that the treatment time be set long when the heating temperature cannot be set high owing to the structure of the heating apparatus.

The duration of the first heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the first heat treatment is not particularly limited to these examples. For example, the duration of the first heat treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the heat treatment.

Here, in the case where a resin is used for a planarization layer of a display device, for example, to prevent oxidation and deterioration of the resin, the heating is commonly performed with little oxygen and at a temperature that cures the resin and is as low as possible. However, in one embodiment of the present invention, heating is performed at relatively high temperatures (e.g., higher than or equal to 200° C.) in the state where a surface of the first layer 24 that is to be the resin layer 23 is exposed to an atmosphere that intentionally contains oxygen. This allows the resin layer 23 to have high peelability.

Note that the heat treatment sometimes makes the resin layer 23 thinner or thicker than the first layer 24. For example, in some cases, the volume decreases when the solvent contained in the first layer 24 is removed or when the density increases with proceeding curing, which makes the thickness of the resin layer 23 smaller than that of the first layer 24. Instead, in other cases, the volume increases when oxygen is supplied to the resin layer 23 at the time of the heat treatment, which makes the thickness of the resin layer 23 larger than that of the first layer 24.

Before the first heat treatment, heat treatment (also referred to as prebaking treatment) for removing the solvent contained in the first layer 24 may be performed. The temperature of the prebaking treatment can be set as appropriate according to the material that is used. For example, the prebaking treatment can be performed at higher than or equal to 50° C. and lower than or equal to 180° C., higher than or equal to 80° C. and lower than or equal to 150° C., or higher than or equal to 90° C. and lower than or equal to 120° C. The first heat treatment may double as the prebaking treatment, in which case the solvent contained in the first layer 24 can be removed by the first heat treatment.

The resin layer 23 has flexibility. The formation substrate 14 has lower flexibility than the resin layer 23.

The resin layer 23 preferably has a thickness of greater than or equal to 0.01 μm and less than 10 μm, further preferably greater than or equal to 0.1 μm and less than or equal to 3 μm, still further preferably greater than or equal to 0.5 μm and less than or equal to 2 μm. By forming the resin layer thin, the display device can be manufactured at low costs. The display device can be light-weight and thin. The display device can have higher flexibility. With a solution having low viscosity, the resin layer 23 having a small thickness can be easily formed. One embodiment of the present invention is not limited to the above examples, and the thickness of the resin layer 23 may be greater than or equal to 10 μm. For example, the resin layer 23 may have a thickness of greater than or equal to 10 μm and less than or equal to 200 μm. The resin layer 23 preferably has a thickness of greater than or equal to 10 μm because the rigidity of the display device can be increased.

The resin layer 23 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 23 is, the more the generation of a crack in a layer included in a transistor or the like and breakage of a transistor or the like which are caused owing to the heating can be prevented.

In the case where the resin layer 23 is positioned on the display surface side of the display device, the resin layer 23 preferably has a high visible-light transmitting property.

Figure 1D:
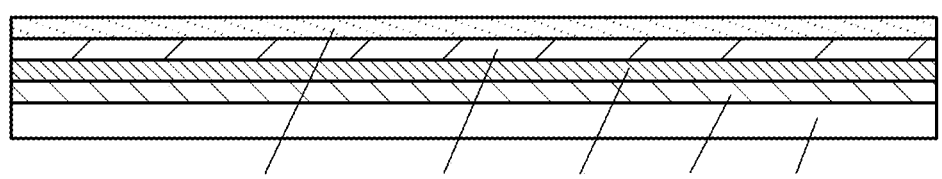

Next, a layer 25 to be peeled is formed over the resin layer 23 (FIG. 1D).

An insulating layer or a functional element (e.g., a transistor or a display element), for example, can be provided as the layer 25 to be peeled.

The layer 25 to be peeled preferably includes an insulating layer. The insulating layer preferably has a function of blocking hydrogen, oxygen, and water that are released from the hydrogen-containing layer 20, the oxygen-containing layer 21, the resin layer 23, and the like in a later heating step.

The layer to be peeled preferably includes, for example, a silicon nitride film, a silicon oxynitride film, or a silicon nitride oxide film. For example, a silicon nitride film is formed by a plasma CVD method using a deposition gas containing a silane gas, a hydrogen gas, and an ammonia ($NH_3$) gas. There are no particular limitations on the thickness of the insulating layer. The thickness can be, for example, greater than or equal to 50 nm and less than or equal to 600 nm, preferably greater than or equal to 100 nm and less than or equal to 300 nm.

After the insulating layer having a function of blocking hydrogen, oxygen, and water is formed, second heat treatment is preferably performed.

The first heat treatment is performed in the state where the surface of the first layer 24 is exposed so that the first layer 24 is cured to form the resin layer 23. This makes part of water produced by heating be released from a surface of the first layer 24 or the resin layer 23 to the outside in some cases. Depending on the conditions for forming a film over the resin layer 23 after the first heat treatment (for example, when the temperature is high or a reducing atmosphere is used), the proportion of oxygen in the resin layer 23 decreases in some cases.

Thus, the second heat treatment is preferably performed in the state where the surface of the resin layer 23 is not exposed. In that case, it is possible to inhibit hydrogen and water that are generated by the second heat treatment from being released from the surface of the resin layer 23 to the outside. The second heat treatment can be performed after at least part of the layer to be peeled is formed over the resin layer 23. The heat treatment during the manufacturing process of a functional element such as a transistor may double as the second heat treatment.

The second heat treatment is preferably performed in an oxygen-containing atmosphere.

The second heat treatment can make the resin layer 23 contain a large amount of oxygen. In addition, water can be supplied to the interface between the oxygen-containing layer 21 and the resin layer 23 by the second heat treatment.

The second heat treatment makes the hydrogen-containing layer 20 release hydrogen. Then, the hydrogen and the oxygen that is contained in the oxygen-containing layer 21 react with each other to produce water. The produced water is released from the oxygen-containing layer 21 to the interface between the oxygen-containing layer 21 and the resin layer 23.

The water existing between the oxygen-containing layer 21 and the resin layer 23 lowers the adhesion between the oxygen-containing layer 21 and the resin layer 23. As a result, separation can be easily performed at the interface between the oxygen-containing layer 21 and the resin layer 23.

Furthermore, the second heat treatment expands the water between the oxygen-containing layer 21 and the resin layer 23 (the water changes into water vapor to have expanded volume). Accordingly, the adhesion between the oxygen-containing layer 21 and the resin layer 23 can be lowered.

The second heat treatment can be performed with the atmosphere in a chamber of a heating apparatus set to an oxygen-containing atmosphere, for example. Alternatively, the second heat treatment can be performed in an air atmosphere with the use of a hot plate or the like.

For example, the oxygen partial pressure of the atmosphere during the second heat treatment is preferably higher than or equal to 5% and lower than 100%, further preferably higher than or equal to 10% and lower than 100%, still further preferably higher than or equal to 15% and lower than 100%.

The second heat treatment is preferably performed while an oxygen-containing gas is supplied into the chamber of the heating apparatus. The second heat treatment is preferably performed while only an oxygen gas or a mixed gas containing an oxygen gas is supplied, for example. Specifically, it is possible to use a mixed gas containing oxygen and either nitrogen or a rare gas (e.g., argon).

When the proportion of oxygen in the atmosphere is set high, some heating apparatuses deteriorate. Therefore, when a mixed gas containing an oxygen gas is used, the proportion of the oxygen gas flow rate in the total flow rate of the mixed gas is preferably higher than or equal to 5% and lower than or equal to 50%, further preferably higher than or equal to 10% and lower than or equal to 50%, still further preferably higher than or equal to 15% and lower than or equal to 50%.

The temperature of the second heat treatment is preferably higher than or equal to 200° C. and lower than or equal to 500° C., further preferably higher than or equal to 250° C. and lower than or equal to 475° C., still further preferably higher than or equal to 300° C. and lower than or equal to 450° C.

The higher the temperature of the second heat treatment is, the higher the peelability of the resin layer 23 can be.

The temperature of the second heat treatment is preferably lower than or equal to that of the first heat treatment temperature. In that case, a gas released from the resin layer 23 can be inhibited from entering a functional element such as a transistor during the second heat treatment.

The longer the duration of the second heat treatment is, the higher the peelability of the resin layer 23 can be.

Even when the heating temperature is relatively low, increasing treatment time enables peelability as high as the peelability that is obtained at higher heating temperatures in some cases. It is thus preferable that the treatment time be set long when the heating temperature cannot be set high owing to the structure of the heating apparatus.

The duration of the second heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the second heat treatment is not particularly limited to these examples. For example, the duration of the second heat treatment that is performed by an RTA method may be shorter than five minutes.

Next, a protective layer is formed over the layer 25 to be peeled. The protective layer is a layer positioned on the outermost surface of the display device. The protective layer preferably has a high visible-light transmitting property. The protective layer preferably includes an organic insulating film because it is possible to prevent the surface of the display device from being damaged or cracked.

Figure 1E:
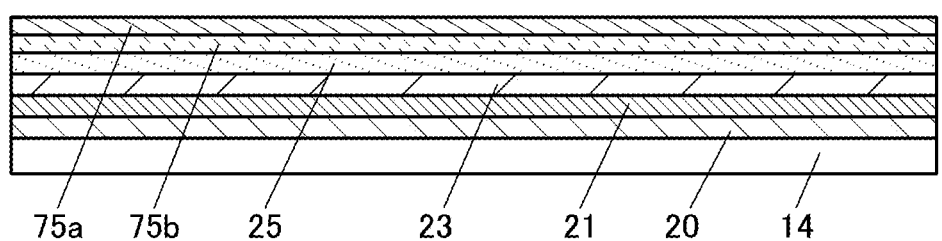

FIG. 1E illustrates an example in which a substrate 75a is bonded to the layer 25 to be peeled, with the use of an adhesive layer 75b.

As the adhesive layer 75b, any of various curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

For the substrate 75a, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyethersulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75a formed using any of a variety of materials such as glass, quartz, a resin, a metal, an alloy, and a semiconductor may be thin enough to be flexible.

Figure 1F:
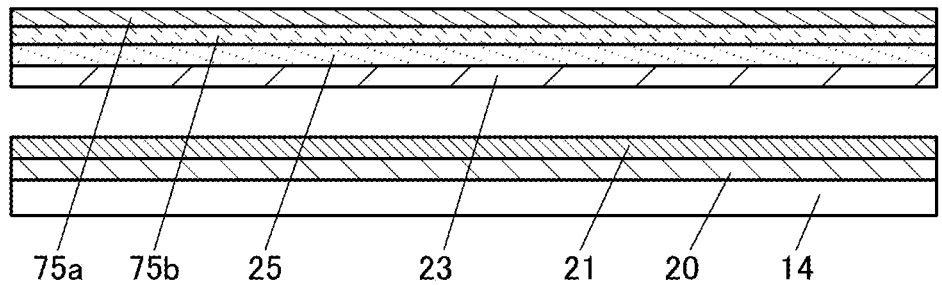

Then, the formation substrate 14 and the resin layer 23 are separated from each other. Owing to the low adhesion between the oxygen-containing layer 21 and the resin layer 23, separation occurs at the interface between the oxygen-containing layer 21 and the resin layer 23 (FIG. 1F).

The formation substrate 14 and the resin layer 23 can be separated from each other by applying a perpendicular tensile force to the resin layer 23, for example. Specifically, the resin layer 23 can be peeled from the formation substrate 14 by pulling up the substrate 75a by part of its suction-attached top surface.

Here, if separation is performed in such a manner that liquid containing water such as water or an aqueous solution is added to the separation interface and the liquid penetrates into the separation interface, the ease of the separation can be enhanced. Furthermore, an adverse effect of static electricity caused at separation on the functional element such as a transistor (e.g., damage to a semiconductor element from static electricity) can be suppressed.

Before the separation, a separation trigger may be formed by separating part of the resin layer 23 from the formation substrate 14. For example, the separation trigger may be formed by inserting a sharp instrument such as a knife between the formation substrate 14 and the resin layer 23. Alternatively, the separation trigger may be formed by cutting the resin layer 23 from the substrate 75a side with a sharp instrument. Further alternatively, the separation trigger may be formed by a method that uses a laser, such as a laser ablation method.

In this embodiment, the hydrogen-containing layer 20, the oxygen-containing layer 21, and the resin layer 23 (or the first layer 24) are stacked, followed by heat treatment. As a result, water is supplied to the interface between the oxygen-containing layer 21 and the resin layer 23 and the adhesion between the oxygen-containing layer 21 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

Manufacturing Method Example 1

Next, manufacturing method examples of the display device in this embodiment will be described. Portions similar to those in the above-described peeling method are not described in some cases.

Figure 2A:
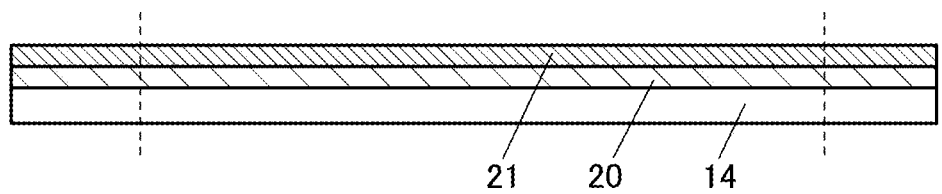
FIGS. 2A to 2E are cross-sectional views illustrating an example of a manufacturing method of a display device.

First, the hydrogen-containing layer 20 is formed over the formation substrate 14. Then, the oxygen-containing layer 21 is formed over the hydrogen-containing layer 20 (FIG. 2A). For the hydrogen-containing layer 20 and the oxygen-containing layer 21, the description of the above peeling method can be referred to.

Figure 2B:
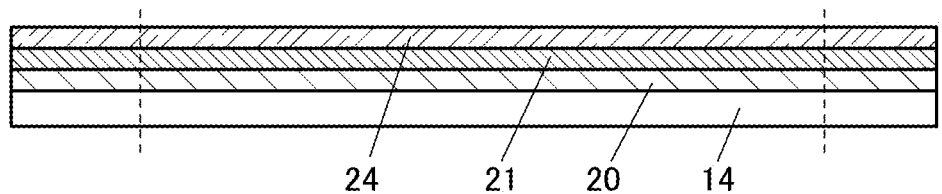

Next, the first layer 24 is formed over the oxygen-containing layer 21 (FIG. 2B). For the first layer 24, the description of the above peeling method can be referred to.

In this embodiment, the first layer 24 is formed using a photosensitive and thermosetting material. Note that the first layer 24 may be formed using a non-photosensitive material.

Figure 2C:
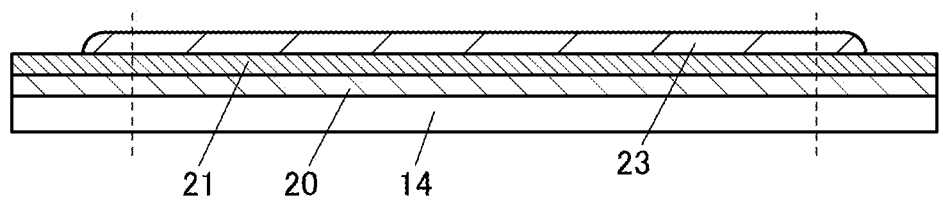

Heat treatment (prebaking treatment) for removing a solvent is performed after formation of the first layer 24, and then light exposure is performed using a photomask. Next, development is performed, whereby an unnecessary portion can be removed. Subsequently, the first heat treatment is performed on the first layer 24 that has been processed into a desired shape, so that the resin layer 23 is formed (FIG. 2C). In the example illustrated in FIG. 2C, the resin layer 23 having an island-like shape is formed.

Note that the resin layer 23 is not necessarily in the form of a single island and may be in the form of a plurality of islands or have an opening, for example. In addition, unevenness may be formed on the surface of the resin layer 23 by an exposure technique using a half-tone mask or a gray-tone mask, a multiple exposure technique, or the like.

A mask such as a resist mask or a hard mask is formed over the first layer 24 or the resin layer 23 and etching is performed, whereby the resin layer 23 with a desired shape can be formed. This method is particularly suitable for the case of using a non-photosensitive material.

For example, an inorganic film is formed over the resin layer 23, and a resist mask is formed over the inorganic film. After the inorganic film is etched with the use of the resist mask, the resin layer 23 can be etched using the inorganic film as a hard mask.

As examples of an inorganic film that can be used as the hard mask, a variety of inorganic insulating films, metal films and alloy films that can be used for a conductive layer, and the like can be given.

The mask is preferably formed to be extremely thin so that it can be removed at the same time as it is etched, in which case the step of removing the mask can be omitted.

For details of the first heat treatment, the description of the first heat treatment in the above peeling method can be referred to.

Figure 2D:
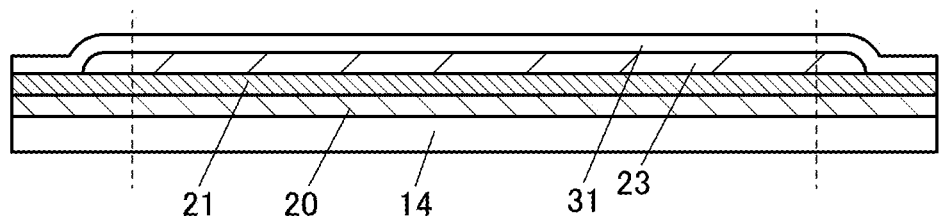

Next, an insulating layer 31 is formed over the resin layer 23 (FIG. 2D). The insulating layer 31 is formed to cover an end portion of the resin layer 23. The oxygen-containing layer 21 includes a portion over which the resin layer 23 is not provided. Accordingly, the insulating layer 31 can be formed over and in contact with the oxygen-containing layer 21.

The insulating layer 31 is formed at a temperature lower than or equal to the upper temperature limit of the resin layer 23. The insulating layer 31 is preferably formed at a temperature lower than or equal to the temperature of the first heat treatment and may be formed at a temperature lower than the temperature of the first heat treatment.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film.

An inorganic insulating film is preferably formed at high temperatures because the film can have higher density and a higher barrier property as the deposition temperature becomes higher.

The substrate temperature during the formation of the insulating layer 31 is preferably higher than or equal to room temperature (25° C.) and lower than or equal to 350° C., further preferably higher than or equal to 100° C. and lower than or equal to 300° C.

Figure 2E:
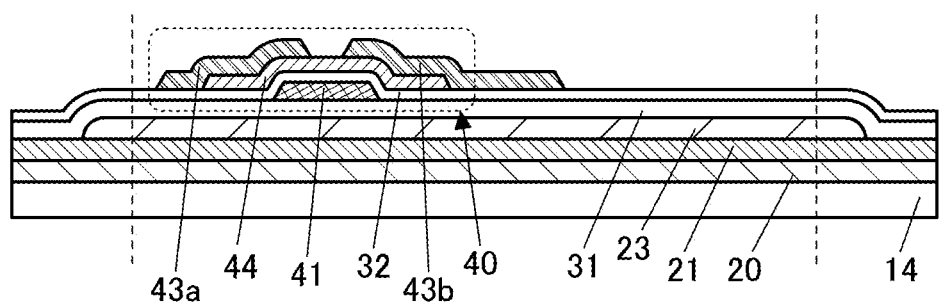

Next, a transistor 40 is formed over the insulating layer 31 (FIG. 2E).

There is no particular limitation on the structure of the transistor included in the display device. For example, a planar transistor, a staggered transistor, or an inverted staggered transistor may be used. A top-gate transistor or a bottom-gate transistor may be used. Gate electrodes may be provided above and below a channel.

In this example, a bottom-gate transistor including a metal oxide layer 44 is formed as the transistor 40. The metal oxide layer 44 can function as a semiconductor layer of the transistor 40. A metal oxide can function as an oxide semiconductor.

In this embodiment, an oxide semiconductor is used as a semiconductor of a transistor. A semiconductor material having a wider bandgap and a lower carrier density than silicon is preferably used because off-state current of the transistor can be reduced.

The transistor 40 is fabricated at a temperature lower than or equal to the upper temperature limit of the resin layer 23. The transistor 40 is preferably fabricated at a temperature lower than or equal to the temperature of the first heat treatment and may be formed at a temperature lower than the temperature of the first heat treatment.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature in a step of forming the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as polycrystalline silicon or an oxide semiconductor whose resistance is lowered by adding an impurity element, for example, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using either or both of an inert gas and an oxygen gas. Note that there is no particular limitation on the flow ratio of oxygen (the partial pressure of oxygen) in the step of forming the metal oxide film. In the case where a transistor having high field-effect mobility is obtained, the flow ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. The use of such a metal oxide having a wide energy gap leads to a reduction in off-state current of a transistor.

The metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layer 43a and the conductive layer 43b can each be formed in the following manner: a conductive film is formed, a resist mask is formed, the conductive film is etched, and the resist mask is removed. Each of the conductive layers 43a and 43b is connected to the metal oxide layer 44.

Note that during the processing of the conductive layer 43a and the conductive layer 43b, the metal oxide layer 44 might be partly etched to be thin in a region not covered by the resist mask.

The substrate temperature in a step of forming the conductive film is preferably higher than or equal to room temperature and lower than or equal to 350° C., further preferably higher than or equal to room temperature and lower than or equal to 300° C.

In the above manner, the transistor 40 can be fabricated (FIG. 2E). In the transistor 40, part of the conductive layer 41 functions as a gate, part of the insulating layer 32 functions as a gate insulating layer, and the conductive layer 43a and the conductive layer 43b function as a source and a drain.

Figure 3A:
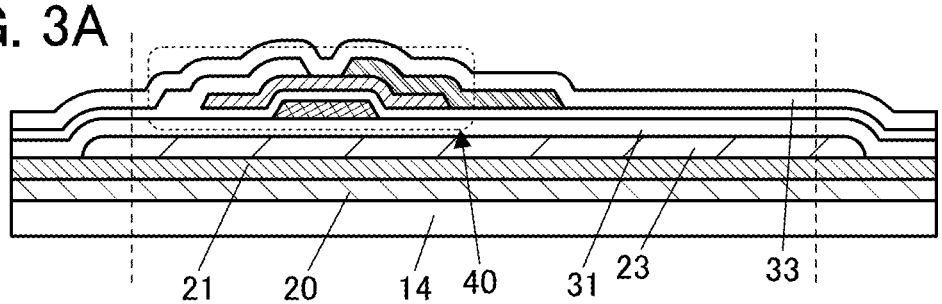
FIGS. 3A to 3D are cross-sectional views illustrating an example of a manufacturing method of a display device.

Next, an insulating layer 33 that covers the transistor 40 is formed (FIG. 3A). The insulating layer 33 can be formed using a method similar to that of the insulating layer 31.

It is preferable to use an oxide insulating film formed in an oxygen-containing atmosphere, such as a silicon oxide film or a silicon oxynitride film, for the insulating layer 33. An insulating film with low oxygen diffusibility and oxygen permeability, such as a silicon nitride film, is preferably stacked over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer 44. As a result, oxygen vacancies in the metal oxide layer 44 can be filled and defects at the interface between the metal oxide layer 44 and the insulating layer 33 can be repaired, leading to a reduction in defect levels. Accordingly, a display device with extremely high reliability can be fabricated.

Through the above steps, the insulating layer 31, the transistor 40, and the insulating layer 33 can be formed over the resin layer 23 (FIG. 3A).

If the formation substrate 14 and the transistor 40 are separated from each other at this stage by a method described later, a device including no display element can be fabricated. Forming the transistor 40 or forming a capacitor, a resistor, a wiring, and the like in addition to the transistor 40 can provide a semiconductor device, for example.

Figure 3B:
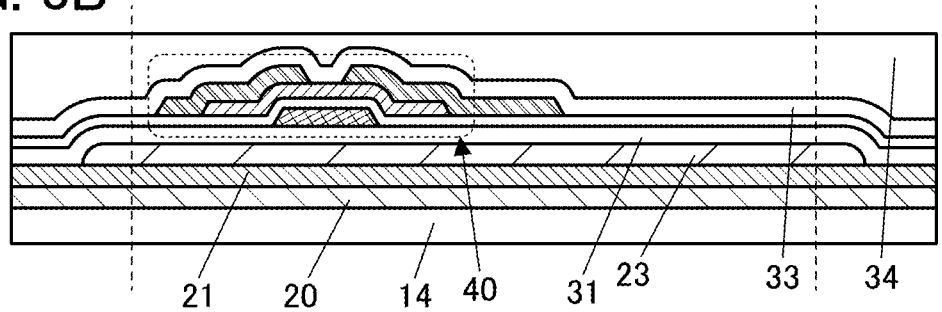

Then, an insulating layer 34 is formed over the insulating layer 33 (FIG. 3B). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the upper temperature limit of the resin layer 23. The insulating layer 34 is preferably formed at a temperature lower than or equal to the temperature of the first heat treatment and may be formed at a temperature lower than the temperature of the first heat treatment.

In the case of using an organic insulating film for the insulating layer 34, it is preferable that the temperature applied to the resin layer 23 in forming the insulating layer 34 be higher than or equal to room temperature and lower than or equal to 350° C., further preferably higher than or equal to room temperature and lower than or equal to 300° C.

In the case of using an inorganic insulating film as the insulating layer 34, the substrate temperature during the formation is preferably higher than or equal to room temperature and lower than or equal to 350° C., further preferably higher than or equal to 100° C. and lower than or equal to 300° C.

Next, an opening reaching the conductive layer 43b is formed in the insulating layer 34 and the insulating layer 33.

Figure 3C:
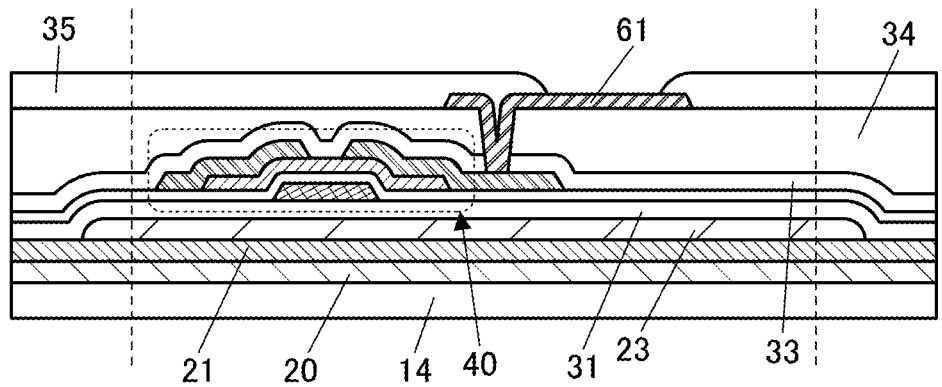

After that, a conductive layer 61 is formed (FIG. 3C). The conductive layer 61 partly functions as a pixel electrode of a light-emitting element 60. The conductive layer 61 can be formed in the following manner: a conductive film is formed, a resist mask is formed, the conductive film is etched, and the resist mask is removed.

The conductive layer 61 is formed at a temperature lower than or equal to the upper temperature limit of the resin layer 23. The conductive layer 61 is preferably formed at a temperature lower than or equal to the temperature of the first heat treatment and may be formed at a temperature lower than the temperature of the first heat treatment.

The substrate temperature in a step of forming the conductive film is preferably higher than or equal to room temperature and lower than or equal to 350° C., further preferably higher than or equal to room temperature and lower than or equal to 300° C.

Next, an insulating layer 35 is formed to cover an end portion of the conductive layer 61 (FIG. 3C). For the insulating layer 35, the description of the organic insulating film or the inorganic insulating film that can be used for the insulating layer 31 can be referred to.

The insulating layer 35 is formed at a temperature lower than or equal to the upper temperature limit of the resin layer 23. The insulating layer 35 is preferably formed at a temperature lower than or equal to the temperature of the first heat treatment and may be formed at a temperature lower than the temperature of the first heat treatment.

In the case of using an organic insulating film for the insulating layer 35, it is preferable that the temperature applied to the resin layer 23 in forming the insulating layer 35 be higher than or equal to room temperature and lower than or equal to 350° C., further preferably higher than or equal to room temperature and lower than or equal to 300° C.

In the case of using an inorganic insulating film as the insulating layer 35, the substrate temperature during the formation is preferably higher than or equal to room temperature and lower than or equal to 350° C., further preferably higher than or equal to 100° C. and lower than or equal to 300° C.

Here, the timing of the second heat treatment will be described.

The second heat treatment can be performed between the first heat treatment and a peeling process. Specifically, the second heat treatment is preferably performed after formation of the insulating layer having a function of blocking hydrogen, oxygen, and water that are released from the hydrogen-containing layer 20, the oxygen-containing layer 21, the resin layer 23, and the like. In that case, it is possible to inhibit hydrogen and water that are generated by the second heat treatment from being released from the surface of the resin layer 23 to the outside. Furthermore, in the case where a film with low heat resistance is formed, e.g., in the case where an organic EL element is fabricated as a display element, the second heat treatment is preferably performed before formation of the film.

The second heat treatment can be performed after the above insulating layer 31 is formed, after the insulating layer 32 serving as the gate insulating layer is formed, after the transistor 40 is formed, after the insulating layer 33 is formed, after the insulating layer 34 is formed, or after the insulating layer 35 is formed, for example.

Heat treatment during the formation process of the transistor can also serve as the second heat treatment in some cases.

For the second heat treatment, the description of the above peeling method can be referred to. A film formed after the second heat treatment is preferably formed at a temperature lower than or equal to the temperature of the second heat treatment and may be formed at a temperature lower than the temperature of the second heat treatment.

Figure 3D:
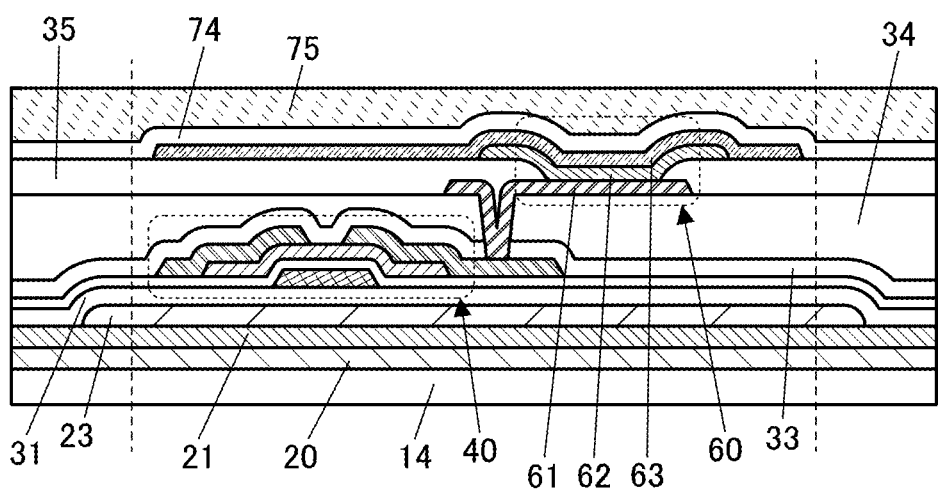

Then, an EL layer 62 and a conductive layer 63 are formed (FIG. 3D). Part of the conductive layer 63 functions as a common electrode of the light-emitting element 60. Since the EL layer 62 has low heat resistance in many cases, the second heat treatment is preferably performed before formation of the EL layer 62.

The EL layer 62 can be formed by an evaporation method, a coating method, a printing method, a discharge method, or the like. In the case where the EL layer 62 is formed for each individual pixel, an evaporation method using a blocking mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature that is lower than or equal to the upper temperature limit of the resin layer 23 and lower than or equal to the upper temperature limit of the EL layer 62. The conductive layer 63 is preferably formed at a temperature lower than or equal to the temperature of the first heat treatment and may be formed at a temperature lower than the temperature of the first heat treatment.

In the above manner, the light-emitting element 60 can be formed (FIG. 3D). In the light-emitting element 60, the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

Next, the insulating layer 74 is formed so as to cover the conductive layer 63 (FIG. 3D). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature that is lower than or equal to the upper temperature limit of the resin layer 23 and lower than or equal to the upper temperature limit of the light-emitting element 60. The insulating layer 74 is preferably formed at a temperature lower than or equal to the temperature of the first heat treatment and may be formed at a temperature lower than the temperature of the first heat treatment.

The insulating layer 74 preferably includes an inorganic insulating film with a high barrier property that can be used for the insulating layer 31, for example. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage with the insulating layer 74 is improved.

Then, a protective layer 75 is formed over the insulating layer 74 (FIG. 3D). The adhesive layer 75*b* and the substrate 75*a* may be used as the protective layer 75 as illustrated in FIG. 1E.

Next, a separation trigger is formed in the resin layer 23 (FIGS. 4A1 and 4A2).

For example, a sharp instrument 65, e.g., a knife, is inserted from the protective layer 75 side into a portion located inward from an end portion of the resin layer 23 to make a cut 64 in a frame-like shape.

Alternatively, the resin layer 23 may be irradiated with laser light in a frame-like shape.

In the case where a plurality of display devices are fabricated using one formation substrate (a multiple panel method), the plurality of display devices can be formed using one resin layer 23. For example, the plurality of display devices are provided inside the cut 64 shown in FIG. 4A2. In that case, the plurality of display devices can be separated from the formation substrate at a time.

Alternatively, a plurality of resin layers 23 may be separately formed for display devices. In the example illustrated in FIG. 4A3, four resin layers 23 are formed over the formation substrate. The cut 64 is made in a frame-like shape in each of the four resin layers 23, whereby the display devices can be separated from the formation substrate at different timings.

In the manufacturing method example 1, the top surface of the oxygen-containing layer 21 includes a portion in contact with the resin layer 23 and a portion in contact with the insulating layer 31. The adhesion between the oxygen-containing layer 21 and the insulating layer 31 is higher than that between the oxygen-containing layer 21 and the resin layer 23. Therefore, unintentional peeling of the resin layer 23 from the oxygen-containing layer 21 can be avoided. In addition, the formation of the separation trigger enables the oxygen-containing layer 21 and the resin layer 23 to be separated from each other at desired timing. Accordingly, the timing of peeling can be controlled and high peelability can be achieved. This can increase the yield of the peeling process and the manufacturing process of a display device.

Next, the formation substrate 14 and the transistor 40 are separated from each other (FIG. 4B).

In the manufacturing method example 1, the hydrogen-containing layer 20, the oxygen-containing layer 21, and the resin layer 23 (or the first layer 24) are stacked, followed by heat treatment. As a result, water is supplied to the interface between the oxygen-containing layer 21 and the resin layer 23 and the adhesion between the oxygen-containing layer 21 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

Structure Example 1 of Display Device

Figure 5A:
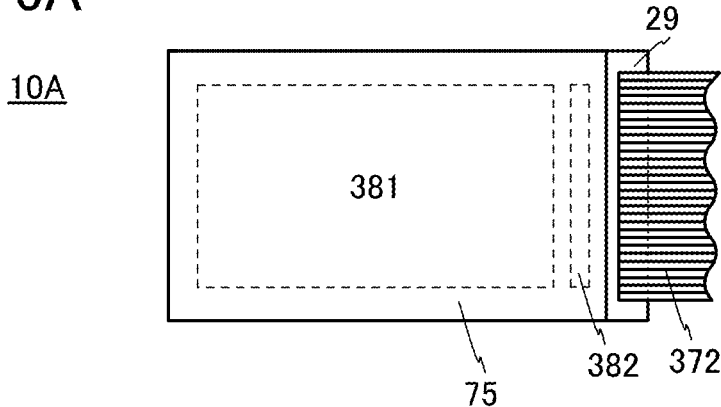
FIGS. 5A to 5C are a top view and cross-sectional views illustrating examples of a display device.
Figure 5B:
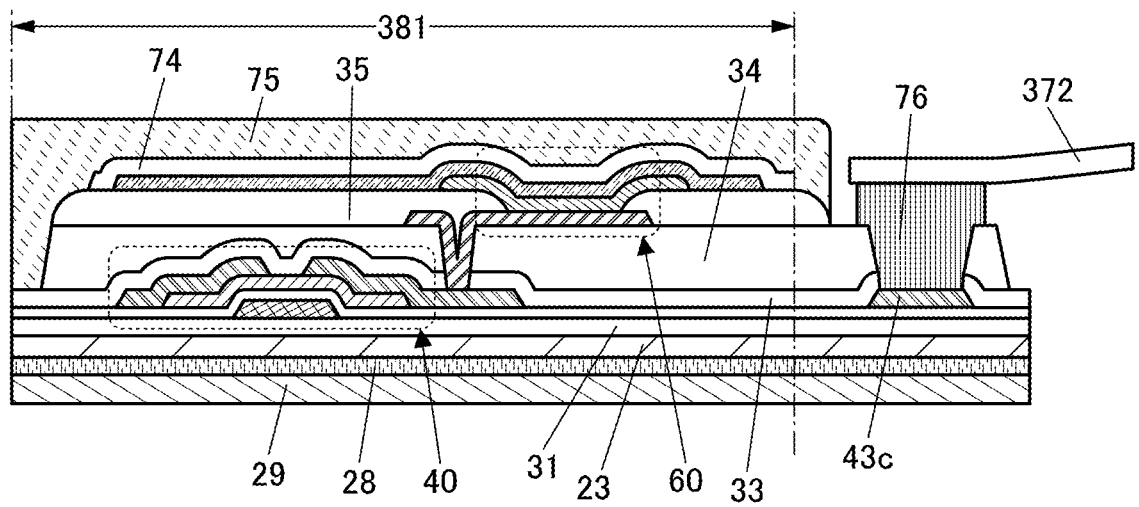
Figure 5C:
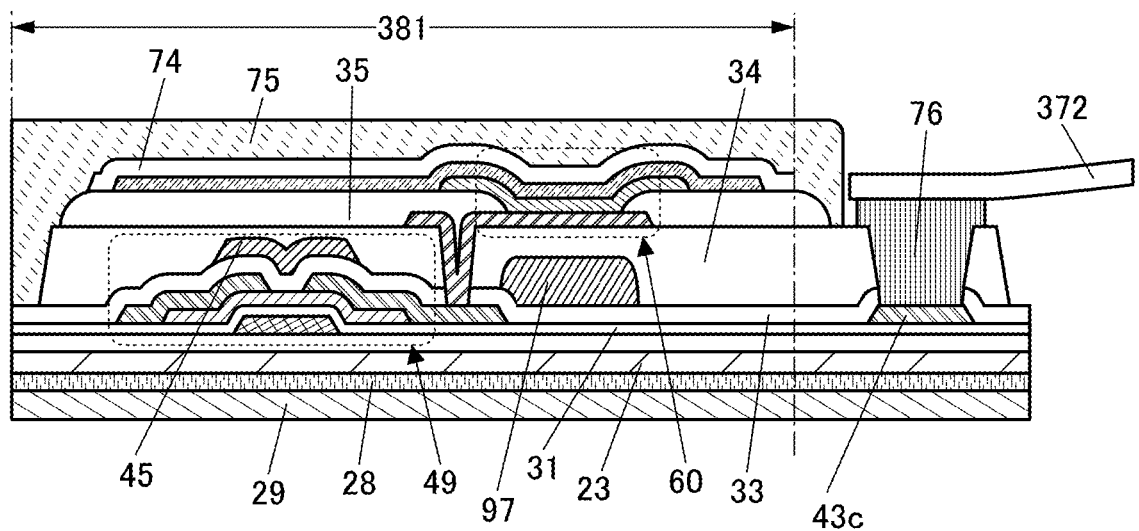

FIG. 5A is a top view of a display device 10A. FIGS. 5B and 5C are each an example of a cross-sectional view illustrating a display portion 381 of the display device 10A and a portion for connection to an FPC 372.

The display device 10A can be manufactured with the use of the above manufacturing method example 1. The display device 10A can be held in a bent state and can be bent repeatedly, for example.

The display device 10A includes a protective layer 75 and a substrate 29. The protective layer 75 side is the display surface side of the display device. The display device 10A includes the display portion 381 and a driver circuit portion 382. The FPC 372 is attached to the display device 10A.

It is preferable that the substrate 29 and the resin layer 23 that is exposed by being separated from the formation substrate 14 be bonded to each other using an adhesive layer 28. The substrate 29 can serve as a supporting substrate of the display device 10A.

With the use of the peeling method described in this embodiment, the formation substrate 14 can be peeled and the transistor 40, the light-emitting element 60, and the like that are fabricated over the formation substrate 14 can be transferred onto the substrate 29.

The adhesive layer 28 can be formed using the material that can be used for the adhesive layer 75b. The substrate 29 can be formed using the material that can be used for the substrate 75a.

A conductive layer 43c and the FPC 372 are electrically connected through a connector 76 (FIGS. 5B and 5C). The conductive layer 43c can be formed using the same material and the same step as those of the source and the drain of the transistor.

As the connector 76, any of various anisotropic conductive films (ACF), anisotropic conductive pastes (ACP), and the like can be used.

The display device illustrated in FIG. 5C is different from the structure illustrated in FIG. 5B in that not the transistor 40 but a transistor 49 is provided and that a coloring layer 97 is provided over the insulating layer 33. In the case where the light-emitting element 60 has a bottom-emission structure, the coloring layer 97 may be provided closer to the substrate 29 than the light-emitting element 60 is.

The transistor 49 illustrated in FIG. 5C includes a conductive layer 45 serving as a gate, as well as the components of the transistor 40 in FIG. 5B.

The structure in which the semiconductor layer where a channel is formed is provided between two gates is used as an example of the transistor 49. Such a structure enables the control of the threshold voltage of the transistor. The two gates may be connected to each other and supplied with the same signal to operate the transistor. Such a transistor can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

As described above, the heat treatment performed in an oxygen-containing atmosphere enables the resin layer 23 to be peeled from the formation substrate without laser irradiation of the entire area of the resin layer 23. Thus, a large amount of oxygen is sometimes observed by analysis in the resin layer 23 of the display device that is manufactured by the manufacturing method of a display device described in this embodiment. Specifically, the oxygen concentration can be obtained by analyzing the surface of the resin layer 23 on the peeling surface side (i.e., the surface on the formation substrate side, which corresponds to the surface in contact with the adhesive layer 28 in FIGS. 5B and 5C) by X-ray photoelectron spectroscopy (XPS). The oxygen concentration that is obtained by analyzing the surface of the resin layer 23 on the adhesive layer 28 side by XPS is preferably higher than or equal to 10 atomic %, further preferably higher than or equal to 15 atomic %.

Manufacturing Method Example 2

Figure 6A:
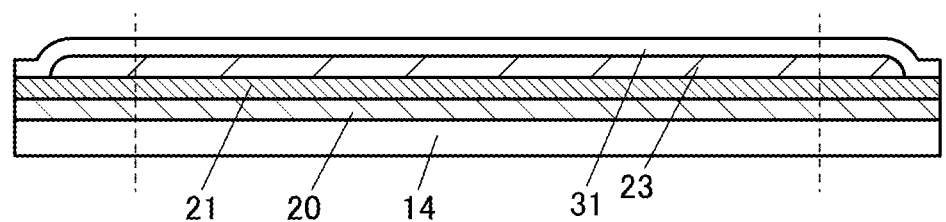
FIGS. 6A to 6C are cross-sectional views illustrating an example of a manufacturing method of a display device.

First, the components from the hydrogen-containing layer 20 to the insulating layer 31 are formed over the formation substrate 14 by the above peeling method (FIG. 6A).

Figure 6B:
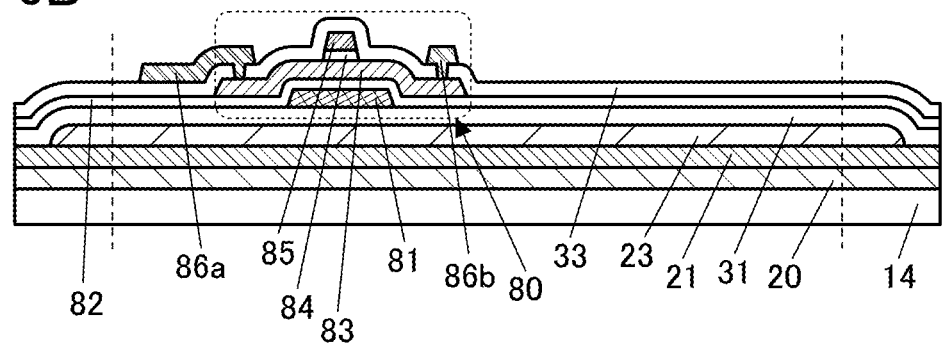

Next, a transistor 80 is formed over the insulating layer 31 (FIG. 6B).

In this example, a transistor including a metal oxide layer 83 and two gates is fabricated as the transistor 80.

Furthermore, the transistor 80 is fabricated at a temperature lower than or equal to the upper temperature limit of the resin layer 23. The transistor 80 is preferably formed at a temperature lower than or equal to the temperature of the first heat treatment and may be formed at a temperature lower than the temperature of the first heat treatment.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used for the insulating layer 31 can be referred to.

Then, the metal oxide layer 83 is formed. The metal oxide layer 83 can be formed in the following manner: a metal oxide film is formed, a resist mask is formed, the metal oxide film is etched, and the resist mask is removed. For materials for the metal oxide layer 83, the description of the materials that can be used for the metal oxide layer 44 can be referred to.

Then, an insulating layer 84 and a conductive layer 85 are formed. For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 is formed. The insulating layer 33 can be formed using a method similar to that of the insulating layer 31.

The insulating layer 33 preferably contains hydrogen. The hydrogen contained in the insulating layer 33 is diffused to the metal oxide layer 83 in contact with the insulating layer 33, so that part of the metal oxide layer 83 has reduced resistance. Since the metal oxide layer 83 in contact with the insulating layer 33 serves as a low-resistance region, the on-state current and the field-effect mobility of the transistor 80 can be increased.

Next, openings reaching the metal oxide layer 83 are formed in the insulating layer 33.

Next, a conductive layer 86a and a conductive layer 86b are formed. The conductive layer 86a and the conductive layer 86b can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33.

In the above manner, the transistor 80 can be fabricated (FIG. 6B). In the transistor 80, part of the conductive layer 81 serves as a gate, part of the insulating layer 84 serves as a gate insulating layer, part of the insulating layer 82 serves as a gate insulating layer, and part of the conductive layer 85 serves as a gate. The metal oxide layer 83 includes a channel region and a low-resistance region. The channel region and the conductive layer 85 overlap with each other with the insulating layer 84 provided therebetween. The low-resistance region has a portion connected to the conductive layer 86a and a portion connected to the conductive layer 86b.

Figure 6C:
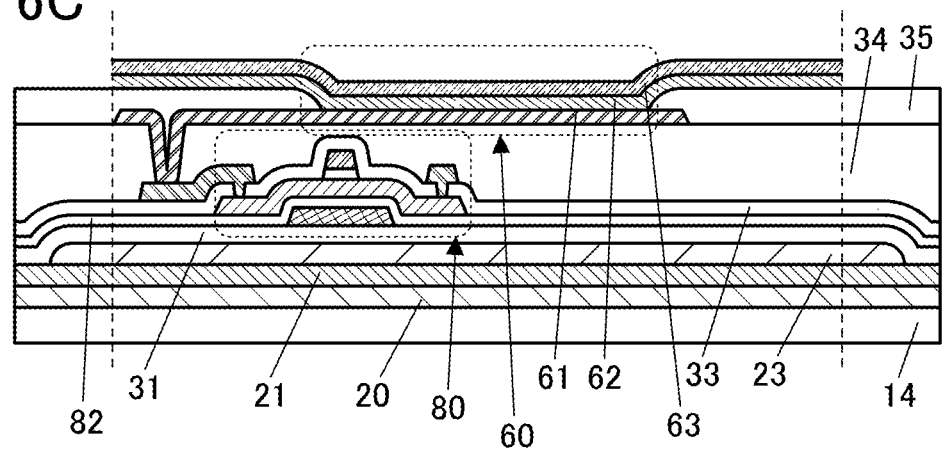

Next, the components from the insulating layer 34 to the light-emitting element 60 are formed over the insulating layer 33 (FIG. 6C). For the steps, the manufacturing method example 1 can be referred to.

Here, the timing of the second heat treatment will be described.

The second heat treatment can be performed between the first heat treatment and a peeling process. Specifically, the second heat treatment is preferably performed after formation of the insulating layer having a function of blocking hydrogen, oxygen, and water that are released from the hydrogen-containing layer 20, the oxygen-containing layer 21, the resin layer 23, and the like. Furthermore, in the case where a film with low heat resistance is formed, e.g., in the case where an organic EL element is fabricated as a display element, the second heat treatment is preferably performed before formation of the film.

The second heat treatment can be performed after the above insulating layer 31 is formed, after the insulating layer 82 serving as the gate insulating layer is formed, after the insulating layer 33 is formed, after the transistor 80 is formed, after the insulating layer 34 is formed, or after the insulating layer 35 is formed, for example.

Heat treatment during the formation process of the transistor can also serve as the second heat treatment in some cases.

For the second heat treatment, the description of the above peeling method can be referred to. A film formed after the second heat treatment is preferably formed at a temperature lower than or equal to the temperature of the second heat treatment and may be formed at a temperature lower than the temperature of the second heat treatment.

Figure 7A:
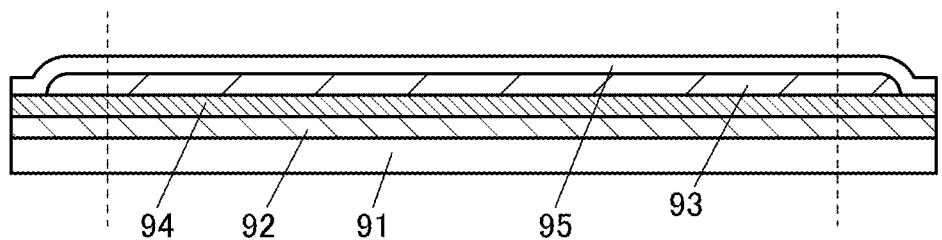
FIGS. 7A to 7C are cross-sectional views illustrating an example of a manufacturing method of a display device.
Figure 7B:
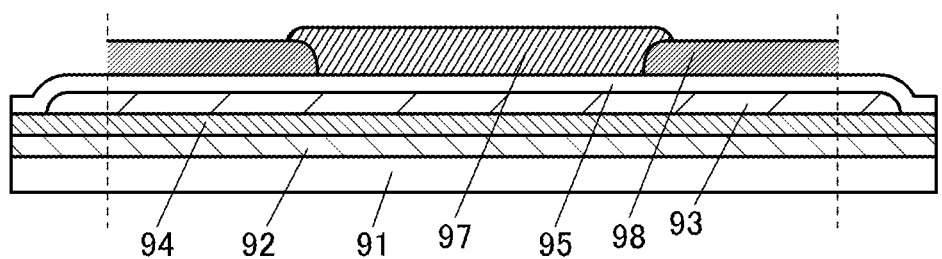

Furthermore, the steps illustrated in FIGS. 7A and 7B are performed independently of the steps illustrated in FIGS. 6A to 6C. First, a hydrogen-containing layer 92 is formed over a formation substrate 91 in a manner similar to that of the step of forming the hydrogen-containing layer 20 over the formation substrate 14. Then, an oxygen-containing layer 94 is formed over the hydrogen-containing layer 92 in a manner similar to that of the step of forming the oxygen-containing layer 21 over the hydrogen-containing layer 20. After that, a first layer is formed over the oxygen-containing layer 94 in a manner similar to that of the step of forming the resin layer 23 over the oxygen-containing layer 21, and the first heat treatment is performed to form a resin layer 93. Then, in a manner similar to that of the step of forming the insulating layer 31 over the resin layer 23, an insulating layer 95 covering an end portion of the resin layer 93 is formed over the resin layer 93 (FIG. 7A). The second heat treatment is preferably performed after the formation of the insulating layer 95.

Next, the coloring layer 97 and a light-blocking layer 98 are formed over the insulating layer 95 (FIG. 7B).

A color filter or the like can be used as the coloring layer 97. The coloring layer 97 is provided to overlap with a display region of the light-emitting element 60.

As the light-blocking layer 98, a black matrix or the like can be used. The light-blocking layer 98 is provided to overlap with the insulating layer 35.

Figure 7C:
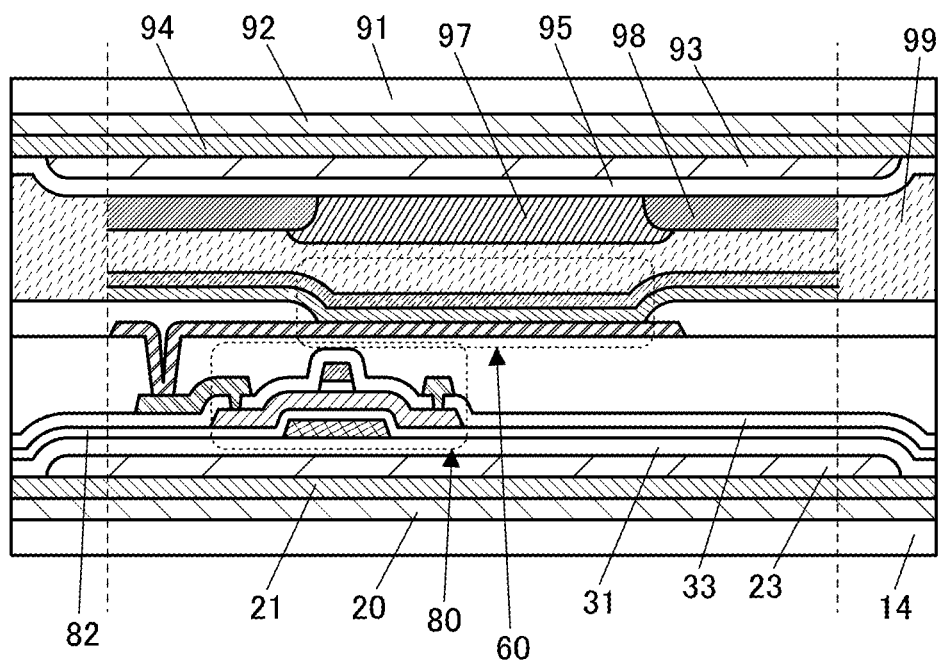

Then, with the use of an adhesive layer 99, the formation substrate 14 and the formation substrate 91 are bonded to each other such that the surface of the formation substrate 14 over which the transistor 80 and the like are formed faces the surface of the formation substrate 91 over which the resin layer 93 and the like are formed (FIG. 7C).

Figure 8A:
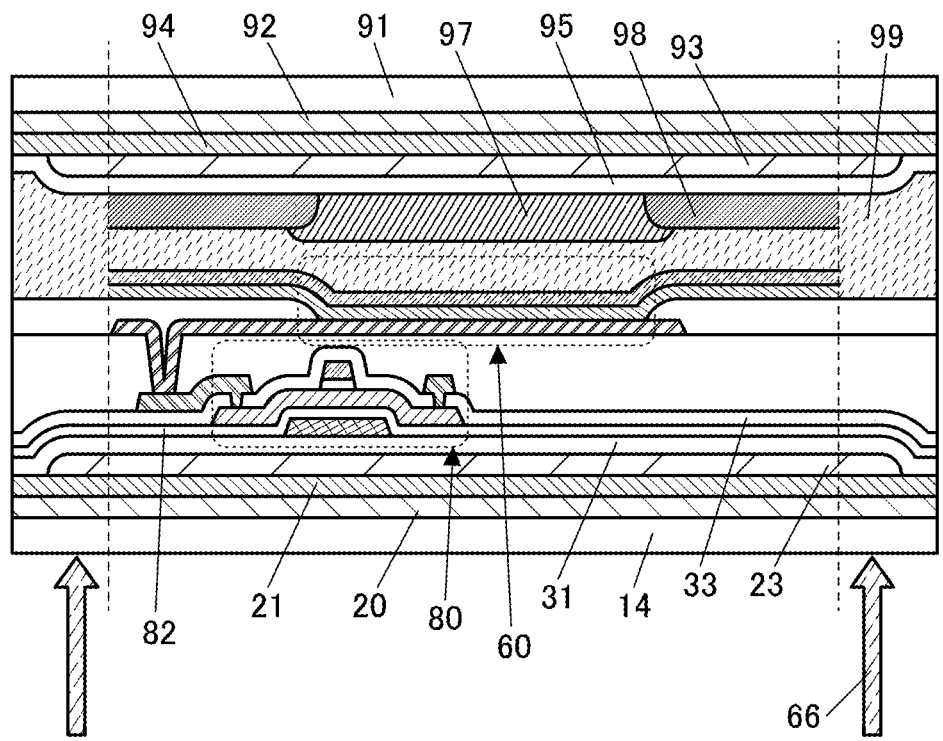
FIGS. 8A and 8B are a cross-sectional view and a top view illustrating an example of a manufacturing method of a display device.
Figure 8B:
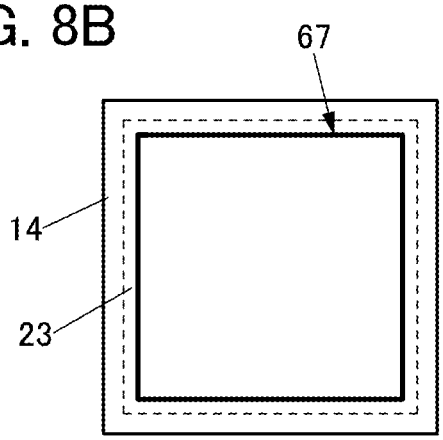

Next, a separation trigger is formed in the resin layer 23 (FIGS. 8A and 8B). Any of the formation substrate 14 and the formation substrate 91 may be separated first. In this example, separation of the formation substrate 14 precedes that of the formation substrate 91.

For example, the resin layer 23 is irradiated with laser light 66 in a frame-like shape from the formation substrate 14 side (see a laser-light irradiation region 67 illustrated in FIG. 8B). This example is suitable for the case where hard substrates such as glass substrates are used as the formation substrate 14 and the formation substrate 91.

There is no particular limitation on a laser used to form the separation trigger. For example, a continuous wave laser or a pulsed oscillation laser can be used. Note that a condition for laser irradiation such as frequency, power density, energy density, or beam profile is controlled as appropriate in consideration of thicknesses, materials, or the like of the formation substrate and the resin layer.

In the manufacturing method example 2, the top surface of the oxygen-containing layer 21 includes a portion in contact with the resin layer 23 and a portion in contact with the insulating layer 31. The adhesion between the oxygen-containing layer 21 and the insulating layer 31 is higher than that between the oxygen-containing layer 21 and the resin layer 23. Therefore, unintentional peeling of the resin layer 23 from the oxygen-containing layer 21 can be avoided. In a similar manner, the top surface of the oxygen-containing layer 94 includes a portion in contact with the resin layer 93 and a portion in contact with the insulating layer 95. The adhesion between the oxygen-containing layer 94 and the insulating layer 95 is higher than that between the oxygen-containing layer 94 and the resin layer 93. Therefore, unintentional peeling of the resin layer 93 from the oxygen-containing layer 94 can be avoided.

A separation trigger is formed on either the resin layer 23 or the resin layer 93. The timing of forming a separation trigger can be different between the resin layer 23 and the resin layer 93; therefore, the formation substrate 14 and the formation substrate 91 can be separated in different steps. This can increase the yield of the peeling process and the manufacturing process of a display device.

Irradiation with the laser light 66 does not need to be performed on the entire area of the resin layer 23 and is performed on part of the resin layer. Accordingly, an expensive laser apparatus requiring high running costs is not needed.

Figure 9A:
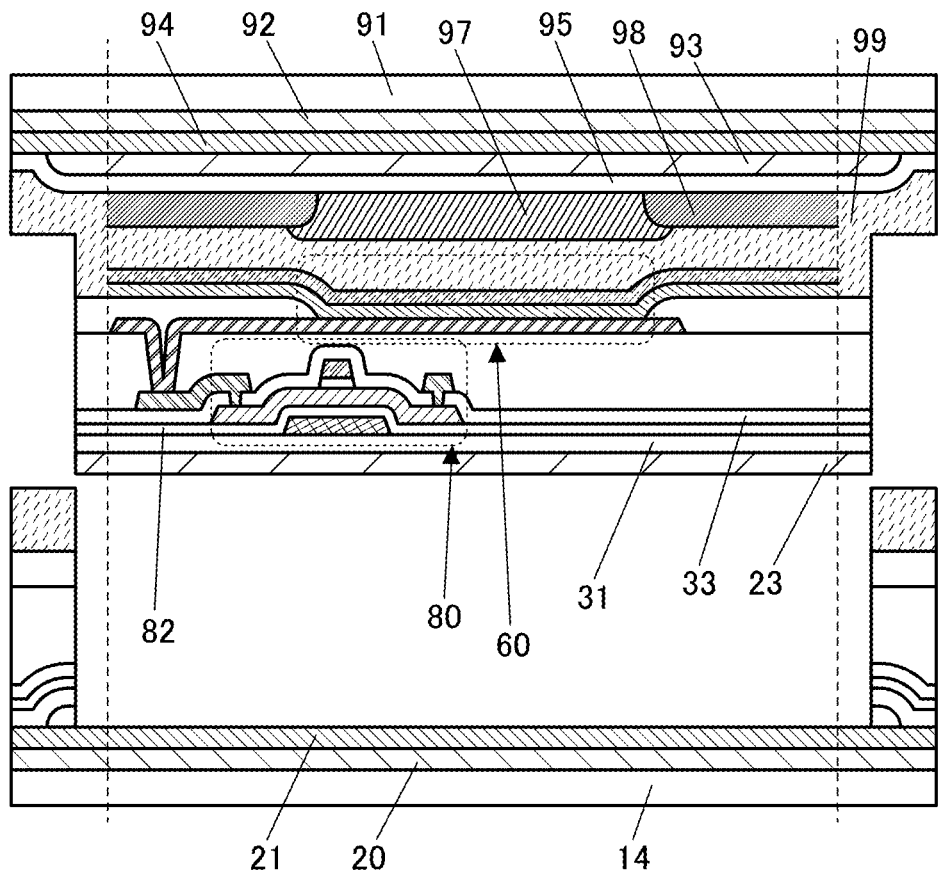
FIGS. 9A and 9B are cross-sectional views illustrating an example of a manufacturing method of a display device.

Next, the formation substrate 14 and the transistor 80 are separated from each other (FIG. 9A). In this example, the formation substrate 14 and a portion inside the region irradiated with the laser light 66 in a frame-like shape (i.e., a portion inside the laser-light irradiation region 67 illustrated in FIG. 8B) are separated from each other. Although in the example illustrated in FIG. 9A separation occurs in the adhesive layer 99 (cohesive failure of the adhesive layer 99 occurs) outside the region irradiated with the laser light 66 in a frame-like shape, one embodiment of the present invention is not limited to this example. For example, outside the irradiation region 67, separation (interfacial failure or adhesive failure) might occur at the interface between the adhesive layer 99 and the insulating layer 95 or the insulating layer 33.

In the manufacturing method example 2, the hydrogen-containing layer 20, the oxygen-containing layer 21, and the resin layer 23 (or the first layer 24) are stacked, followed by heat treatment. As a result, water is supplied to the interface between the oxygen-containing layer 21 and the resin layer 23 and the adhesion between the oxygen-containing layer 21 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

Figure 9B:
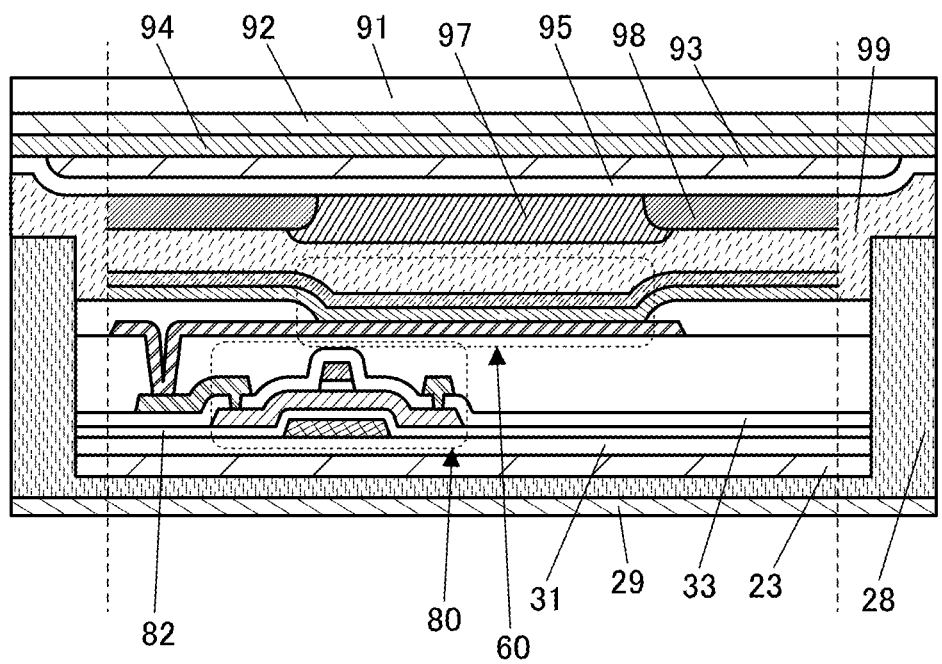

Next, the substrate 29 and the resin layer 23 that is exposed by being separated from the formation substrate 14 are bonded to each other using the adhesive layer 28 (FIG. 9B). The substrate 29 can serve as a supporting substrate of the display device.

Figure 10A:
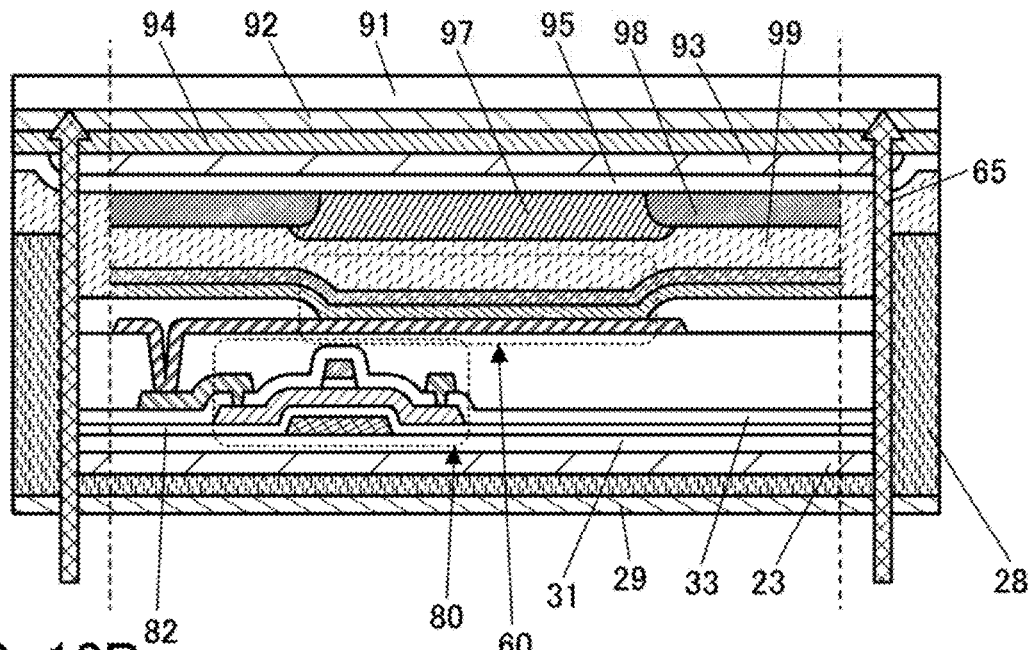
FIGS. 10A and 10B are cross-sectional views illustrating an example of a manufacturing method of a display device.

Next, a separation trigger is formed in the resin layer 93 (FIG. 10A).

In the example illustrated in FIG. 10A, the sharp instrument 65, e.g., a knife, is inserted from the substrate 29 side into a portion located inward from an end portion of the resin layer 93 to make a cut in a frame-like shape. This method is suitable for the case where a resin is used for the substrate 29.

Alternatively, in a manner similar to that of the formation of the separation trigger in the resin layer 23, the resin layer 93 may be irradiated with laser light in a frame-like shape from the formation substrate 91 side.

The formation of the separation trigger enables the formation substrate 91 and the resin layer 93 to be separated from each other at desired timing. Accordingly, the timing of peeling can be controlled and high peelability can be achieved. This can increase the yield of the peeling process and the manufacturing process of a display device.

Figure 10B:
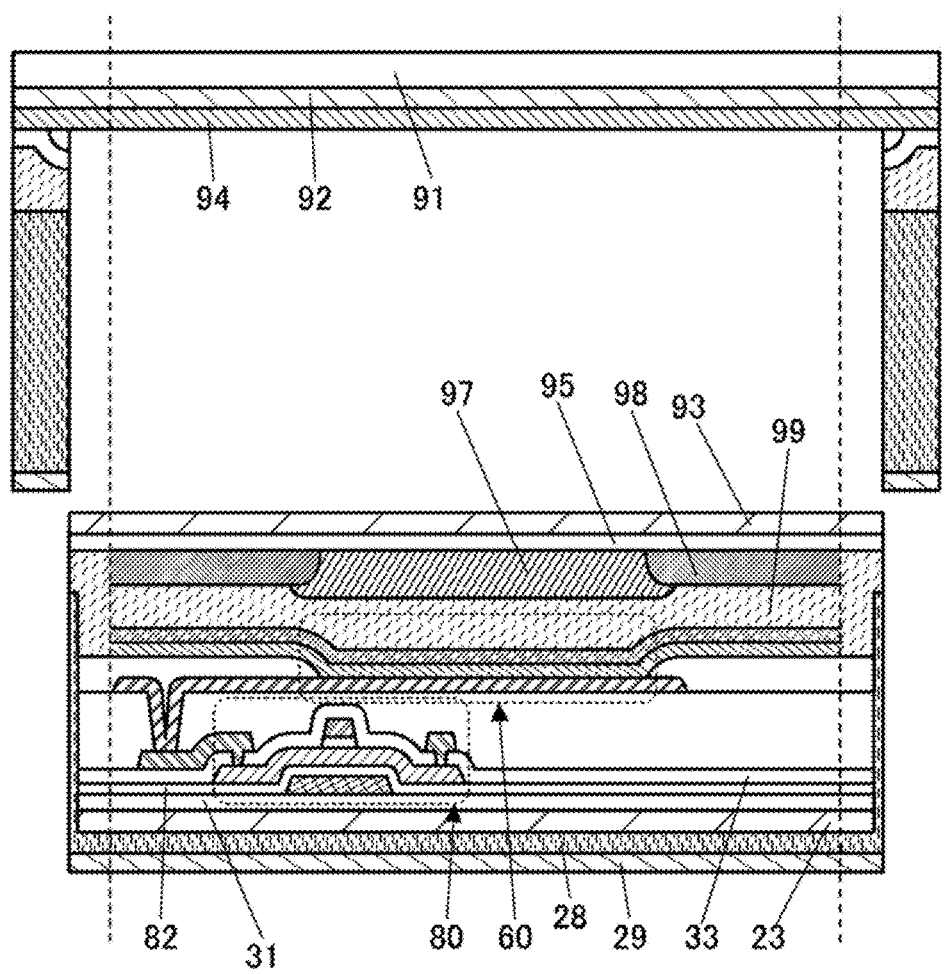

Next, the formation substrate 91 and the transistor 80 are separated from each other (FIG. 10B). In this example, the formation substrate 91 and a portion inside the frame-like cut are separated from each other.

In the manufacturing method example 2, the hydrogen-containing layer 92, the oxygen-containing layer 94, and the resin layer 93 (or the first layer) are stacked, followed by heat treatment. As a result, water is supplied to the interface between the oxygen-containing layer 94 and the resin layer 93 and the adhesion between the oxygen-containing layer 94 and the resin layer 93 can be lowered. Accordingly, the formation substrate 91 and the resin layer 93 can be separated from each other without laser irradiation performed on the entire area of the resin layer 93. In this manner, a display device can be manufactured at low costs.

Figure 11A:
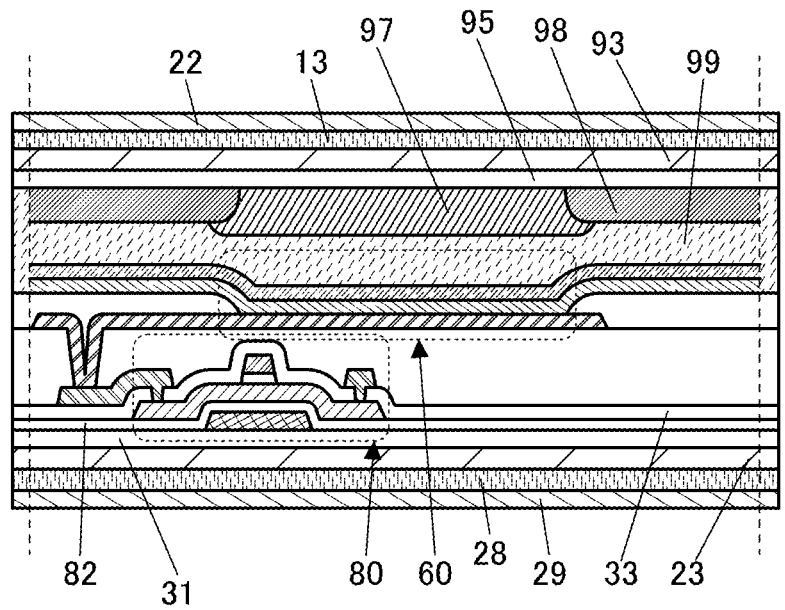
FIGS. 11A and 11B are cross-sectional views each illustrating an example of a manufacturing method of a display device.

Next, a substrate 22 and the resin layer 93 that is exposed by being separated from the formation substrate 91 are bonded to each other using an adhesive layer 13 (FIG. 11A). The substrate 22 can serve as a supporting substrate of the display device.

In the example illustrated in FIG. 11A, light emitted from the light-emitting element 60 is extracted to the outside of the display device through the coloring layer 97, the insulating layer 95, and the resin layer 93. It is thus preferable that the resin layer 93 have a high visible light transmittance. In one embodiment of the present invention, the resin layer 93 can have a small thickness. Accordingly, the resin layer 93 can have a high visible light transmittance, which inhibits a reduction in light extraction efficiency of the light-emitting element 60.

Figure 11B:
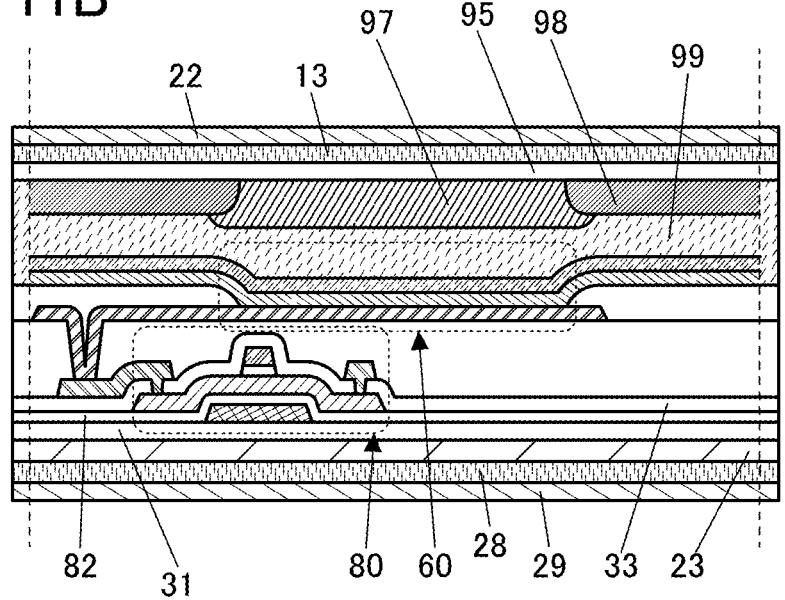

The resin layer 93 may be removed. In that case, the light extraction efficiency of the light-emitting element 60 can be further increased. FIG. 11B illustrates an example in which the resin layer 93 is removed and the substrate 22 is bonded to the insulating layer 95 with the adhesive layer 13.

The adhesive layer 13 can be formed using the material that can be used for the adhesive layer 75b.

The substrate 22 can be formed using the material that can be used for the substrate 75a.

In the manufacturing method example 2, the peeling method of one embodiment of the present invention is conducted twice to manufacture a display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

Modification Example

In the manufacturing method example 2 (FIG. 7C), the adhesive layer 99 overlaps with both a portion where the oxygen-containing layer 21 and the insulating layer 31 are in contact with each other and a portion where the oxygen-containing layer 94 and the insulating layer 95 are in contact with each other.

The adhesion between the oxygen-containing layer 21 and the insulating layer 31 is higher than that between the oxygen-containing layer 21 and the resin layer 23. The adhesion between the oxygen-containing layer 94 and the insulating layer 95 is higher than that between the oxygen-containing layer 94 and the resin layer 93.

When peeling is caused at the interface between the oxygen-containing layer 21 and the insulating layer 31 or the interface between the oxygen-containing layer 94 and the insulating layer 95, peeling might be failed, for example, reducing the yield of peeling. Therefore, the process is suitable in which only the portion that overlaps with the resin layer is separated from the formation substrate after formation of a separation trigger in the resin layer in a frame-like shape.

Figure 12A:
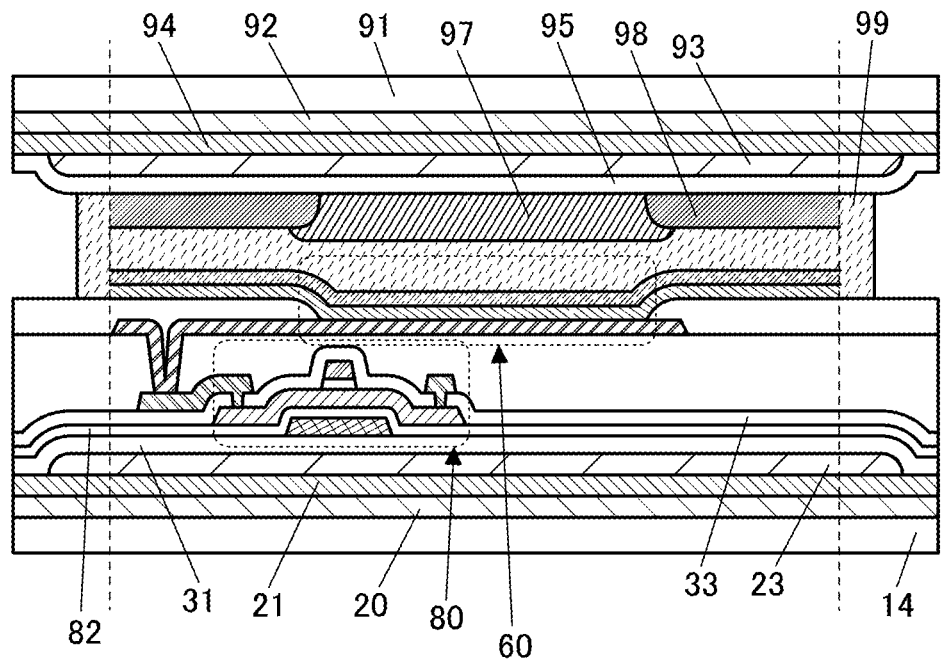
FIGS. 12A and 12B are cross-sectional views each illustrating an example of a manufacturing method of a display device.
Figure 12B:
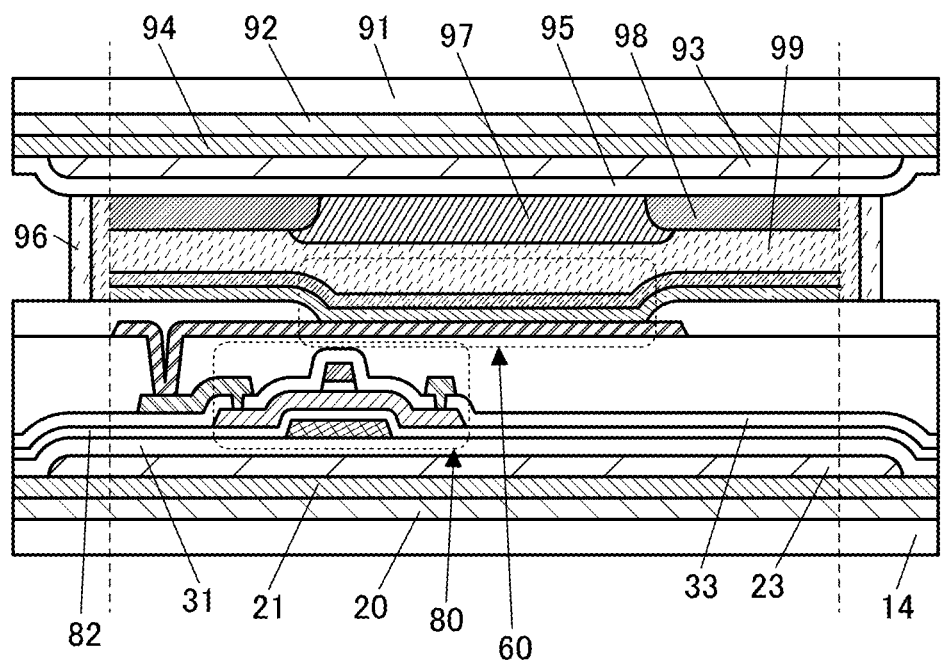

It is also possible to employ a structure in which the adhesive layer 99 does not overlap with the portion where the oxygen-containing layer 21 and the insulating layer 31 are in contact with each other and the portion where the oxygen-containing layer 94 and the insulating layer 95 are in contact with each other, as illustrated in FIGS. 12A and 12B.

When an adhesive or an adhesive sheet having a low fluidity, for example, is used for the adhesive layer 99, the adhesive layer 99 can be easily formed to have an island-like shape (FIG. 12A).

Alternatively, a partition 96 having a frame-like shape may be formed and the space surrounded by the partition 96 may be filled with the adhesive layer 99 (FIG. 12B).

In the case where the partition 96 is used as a component of a display device, the partition 96 is preferably formed using a cured resin. In that case, it is preferable that the partition 96 not overlap with the portion where the oxygen-containing layer 21 and the insulating layer 31 are in contact with each other and the portion where the oxygen-containing layer 94 and the insulating layer 95 are in contact with each other, either.

In the case where the partition 96 is not used as a component of a display device, the partition 96 is preferably formed using an uncured resin or a semi-cured resin. In that case, the partition 96 may overlap with one or both of the portion where the oxygen-containing layer 21 and the insulating layer 31 are in contact with each other and the portion where the oxygen-containing layer 94 and the insulating layer 95 are in contact with each other.

In the example described in this embodiment, the partition 96 is formed using an uncured resin, and the partition 96 does not overlap with the portion where the oxygen-containing layer 21 and the insulating layer 31 are in contact with each other and the portion where the oxygen-containing layer 94 and the insulating layer 95 are in contact with each other.

Description is made on a method for forming a separation trigger in the case where the adhesive layer 99 does not overlap with the portion where the oxygen-containing layer 21 and the insulating layer 31 are in contact with each other and the portion where the oxygen-containing layer 94 and the insulating layer 95 are in contact with each other. An example in which the formation substrate 91 is peeled is described below. A method similar to this method can be used when the formation substrate 14 is peeled.

FIGS. 13A to 13E illustrate positions of irradiation with the laser light 66 in the case where the formation substrate 91 and the resin layer 93 are separated from each other.

Figure 13A:
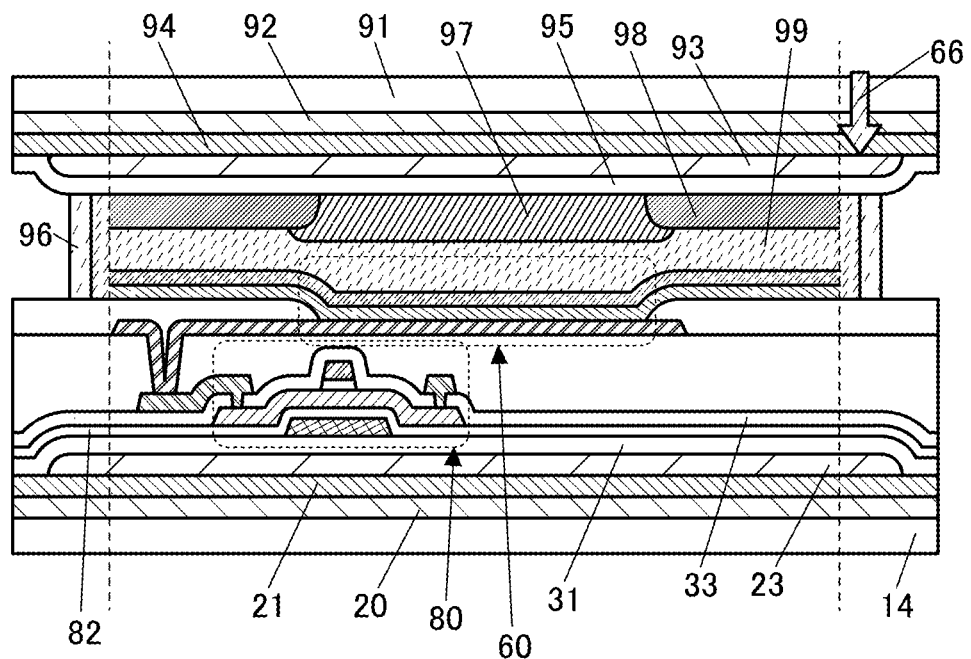
FIGS. 13A to 13E are a cross-sectional view and top views illustrating examples of a manufacturing method of a display device.

As illustrated in FIG. 13A, at least one place of a region where the resin layer 93 and the adhesive layer 99 overlap with each other is irradiated with the laser light 66, whereby the separation trigger can be formed.

It is preferable that the force for separating the formation substrate 91 and the resin layer 93 from each other be locally exerted on the separation trigger; therefore, the separation trigger is preferably formed in the vicinity of an end portion of the adhesive layer 99 rather than at the center of the adhesive layer 99. It is particularly preferable to form the separation trigger in the vicinity of the corner portion compared to the vicinity of the side portion among the vicinities of the end portion.

FIGS. 13B to 13E illustrate examples of the laser-light irradiation region 67.

Figure 13B:
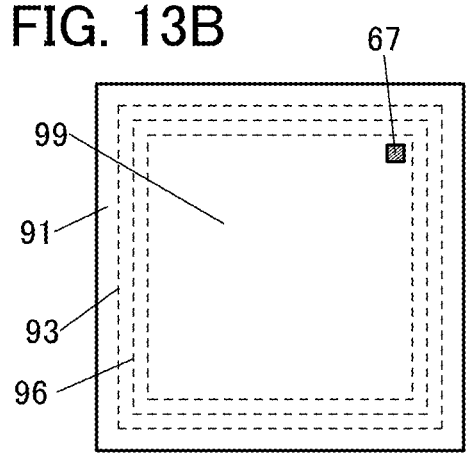

In FIG. 13B, one laser-light irradiation region 67 is provided at the corner portion of the adhesive layer 99.

Figure 13C:
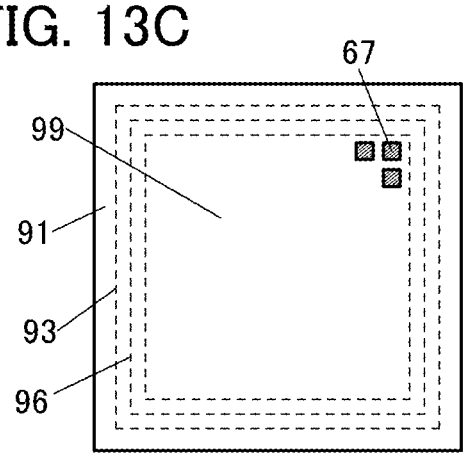
Figure 13D:
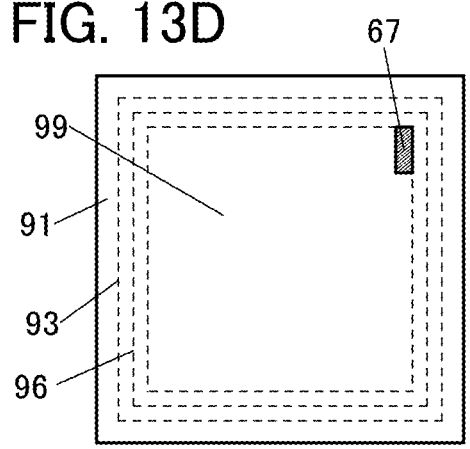
Figure 13E:
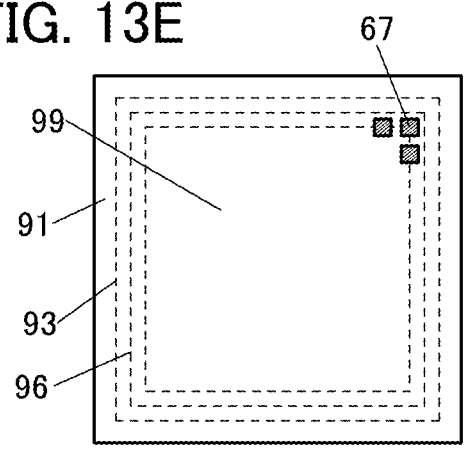

The separation trigger can be formed in the form of a solid line or a dashed line by continuous or intermittent irradiation with laser light. In FIG. 13C, three laser-light irradiation regions 67 are provided at the corner portion of the adhesive layer 99. FIG. 13D illustrates an example in which the laser-light irradiation region 67 abuts on and extends along one side of the adhesive layer 99. As illustrated in FIG. 13E, the laser-light irradiation region 67 may be positioned not only in a region where the adhesive layer 99 and the resin layer 93 overlap with each other but also in a region where the partition 96 not cured and the resin layer 93 overlap with each other.

Then, the formation substrate 91 and the resin layer 93 can be separated from each other. Note that part of the partition 96 remains on the formation substrate 14 side in some cases. The partition 96 may be removed or the next step may be performed without removal of the partition 96.

Structure Example 2 of Display Device

Figure 14A:
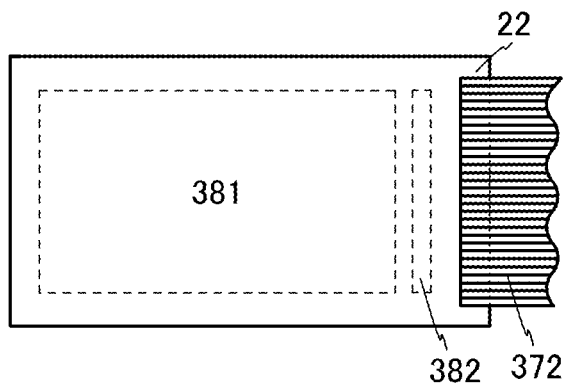
FIGS. 14A and 14B are a top view and a cross-sectional view illustrating an example of a display device.
Figure 14B:
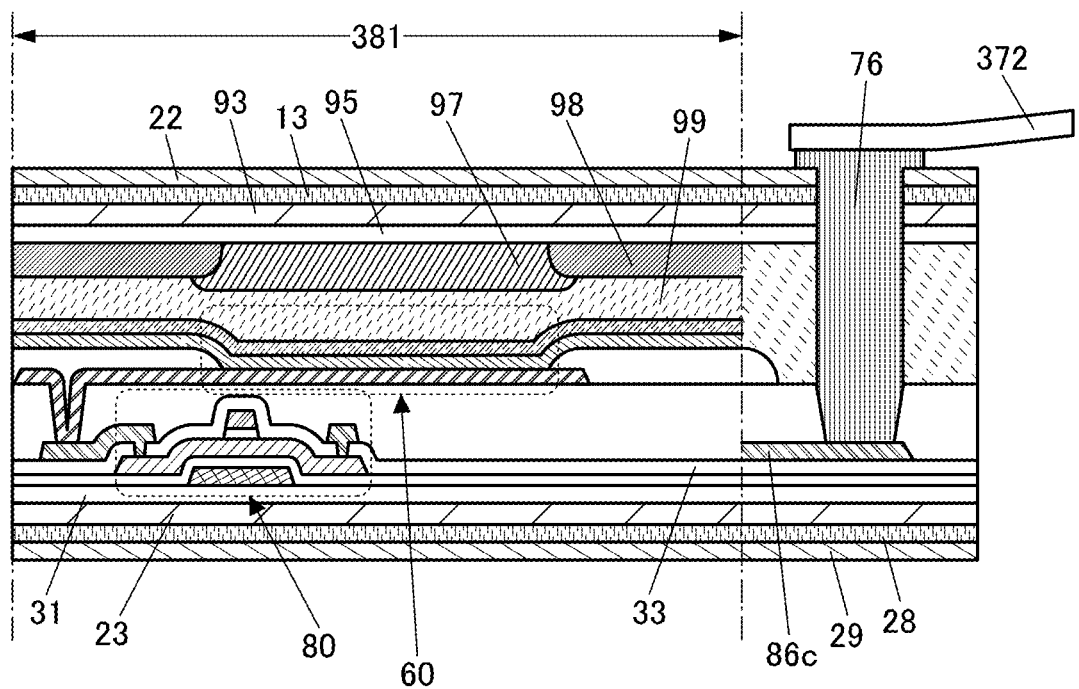

FIG. 14A is a top view of a display device 10B. FIG. 14B is an example of a cross-sectional view illustrating the display portion 381 of the display device 10B and a portion for connection to the FPC 372.

The display device 10B can be manufactured with the use of the above manufacturing method example 2. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

A conductive layer 86c and the FPC 372 are electrically connected through the connector 76 (FIG. 14B). The conductive layer 86c can be formed using the same material and the same step as those of the source and the drain of the transistor.

As described above, the heat treatment performed in an oxygen-containing atmosphere enables the resin layer to be peeled from the formation substrate without laser irradiation of the entire area of the resin layer. Thus, a large amount of oxygen is sometimes observed by analysis in the resin layer of the display device that is manufactured by the manufacturing method of a display device described in this embodiment. Specifically, the oxygen concentration can be obtained by analyzing the surface of the resin layer on the peeling surface side by XPS. The oxygen concentration that is obtained by analyzing the surface of the resin layer 23 on the adhesive layer 28 side by XPS is preferably higher than or equal to 10 atomic %, further preferably higher than or equal to 15 atomic %. The oxygen concentration that is obtained by analyzing the surface of the resin layer 93 on the adhesive layer 13 side by XPS is preferably higher than or equal to 10 atomic %, further preferably higher than or equal to 15 atomic %.

As described above, in the peeling method in this embodiment, a hydrogen-containing layer, an oxygen-containing layer, and a resin layer are stacked over a formation substrate, and the peelability of the resin layer with respect to the formation substrate is adjusted by heating. Treatment using an expensive apparatus, such as linear laser beam irradiation, is not needed and thus, the peeling method is low in cost. Furthermore, the top surface of the oxygen-containing layer includes a portion in contact with the resin layer and a portion in contact with an insulating layer, so that the resin layer can be peeled from the formation substrate at desired timing. Therefore, display devices can be manufactured at low costs and with high productivity by the peeling method described in this embodiment.

This embodiment can be combined with any other embodiment as appropriate. In the case where a plurality of structure examples are described in one embodiment in this specification, some of the structure examples can be combined as appropriate.

Embodiment 2

In this embodiment, a display device of one embodiment of the present invention and a manufacturing method thereof will be described with reference to drawings.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than micro electro mechanical systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, an all-weather display device or a highly convenient display device with high visibility regardless of the ambient brightness can be fabricated.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

The display device of this embodiment can display a full-color image using either the first pixels or the second pixels. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Structure examples of the display device in this embodiment are described with reference to FIG. 15, FIG. 16, and FIGS. 17A and 17B.

Structure Example 1

Figure 15:
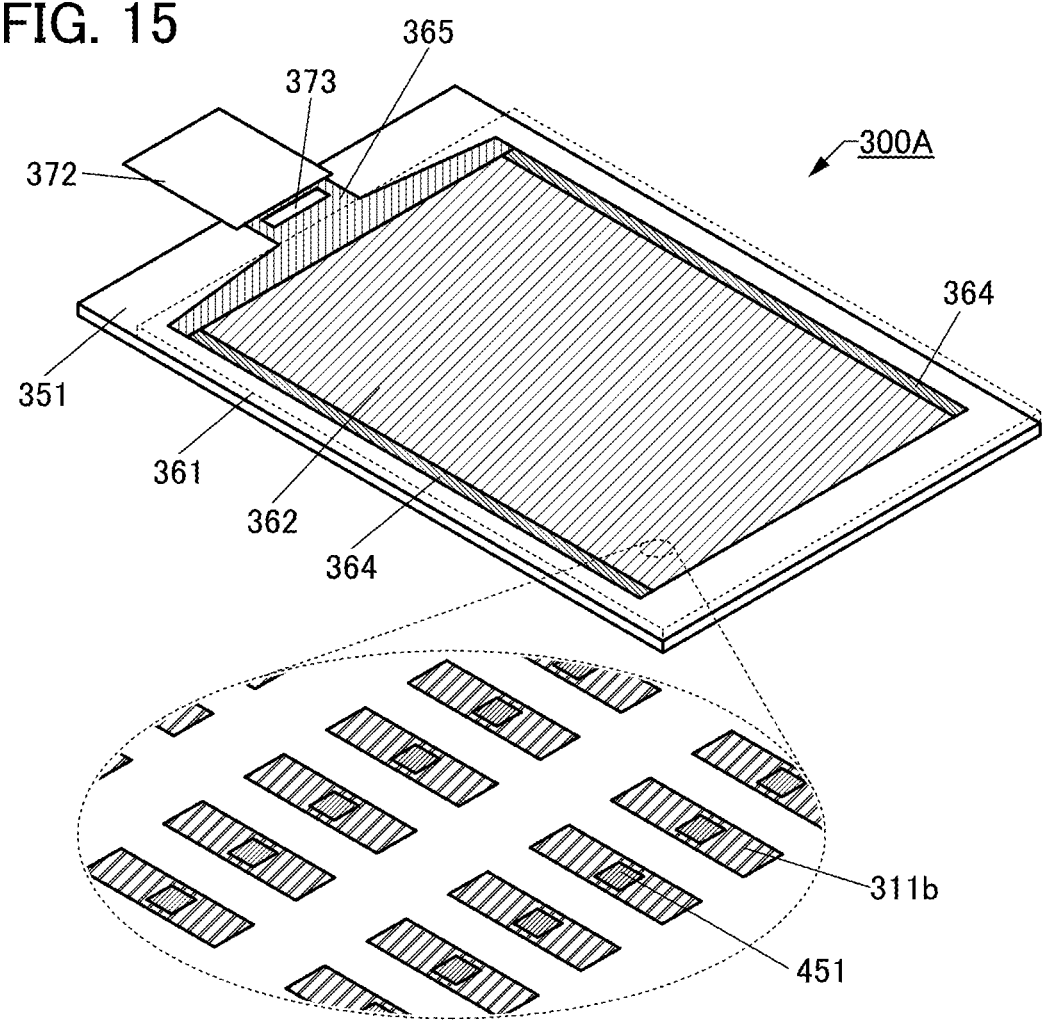
FIG. 15 is a perspective view illustrating an example of a display device.

FIG. 15 is a schematic perspective view of a display device 300A. In the display device 300A, the substrate 351 and the substrate 361 are bonded to each other. In FIG. 15, the substrate 361 is denoted by a dashed line.

The display device 300A includes a display portion 362, a circuit 364, a wiring 365, and the like. FIG. 15 illustrates an example in which the display device 300A is provided with an integrated circuit (IC) 373 and an FPC 372. Thus, the structure illustrated in FIG. 15 can be regarded as a display module including the display device 300A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 15 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300A and the display module are not necessarily provided with an IC. The IC may be provided over the FPC by a COF method or the like.

FIG. 15 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 15, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311b and cannot be extracted to the outside, in some cases. The opening 451 with a sufficiently large area can reduce waste of light emitted from the light-emitting element 170.

Figure 16:
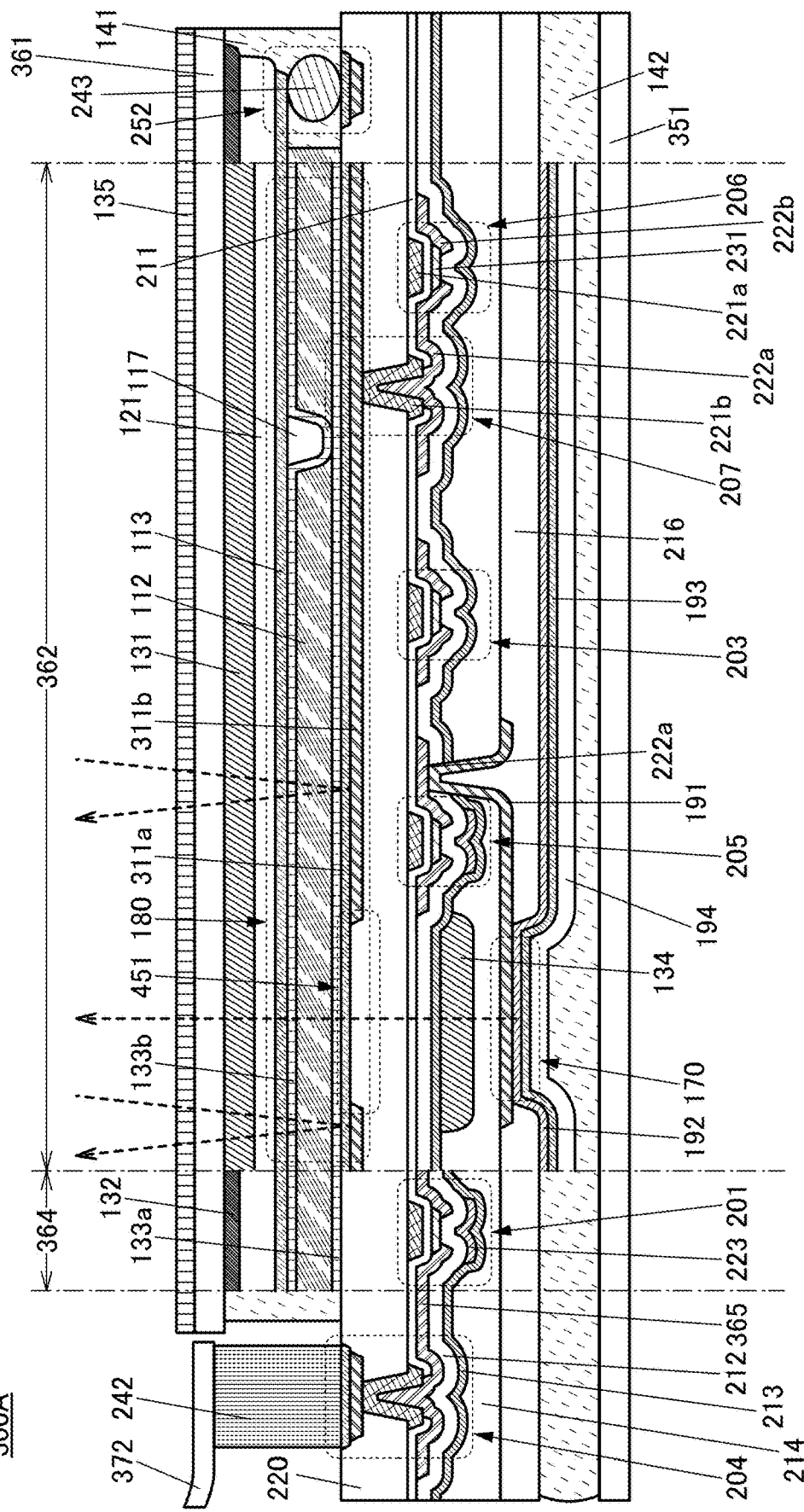
FIG. 16 is a cross-sectional view illustrating an example of a display device.

FIG. 16 illustrates an example of cross-sections of part of a region including the FPC 372, part of a region including the circuit 364, and part of a region including the display portion 362 of the display device 300A illustrated in FIG. 15.

The display device 300A illustrated in FIG. 16 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with an adhesive layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for holding a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a serving as a pixel electrode, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength region is absorbed by the coloring layer 131 and thus, emitted light is red light, for example.

As illustrated in FIG. 16, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals in a boundary portion of these regions is prevented and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 311a is electrically connected to part of the electrode 113 with a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 16, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The light-emitting element 170 is a bottom-emission light-emitting element. The light-emitting element 170 has a stacked-layer structure in which an electrode 191 serving as a pixel electrode, an EL layer 192, and an electrode 193 serving as a common electrode are stacked in this order from the insulating layer 220 side. The electrode 191 is connected to the conductive layer 222a included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300A can display a color image using the liquid crystal element 180. The display device 300A can display a color image using the light-emitting element 170.

The transistor 201, the transistor 203, the transistor 205, and the transistor 206 are formed on a plane of the insulating layer 220 on the substrate 351 side. These transistors can be fabricated through the same process.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 180 is positioned on the opposite side of a gate insulating layer included in the transistor from the pixel electrode of the light-emitting element 170.

In the case where a transistor including a metal oxide in its channel formation region and having an extremely low off-state current is used as the transistor 206 or in the case where a memory element electrically connected to the transistor 206 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material containing an oxide for the conductive layer 223. A conductive film used for the conductive layer 223 is formed in an oxygen-containing atmosphere, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance metal oxide for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which several weight percent or more of a chiral material is mixed is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

For the materials that can be used for the light-emitting element, the transistors, the insulating layers, the conductive layers, the adhesive layers, the connection layer, and the like, the description in Embodiment 1 can be referred to.

Structure Example 2

Figure 17A:
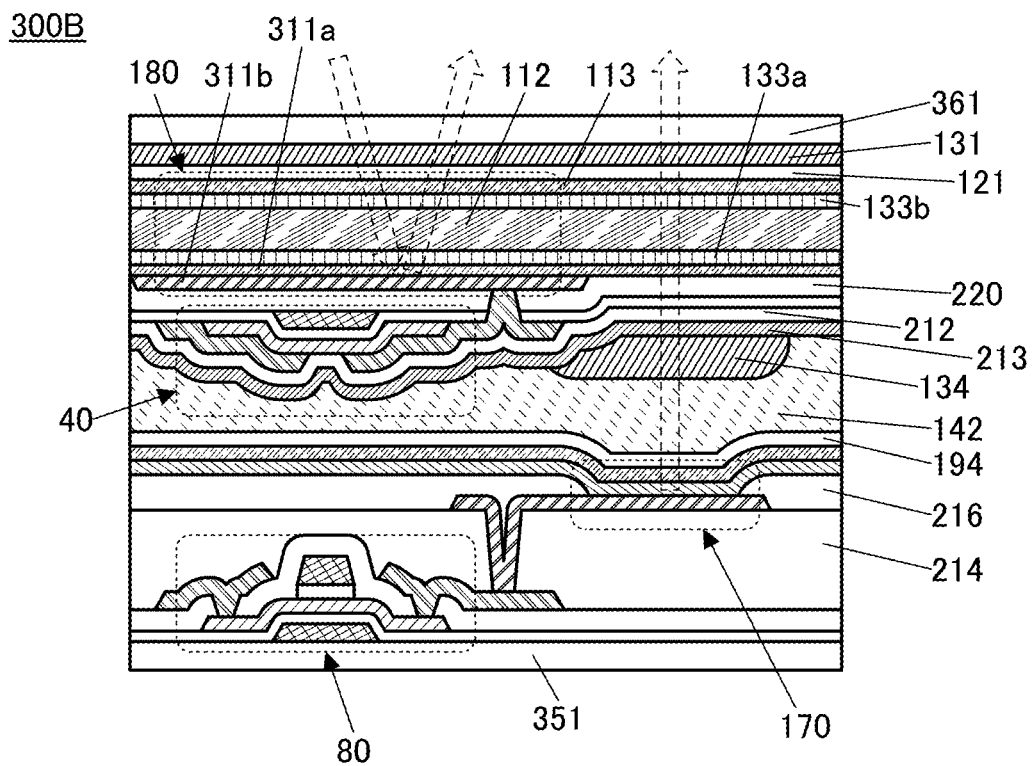
FIGS. 17A and 17B are cross-sectional views each illustrating an example of a display device.

FIG. 17A is a cross-sectional view illustrating a display portion of a display device 300B.

The display device 300B illustrated in FIG. 17A includes the transistor 40, the transistor 80, the liquid crystal element 180, the light-emitting element 170, the insulating layer 220, the coloring layer 131, the coloring layer 134, and the like, between the substrate 351 and the substrate 361.

For the structures and manufacturing methods of the transistor 40 and the transistor 80, Embodiment 1 can be referred to.

In the liquid crystal element 180, external light is reflected on the electrode 311*b* and emitted to the substrate 361 side. The light-emitting element 170 emits light to the substrate 361 side. For the structures of the liquid crystal element 180 and the light-emitting element 170, the structure example 1 can be referred to.

The substrate 361 is provided with the coloring layer 131, the insulating layer 121, the electrode 113 functioning as the common electrode of the liquid crystal element 180, the alignment film 133*b*.

The liquid crystal layer 112 is sandwiched between the electrode 311*a* and the electrode 113 with the alignment film 133*a* positioned between the electrode 311*a* and the liquid crystal layer 112 and with the alignment film 133*b* positioned between the electrode 113 and the liquid crystal layer 112.

The transistor 40 is covered with the insulating layer 212 and the insulating layer 213. The insulating layer 213 and the coloring layer 134 are bonded to the insulating layer 194 with the adhesive layer 142.

In the display device 300B, the transistor 40 for driving the liquid crystal element 180 and the transistor 80 for driving the light-emitting element 170 are formed over different planes; thus, each of the transistors can be easily formed using a structure and a material suitable for driving the corresponding display element.

Structure Example 3

Figure 17B:
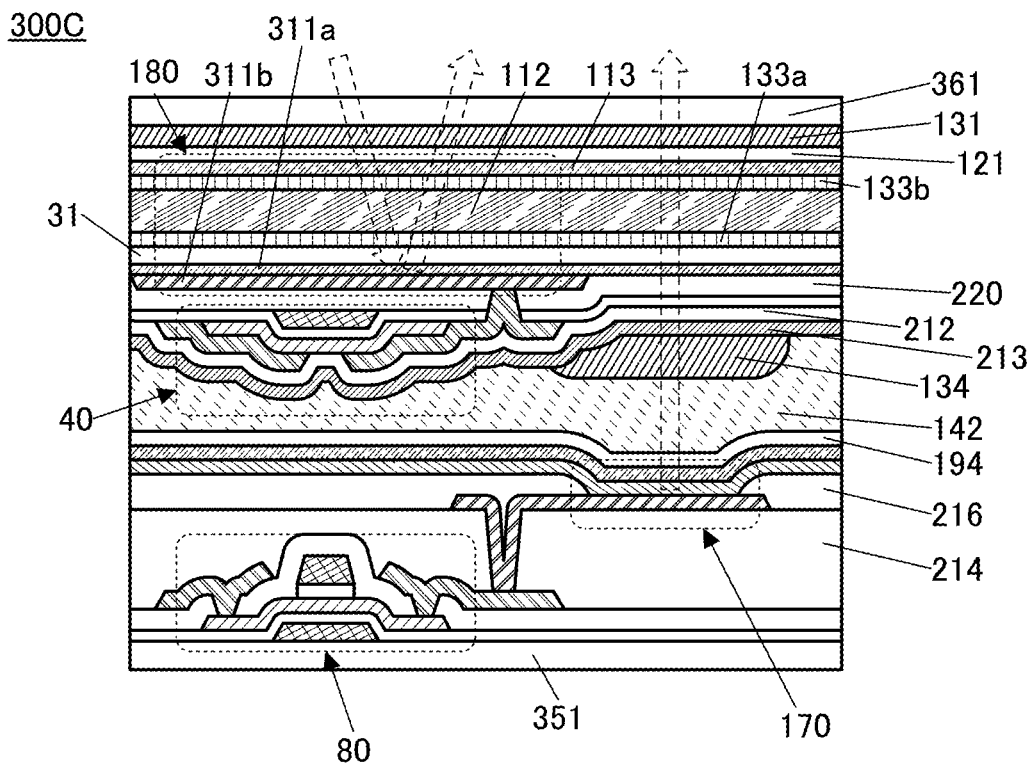

FIG. 17B is a cross-sectional view illustrating a display portion of a display device 300C.

The display device 300C illustrated in FIG. 17B is different from the display device 300B in including the insulating layer 31 over the electrode 311*a*.

The insulating layer 31 is preferably provided because impurities from the region which is close to the substrate 361 than the insulating layer 31 is can be inhibited from entering the transistor 40, the transistor 80, and the light-emitting element 170.

<Manufacturing Method Example of Display Device 300A>

Next, the manufacturing method of the display device of this embodiment will be specifically described with reference to FIGS. 18A to 18D, FIGS. 19A and 19B, and FIGS. 20A and 20B. An example of a manufacturing method of the display device 300A illustrated in FIG. 16 will be described below. The manufacturing method will be described with reference to FIGS. 18A to 18D, FIGS. 19A and 19B, and FIGS. 20A and 20B, focusing on the display portion 362 of the display device 300A. Note that the transistor 203 is not illustrated in FIGS. 18A to 18D, FIGS. 19A and 19B, and FIGS. 20A and 20B.

Figure 18A:
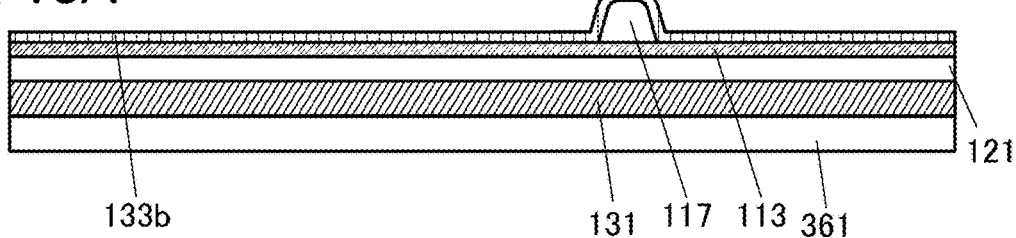
FIGS. 18A to 18D are cross-sectional views illustrating an example of a manufacturing method of a display device.

First, the coloring layer 131 is formed over the substrate 361 (FIG. 18A). The coloring layer 131 is formed using a photosensitive material, in which case the processing into an island shape can be performed by a photolithography method or the like. Note that in a non-display region of the display portion 362 and the circuit 364 and the like illustrated in FIG. 16, the light-blocking layer 132 is provided over the substrate 361.

Then, the insulating layer 121 is formed over the coloring layer 131 and the light-blocking layer 132.

The insulating layer 121 preferably functions as a planarization layer. A resin such as acrylic or epoxy is suitably used for the insulating layer 121.

An inorganic insulating film may be used for the insulating layer 121. For example, an inorganic insulating film such as a silicon nitride film, a silicon oxynitride film, a silicon oxide film, a silicon nitride oxide film, an aluminum oxide film, or an aluminum nitride film can be used for the insulating layer 121. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

Next, the electrode 113 is formed. The electrode 113 can be formed in the following manner: a conductive film is formed, a resist mask is formed, the conductive film is etched, and the resist mask is removed. The electrode 113 is formed using a conductive material that transmits visible light.

After that, the insulating layer 117 is formed over the electrode 113. An organic insulating film is preferably used for the insulating layer 117.

Subsequently, the alignment film 133b is formed over the electrode 113 and the insulating layer 117 (FIG. 18A). The alignment film 133b can be formed in the following manner: a thin film is formed using a resin or the like and then, rubbing treatment is performed.

Furthermore, the steps illustrated in FIGS. 18B to 18D, FIGS. 19A and 19B, and FIG. 20A are performed independently of the steps described with reference to FIG. 18A.

Figure 18B:
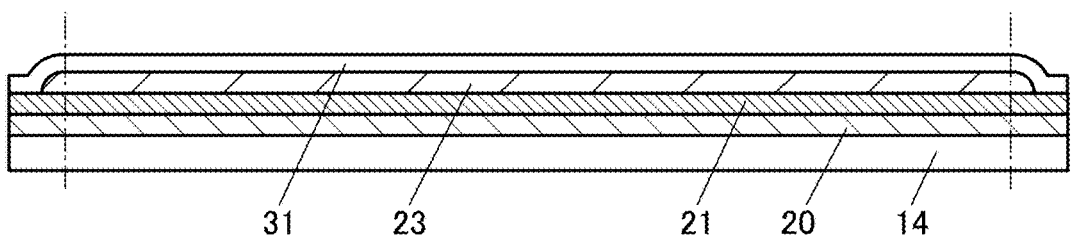

First, the components from the hydrogen-containing layer 20 to the insulating layer 31 are formed over the formation substrate 14 (FIG. 18B). For the steps for forming these components, the peeling method and the manufacturing method example 1 described in Embodiment 1 can be referred to.

Figure 18C:
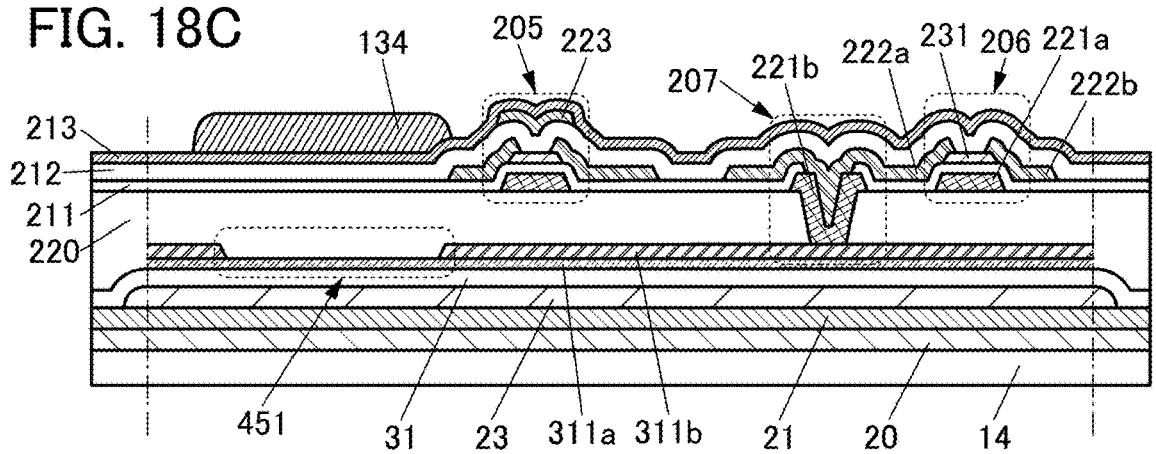

Next, the electrode 311a is formed over the insulating layer 31, and the electrode 311b is formed over the electrode 311a (FIG. 18C). The electrode 311b includes the opening 451 over the electrode 311a. Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

After that, the insulating layer 220 is formed. Then, an opening that reaches the electrode 311b is formed in the insulating layer 220.

The insulating layer 220 can be used as a barrier layer that prevents diffusion of impurities contained in the resin layer 23 into a transistor and a display element formed later. For example, the insulating layer 220 preferably prevents moisture and the like contained in the resin layer 23 from diffusing into the transistor and the display element when the resin layer 23 is heated. Thus, the insulating layer 220 preferably has a high barrier property.

The insulating layer 220 can be formed using the inorganic insulating film, the resin, or the like that can be used for the insulating layer 121.

Next, the transistor 205 and the transistor 206 are formed over the insulating layer 220.

There is no particular limitation on a semiconductor material used for the semiconductor layer of the transistor, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

Described here is the case where a bottom-gate transistor including a metal oxide layer as the semiconductor layer 231 is fabricated as the transistor 206. The transistor 205 includes the conductive layer 223 and the insulating layer 212 in addition to the components of the transistor 206, and has two gates. A metal oxide can function as an oxide semiconductor.

Specifically, first, the conductive layer 221a and the conductive layer 221b are formed over the insulating layer 220. The conductive layer 221a and the conductive layer 221b can be formed in the following manner: a conductive film is formed, a resist mask is formed, the conductive film is etched, and the resist mask is removed. At this time, the conductive layer 221b and the electrode 311b are connected to each other through an opening in the insulating layer 220.

Next, the insulating layer 211 is formed.

For the insulating layer 211, for example, an inorganic insulating film such as a silicon nitride film, a silicon oxynitride film, a silicon oxide film, a silicon nitride oxide film, an aluminum oxide film, or an aluminum nitride film can be used. Alternatively, a hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. Further alternatively, a stack including two or more of the above insulating films may be used.

An inorganic insulating film is preferably formed at high temperatures because the film can have higher density and a higher barrier property as the deposition temperature becomes higher. The substrate temperature during the formation of the inorganic insulating film is preferably higher than or equal to room temperature (25° C.) and lower than or equal to 350° C., further preferably higher than or equal to 100° C. and lower than or equal to 300° C.

Then, the semiconductor layer 231 is formed. In this embodiment, a metal oxide layer is formed as the semiconductor layer 231. The metal oxide layer can be formed in the following manner: a metal oxide film is formed, a resist mask is formed, the metal oxide film is etched, and the resist mask is removed.

Next, the conductive layer 222a and the conductive layer 222b are formed. The conductive layer 222a and the conductive layer 222b can be formed in the following manner: a conductive film is formed, a resist mask is formed, the conductive film is etched, and the resist mask is removed. Each of the conductive layers 222a and 222b is connected to the semiconductor layer 231. Here, the conductive layer 222a included in the transistor 206 is electrically connected to the conductive layer 221b. As a result, the electrode 311b and the conductive layer 222a can be electrically connected to each other at the connection portion 207.

Note that during the processing of the conductive layer 222a and the conductive layer 222b, the semiconductor layer 231 might be partly etched to be thin in a region not covered by the resist mask.

In the above manner, the transistor 206 can be fabricated.

Next, the insulating layer 212 that covers the transistor 206 is formed. The insulating layer 212 is formed to cover the semiconductor layer 231, the conductive layer 222a, and the conductive layer 222b of each of the transistor 205 and the transistor 206. Next, the conductive layer 223 of the transistor 205 is formed over the insulating layer 212.

The insulating layer 212 can be formed in a manner similar to that of the insulating layer 211.

The conductive layer 223 included in the transistor 205 can be formed in the following manner: a conductive film is formed, a resist mask is formed, the conductive film is etched, and the resist mask is removed.

In the above manner, the transistor 205 can be fabricated.

Next, the insulating layer 213 covering the transistor 205 and the transistor 206 is formed. The insulating layer 213 can be formed in a manner similar to that of the insulating layer 211.

It is preferable to use an oxide insulating film formed in an oxygen-containing atmosphere, such as a silicon oxide film or a silicon oxynitride film, for the insulating layer 212. An insulating film with low oxygen diffusibility and oxygen permeability, such as a silicon nitride film, is preferably stacked as the insulating layer 213 over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer. As a result, oxygen vacancies in the metal oxide layer can be filled and defects at the interface between the metal oxide layer and the insulating layer 212 can be repaired, leading to a reduction in defect levels. Accordingly, a display device with extremely high reliability can be fabricated.

Figure 18D:
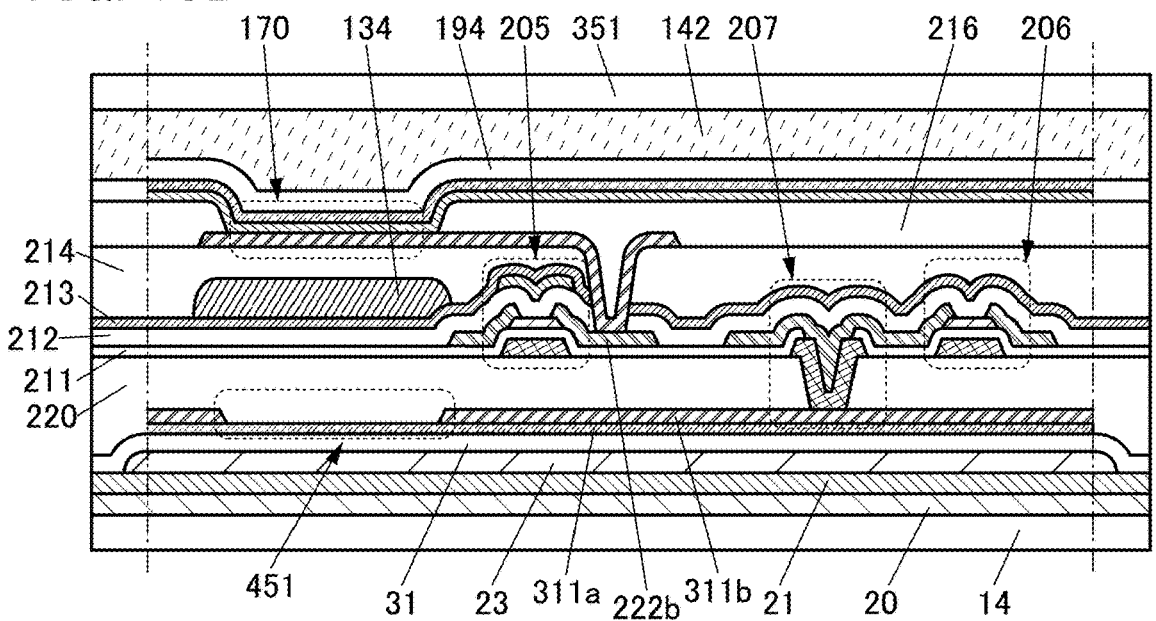

Next, the coloring layer 134 is formed over the insulating layer 213 (FIG. 18C) and then, the insulating layer 214 is formed (FIG. 18D). The coloring layer 134 is positioned so as to overlap with the opening 451 in the electrode 311b.

The coloring layer 134 can be formed in a manner similar to that of the coloring layer 131. The display element is formed on the insulating layer 214 in a later step; thus, the insulating layer 214 preferably functions as a planarization layer. For the insulating layer 214, the description of the resin or the inorganic insulating film that can be used for the insulating layer 121 can be referred to.

After that, an opening that reaches the conductive layer 222a included in the transistor 205 is formed in the insulating layer 212, the insulating layer 213, and the insulating layer 214.

Subsequently, the electrode 191 is formed. The electrode 191 can be formed in the following manner: a conductive film is formed, a resist mask is formed, the conductive film is etched, and the resist mask is removed. Here, the conductive layer 222a included in the transistor 205 and the electrode 191 are connected to each other. The electrode 191 is formed using a conductive material that transmits visible light.

Then, the insulating layer 216 that covers the end portion of the electrode 191 is formed. For the insulating layer 216, the description of the resin or the inorganic insulating film that can be used for the insulating layer 121 can be referred to. The insulating layer 216 includes an opening in a region overlapping with the electrode 191.

Next, the EL layer 192 and the electrode 193 are formed. Part of the electrode 193 functions as the common electrode of the light-emitting element 170. The electrode 193 is formed using a conductive material that reflects visible light.

Steps after the formation of the EL layer 192 are performed such that temperatures higher than the upper temperature limit of the EL layer 192 are not applied to the EL layer 192. The electrode 193 can be formed by an evaporation method, a sputtering method, or the like.

In the above manner, the light-emitting element 170 can be formed. The light-emitting element 170 is formed such that the light-emitting region overlaps with the coloring layer 134 and the opening 451 in the electrode 311b.

Next, the insulating layer 194 is formed so as to cover the electrode 193. The insulating layer 194 functions as a protective layer that prevents diffusion of impurities such as water into the light-emitting element 170. The light-emitting element 170 is sealed with the insulating layer 194. After the electrode 193 is formed, the insulating layer 194 is preferably formed without exposure to the air.

The inorganic insulating film that can be used for the insulating layer 121 can be used for the insulating layer 194, for example. It is particularly preferable that the insulating layer 194 include an inorganic insulating film with a high barrier property. A stack including an inorganic insulating film and an organic insulating film can also be used.

The insulating layer 194 is preferably formed at substrate temperature lower than or equal to the upper temperature limit of the EL layer 192. The insulating layer 194 can be formed by an ALD method, a sputtering method, or the like. An ALD method and a sputtering method are preferable because a film can be formed at low temperatures. An ALD method is preferable because the coverage with the insulating layer 194 is improved.

Then, the substrate 351 is bonded to a surface of the insulating layer 194 with the adhesive layer 142 (FIG. 18D).

The adhesive layer 142 can be formed using any of the materials given in Embodiment 1 as examples of the material that can be used for the adhesive layer 75b.

The substrate 351 can be formed using any of the materials given in Embodiment 1 as examples of the material that can be used for the substrate 75a.

Figure 19A:
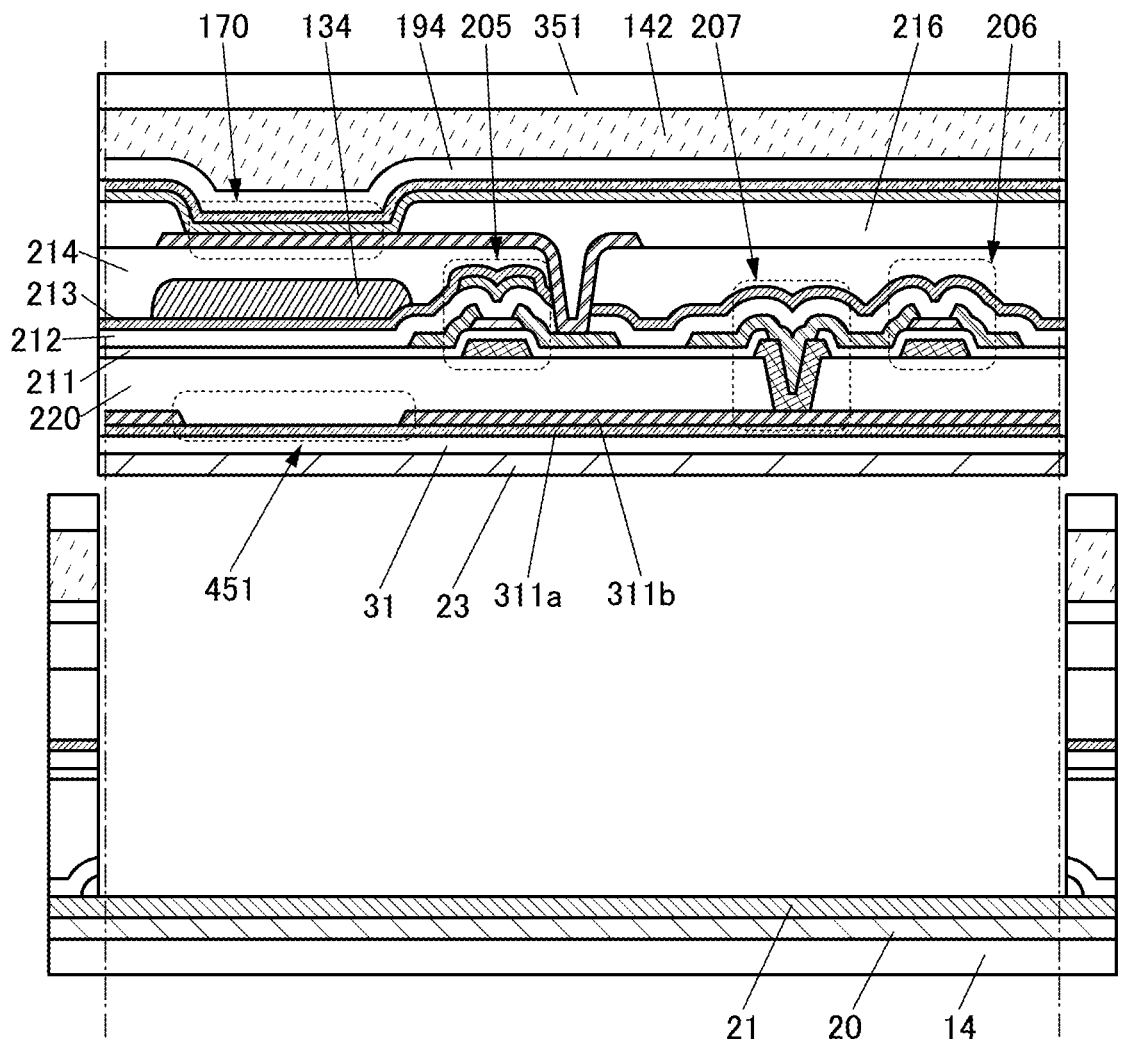
FIGS. 19A and 19B are cross-sectional views illustrating an example of a manufacturing method of a display device.
Figure 19B:
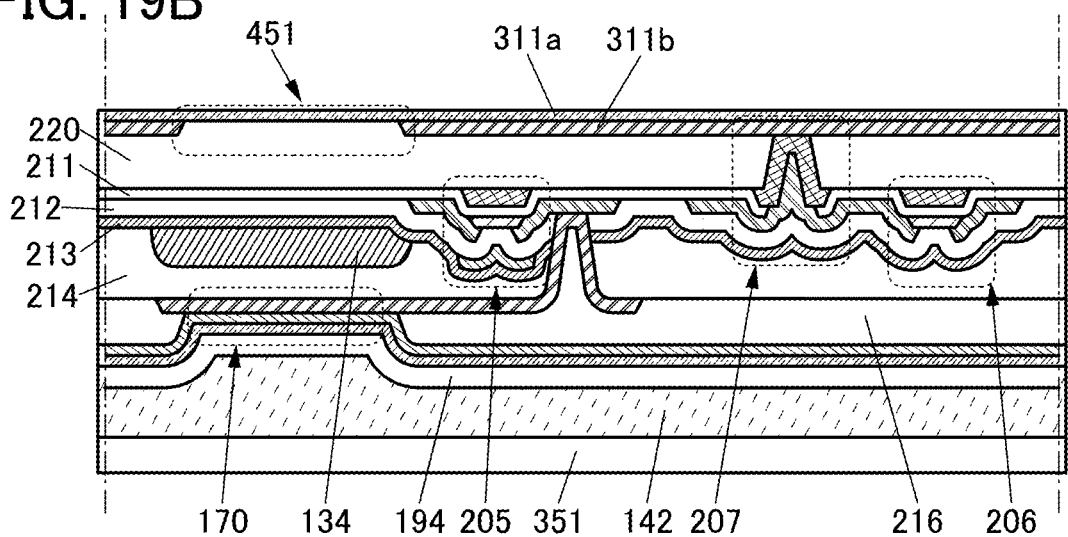

Then, a separation trigger is formed in the resin layer 23, and the formation substrate 14 and the resin layer 23 are separated from each other (FIG. 19A). FIG. 19A illustrates an example in which separation occurs at the interface between the resin layer 23 and the oxygen-containing layer 21. Note that part of the resin layer 23 sometimes remains on the oxygen-containing layer 21 side.

Next, the resin layer 23 and the insulating layer 31 are preferably removed. The resin layer 23 and the insulating layer 31 can be removed by a dry etching method, for example. Accordingly, the electrode 311a is exposed (FIG.

19B). Note that the insulating layer 31 may remain over the electrode 311a, and the resin layer 23 may remain over the insulating layer 31.

Figure 20A:
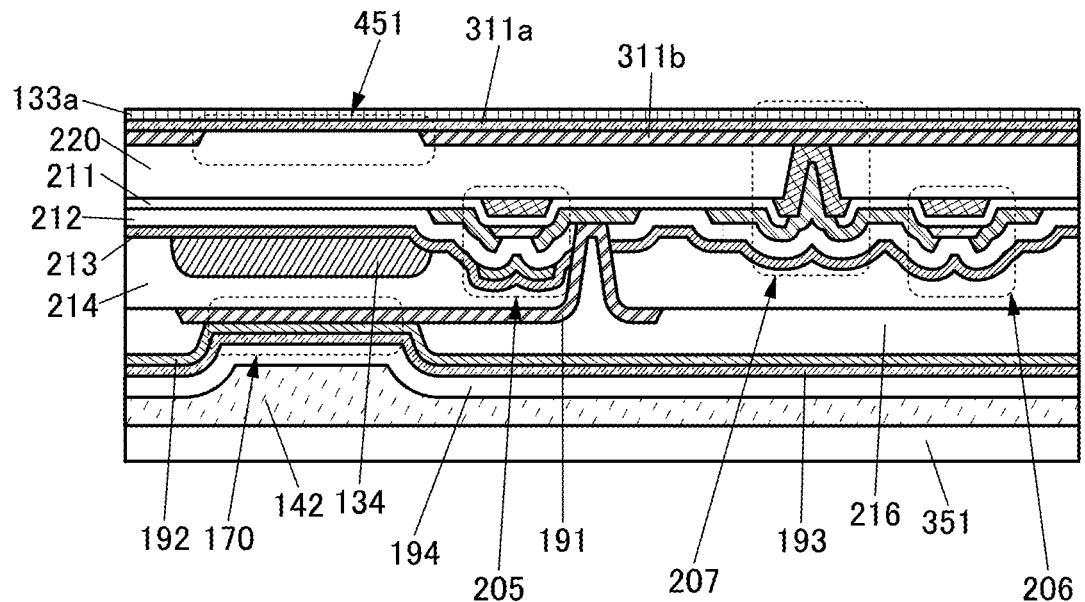
FIGS. 20A and 20B are cross-sectional views illustrating an example of a manufacturing method of a display device.

Subsequently, the alignment film 133a is formed on the exposed surface of the electrode 311a (FIG. 20A). The alignment film 133a can be formed in the following manner: a thin film is formed using a resin or the like and then, rubbing treatment is performed.

Figure 20B:
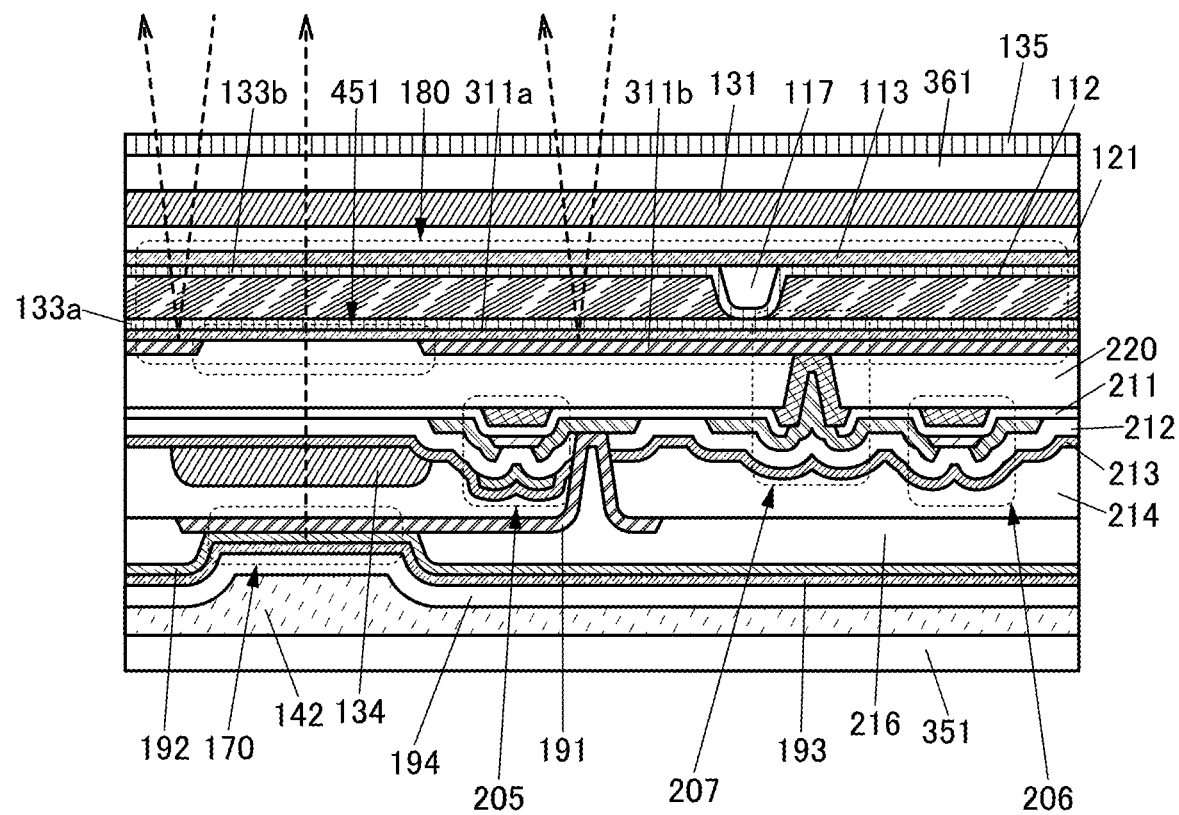

Then, the substrate 361 obtained from the steps described using FIG. 18A and the substrate 351 obtained from the steps up to the step illustrated in FIG. 20A are bonded to each other with the liquid crystal layer 112 provided therebetween (FIG. 20B). Although not illustrated in FIG. 20B, the substrate 351 and the substrate 361 are bonded to each other with the adhesive layer 141 as illustrated in FIG. 16 and other drawings. For materials for the adhesive layer 141, the description of the materials that can be used for the adhesive layer 142 can be referred to.

In the liquid crystal element 180 illustrated in FIG. 20B, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

The polarizing plate 135 is placed on the outer surface of the substrate 361.

Through the above process, the display device 300A can be manufactured.

<Manufacturing Method Example of Display Device 300B>

Next, the manufacturing method of the display device of this embodiment will be specifically described with reference to FIGS. 21A to 21D, FIGS. 22A and 22B, and FIGS. 23A to 23C. An example of a manufacturing method of the display device 300B illustrated in FIG. 17A will be described below. Note that portions similar to those in the manufacturing method example of the display device 300A will not be described in some cases.

Figure 21A:
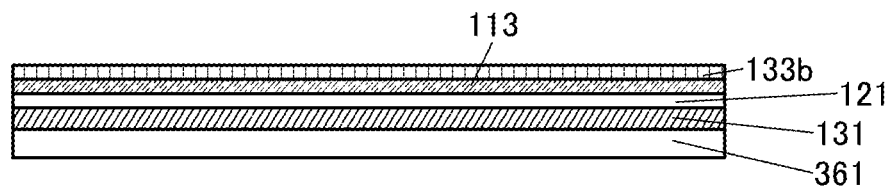
FIGS. 21A to 21D are cross-sectional views illustrating an example of a manufacturing method of a display device.

First, as in the manufacturing method example of the display device 300A, the coloring layer 131, the insulating layer 121, the electrode 113, and the alignment film 133b are formed over the substrate 361 in that order (FIG. 21A).

Figure 21B:
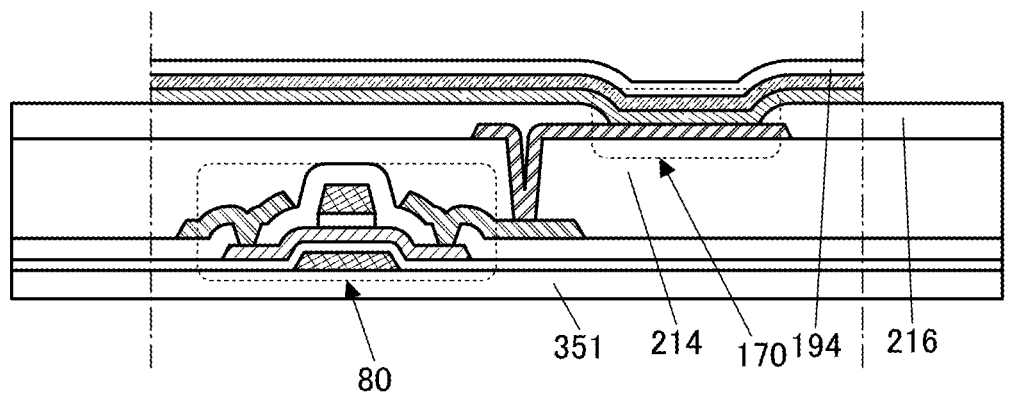

Furthermore, the steps illustrated in FIG. 21B are performed independently of the steps described with reference to FIG. 21A.

First, the transistor 80 is formed over the substrate 351. For the structure and manufacturing method of the transistor 80, Embodiment 1 can be referred to.

Then, the insulating layer 214, the insulating layer 216, the light-emitting element 170, and the insulating layer 194 are formed (FIG. 21B). For the structures and formation methods of the insulating layer 214, the insulating layer 216, the light-emitting element 170, and the insulating layer 194, the manufacturing method example of the display device 300A can be referred to.

Figure 21C:
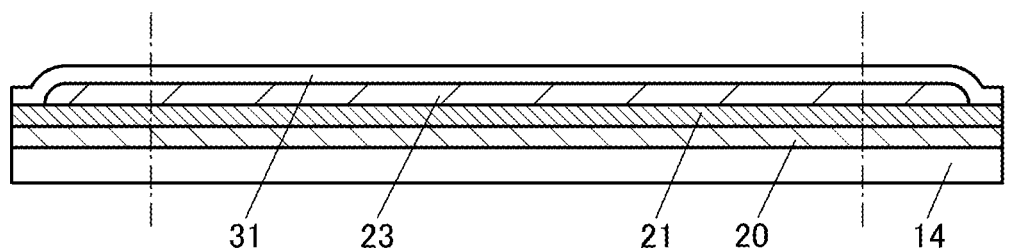
Figure 21D:
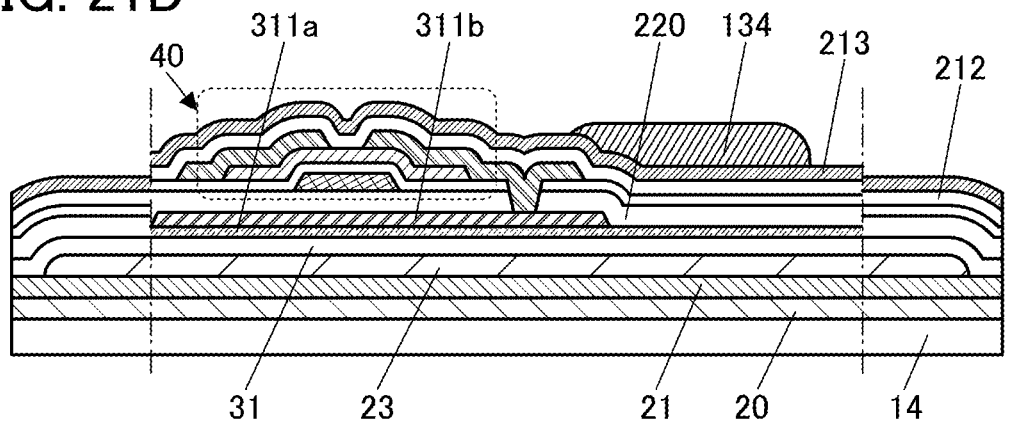

Furthermore, the steps illustrated in FIGS. 21C and 21D are performed independently of the steps described with reference to FIG. 21A and the steps described with reference to FIG. 21B.

First, the components from the hydrogen-containing layer 20 to the insulating layer 31 are formed over the formation substrate 14 (FIG. 21C). For the steps for forming these components, the peeling method and the manufacturing method example 1 described in Embodiment 1 can be referred to.

Next, the electrode 311a is formed over the insulating layer 31, and the electrode 311b is formed over the electrode 311a (FIG. 21D). Each of the electrodes 311a and 311b can be formed in the following manner: a conductive film is formed, a resist mask is formed, the conductive film is etched, and the resist mask is removed. The electrode 311a is formed using a conductive material that transmits visible light. The electrode 311b is formed using a conductive material that reflects visible light.

After that, the insulating layer 220 is formed (FIG. 21D). Then, an opening that reaches the electrode 311b is formed in the insulating layer 220. Note that the opening reaching the electrode 311b can also be provided during the manufacturing process of the transistor 40 by collectively processing the insulating layer 220 and the gate insulating layer of the transistor 40.

Then, the transistor 40 is formed over the insulating layer 220. For the structure and manufacturing method of the transistor 40, Embodiment 1 can be referred to.

After that, the insulating layer 212 that covers the transistor 40 is formed, the insulating layer 213 is formed over the insulating layer 212, and the coloring layer 134 is formed over the insulating layer 213 (FIG. 21D).

Figure 22A:
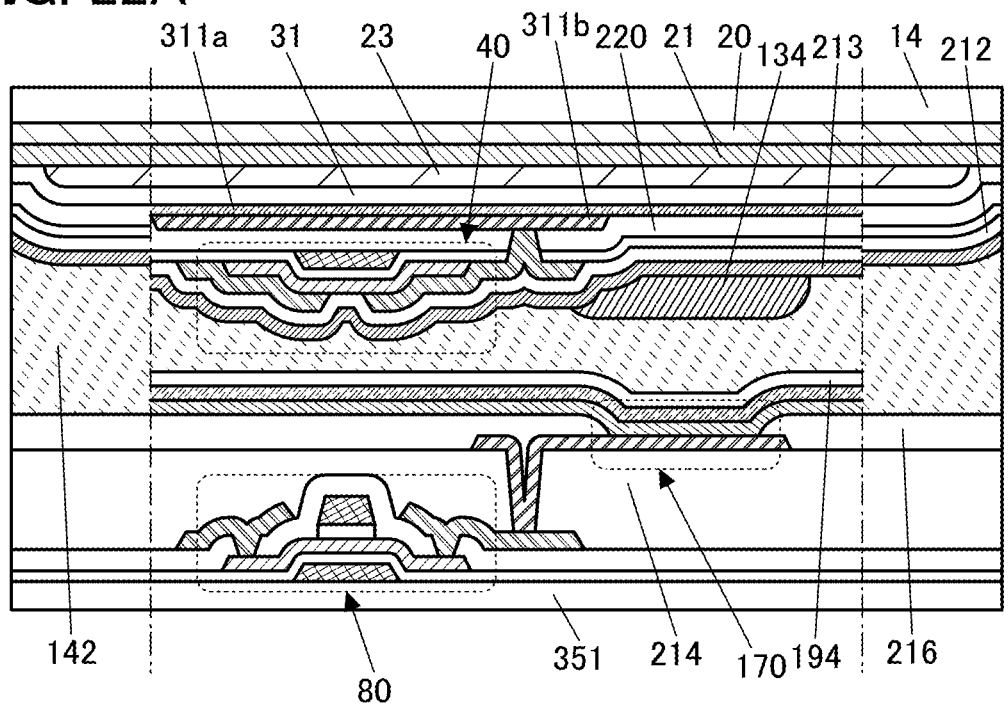
FIGS. 22A and 22B are cross-sectional views illustrating an example of a manufacturing method of a display device.

The substrate 351 obtained from the steps described with reference to FIG. 21B and the formation substrate 14 obtained from the steps up to the steps illustrated in FIG. 21D, are bonded to each other with the adhesive layer 142 (FIG. 22A).

Figure 22B:
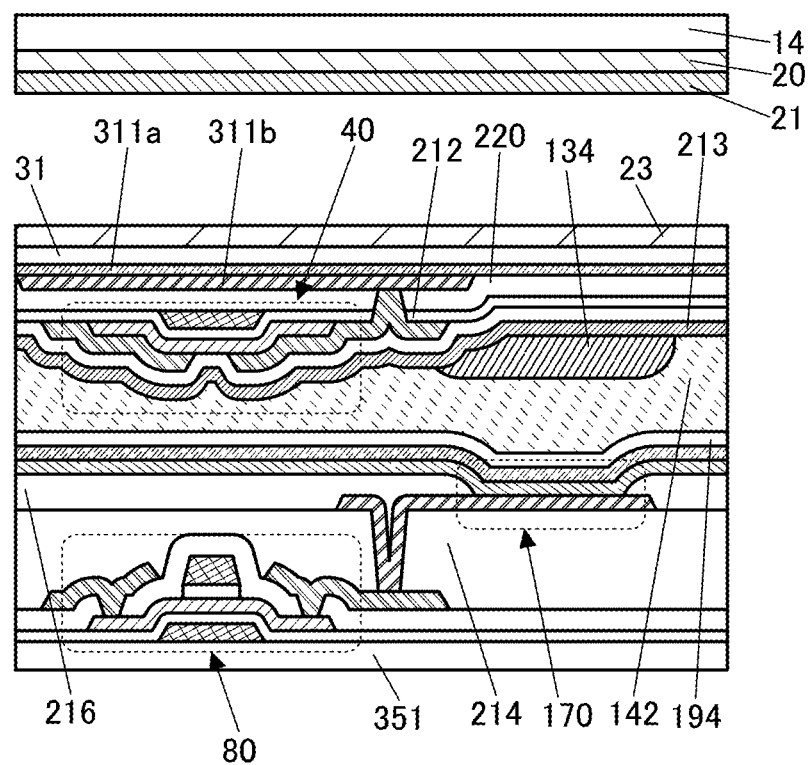

Then, a separation trigger is formed in the resin layer 23. The formation substrate 14 and the resin layer 23 are separated from each other (FIG. 22B). FIG. 22B illustrates an example in which separation occurs at the interface between the resin layer 23 and the oxygen-containing layer 21. Note that part of the resin layer 23 sometimes remains on the oxygen-containing layer 21 side.

Figure 23A:
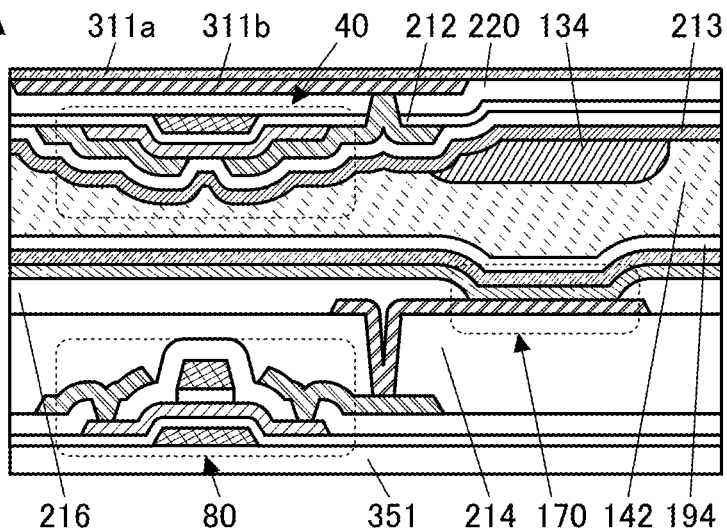
FIGS. 23A to 23C are cross-sectional views illustrating an example of a manufacturing method of a display device.

Next, the resin layer 23 and the insulating layer 31 are preferably removed. The resin layer 23 and the insulating layer 31 can be removed by a dry etching method, for example. Accordingly, the electrode 311a is exposed (FIG. 23A). Note that the insulating layer 31 may remain over the electrode 311a, and the resin layer 23 may remain over the insulating layer 31.

Figure 23B:
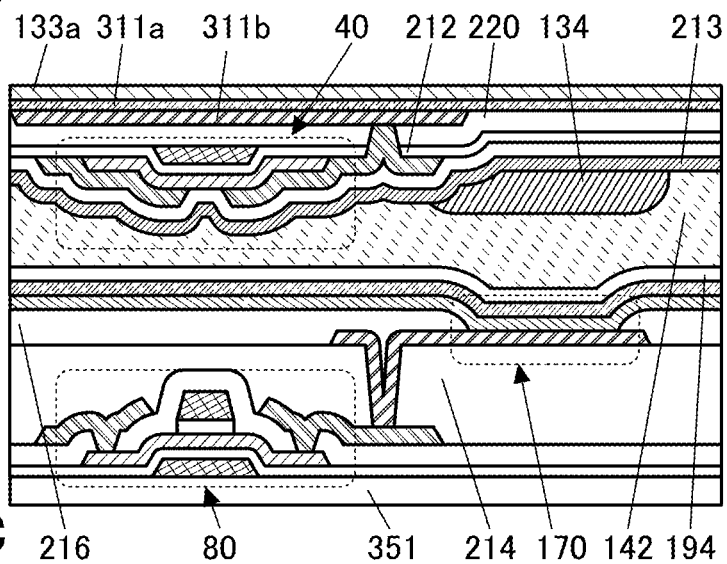

Subsequently, the alignment film 133a is formed on the exposed surface of the electrode 311a (FIG. 23B).

Figure 23C:
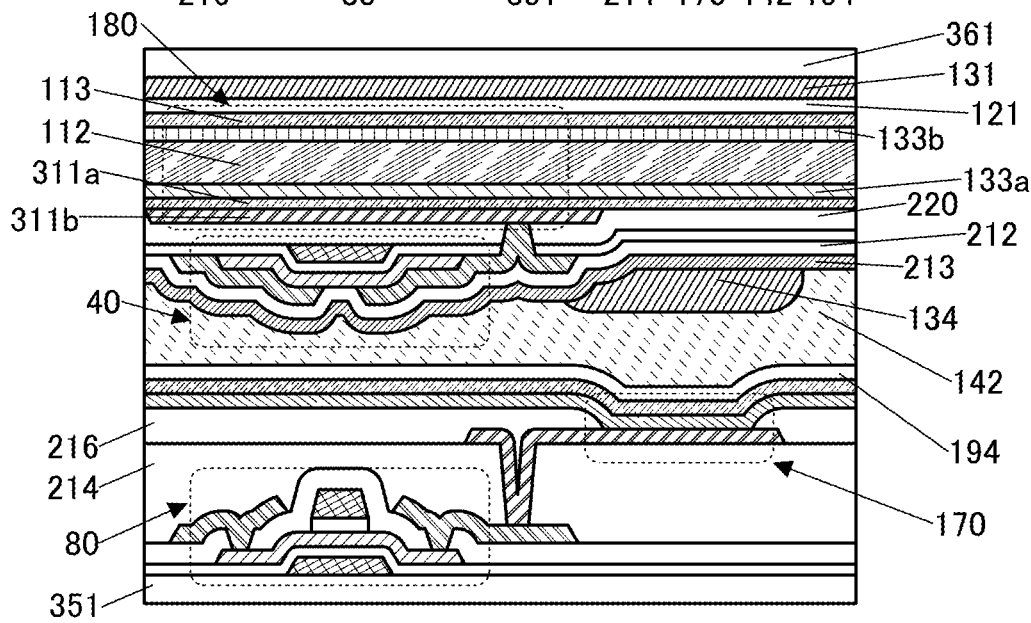

Then, the substrate 361 obtained from the step described using FIG. 21A and the substrate 351 obtained from the steps up to the step illustrated in FIG. 23B are bonded to each other with the liquid crystal layer 112 provided therebetween (FIG. 23C). Although not illustrated in FIG. 23C, the substrate 351 and the substrate 361 are bonded to each other with an adhesive layer.

In the liquid crystal element 180 illustrated in FIG. 23C, the electrode 311a (and the electrode 311b) part of which functions as the pixel electrode, the liquid crystal layer 112, and the electrode 113 part of which functions as the common electrode are stacked. The liquid crystal element 180 is formed so as to overlap with the coloring layer 131.

Through the above process, the display device 300B can be manufactured.

The display device of this embodiment includes two types of display elements as described above; thus, switching between a plurality of display modes is possible. Accordingly, the display device can have high visibility regardless of the ambient brightness, leading to high convenience.

With the use of the method described in Embodiment 1, the resin layer 23 can be peeled from the formation substrate 14 without laser irradiation performed on the entire area of the resin layer 23. Consequently, a display device can be manufactured at low costs. In addition, peeling of the resin layer 23 from the formation substrate 14 at undesired timing can be avoided. Since the timing of peeling can be controlled and high peelability can be achieved, the yield of a peeling process and a manufacturing process of a display device can be increased.

This embodiment can be combined with any other embodiment as appropriate.

Embodiment 3

In this embodiment, more specific structure examples of the display device described in Embodiment 2 will be described with reference to FIGS. 24A, 24B1, 24B2, 24B3, and 24B4, FIG. 25, and FIGS. 26A and 26B.

Figure 24A:
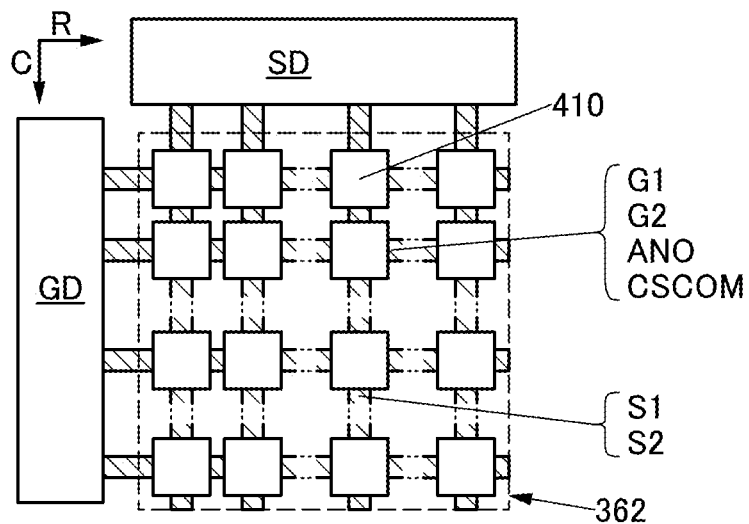
FIG. 24A illustrates an example of a display device, and FIGS. 24B1, 24B2, 24B3, and 24B4 each illustrate an example of a pixel.
Figure 24A:
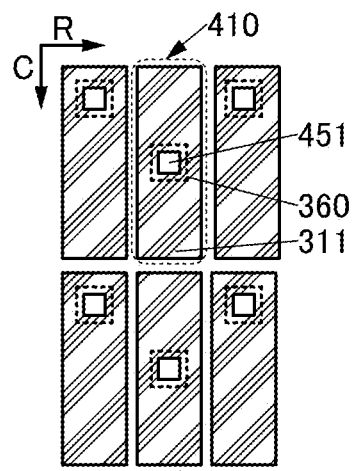
Figure 24A:
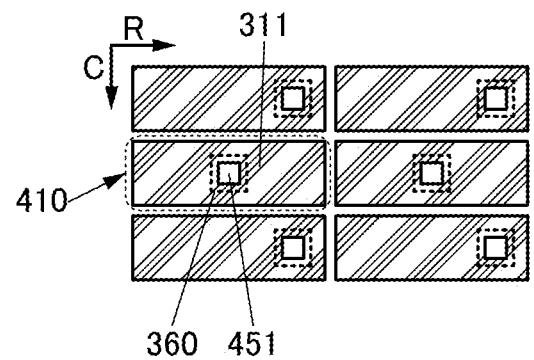
Figure 24A:
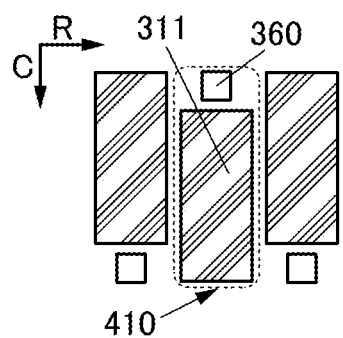
Figure 24A:
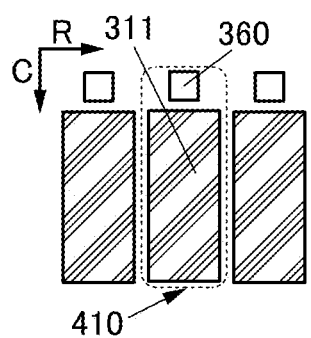

FIG. 24A is a block diagram of a display device 400. The display device 400 includes the display portion 362, a circuit GD, and a circuit SD. The display portion 362 includes a plurality of pixels 410 arranged in a matrix.

The display device 400 includes a plurality of wirings G1, a plurality of wirings G2, a plurality of wirings ANO, a plurality of wirings CSCOM, a plurality of wirings S1, and a plurality of wirings S2. The plurality of wirings G1, the plurality of wirings G2, the plurality of wirings ANO, and the plurality of wirings CSCOM are each electrically connected to the circuit GD and the plurality of pixels 410 arranged in a direction indicated by an arrow R. The plurality of wirings S1 and the plurality of wirings S2 are each electrically connected to the circuit SD and the plurality of pixels 410 arranged in a direction indicated by an arrow C.

Although the structure including one circuit GD and one circuit SD is illustrated here for simplicity, the circuit GD and the circuit SD for driving liquid crystal elements and the circuit GD and the circuit SD for driving light-emitting elements may be provided separately.

The pixels 410 each include a reflective liquid crystal element and a light-emitting element.

FIGS. 24B1, 24B2, 24B3, and 24B4 illustrate structure examples of the electrode 311 included in the pixel 410. The electrode 311 serves as a reflective electrode of the liquid crystal element. The opening 451 is provided in the electrode 311 in FIGS. 24B1 and 24B2.

In FIGS. 24B1 and 24B2, a light-emitting element 360 positioned in a region overlapping with the electrode 311 is indicated by a broken line. The light-emitting element 360 overlaps with the opening 451 included in the electrode 311. Thus, light from the light-emitting element 360 is emitted to the display surface side through the opening 451.

In FIG. 24B1, the pixels 410 which are adjacent in the direction indicated by the arrow R are pixels emitting light of different colors. As illustrated in FIG. 24B1, the openings 451 are preferably provided in different positions in the electrodes 311 so as not to be aligned in two adjacent pixels provided in the direction indicated by the arrow R. This allows two light-emitting elements 360 to be apart from each other, thereby preventing light emitted from the light-emitting element 360 from entering a coloring layer in the adjacent pixel 410 (such a phenomenon is referred to as crosstalk). Furthermore, since two adjacent light-emitting elements 360 can be arranged apart from each other, a high-resolution display device is achieved even when EL layers of the light-emitting elements 360 are separately formed with a blocking mask or the like.

In FIG. 24B2, the pixels 410 which are adjacent in a direction indicated by the arrow C are pixels emitting light of different colors. Also in FIG. 24B2, the openings 451 are preferably provided in different positions in the electrodes 311 so as not to be aligned in two adjacent pixels provided in the direction indicated by the arrow C.

The lower the ratio of the total area of the opening 451 to the total area except for the opening is, the brighter an image displayed using the liquid crystal element can be. Furthermore, the higher the ratio of the total area of the opening 451 to the total area except for the opening is, the brighter an image displayed using the light-emitting element 360 can be.

The opening 451 may have a polygonal shape, a quadrangular shape, an elliptical shape, a circular shape, a cross-like shape, a stripe shape, a slit-like shape, or a checkered pattern, for example. The opening 451 may be provided close to the adjacent pixel. Preferably, the opening 451 is provided close to another pixel emitting light of the same color, in which case crosstalk can be suppressed.

As illustrated in FIGS. 24B3 and 24B4, a light-emitting region of the light-emitting element 360 may be positioned in a region where the electrode 311 is not provided, in which case light emitted from the light-emitting element 360 is emitted to the display surface side.

In FIG. 24B3, the light-emitting elements 360 are not aligned in two adjacent pixels 410 provided in the direction indicated by the arrow R. In FIG. 24B4, the light-emitting elements 360 are aligned in two adjacent pixels 410 provided in the direction indicated by the arrow R.

The structure illustrated in FIG. 24B3 can, as mentioned above, prevent crosstalk and increase the resolution because the light-emitting elements 360 included in two adjacent pixels 410 can be apart from each other. The structure illustrated in FIG. 24B4 can prevent light emitted from the light-emitting element 360 from being blocked by the electrode 311 because the electrode 311 is not positioned along a side of the light-emitting element 360 which is parallel to the direction indicated by the arrow C. Thus, high viewing angle characteristics can be achieved.

As the circuit GD, any of a variety of sequential circuits such as a shift register can be used. In the circuit GD, a transistor, a capacitor, and the like can be used. A transistor included in the circuit GD can be formed in the same steps as the transistors included in the pixels 410.

The circuit SD is electrically connected to the wirings S1. For example, an integrated circuit can be used as the circuit SD. Specifically, an integrated circuit formed on a silicon substrate can be used as the circuit SD.

For example, a COG method, a COF method, or the like can be used to mount the circuit SD on a pad electrically connected to the pixels 410. Specifically, an anisotropic conductive film can be used to mount an integrated circuit on the pad.

Figure 25:
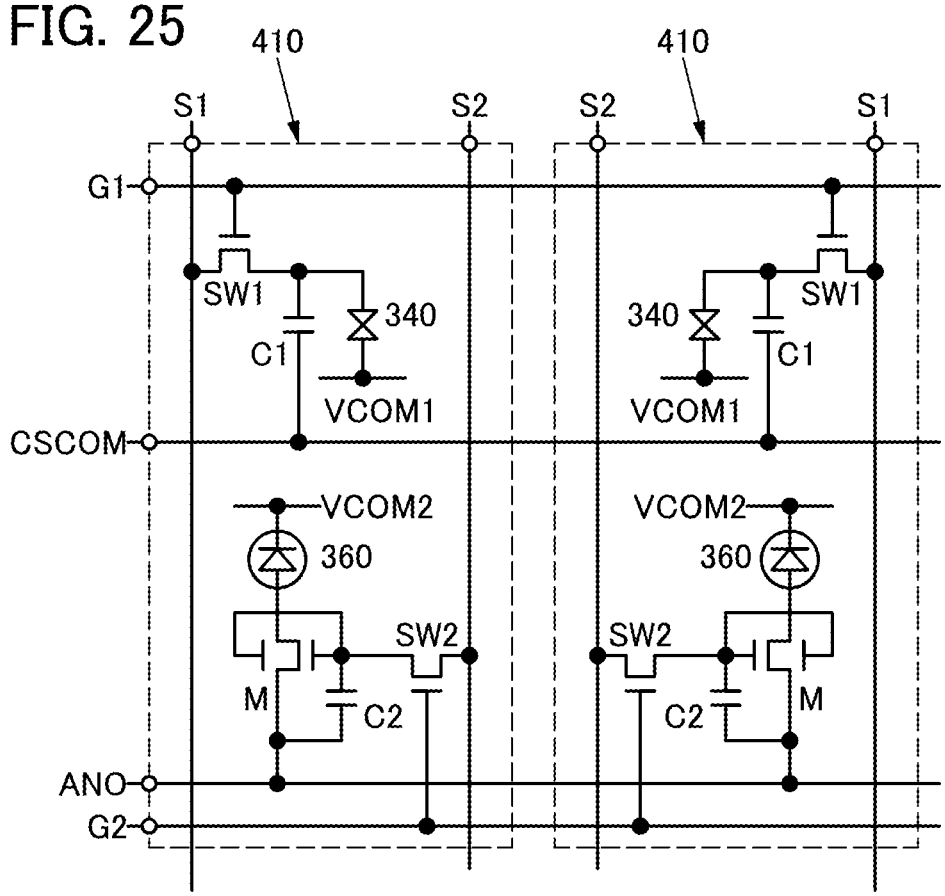
FIG. 25 is a circuit diagram illustrating an example of a pixel circuit in a display device.

FIG. 25 is an example of a circuit diagram of the pixels 410. FIG. 25 illustrates two adjacent pixels 410.

The pixels 410 each include a switch SW1, a capacitor C1, a liquid crystal element 340, a switch SW2, a transistor M, a capacitor C2, the light-emitting element 360, and the like. The pixel 410 is electrically connected to the wiring G1, the wiring G2, the wiring ANO, the wiring CSCOM, the wiring S1, and the wiring S2. FIG. 25 illustrates a wiring VCOM1 electrically connected to the liquid crystal element 340 and a wiring VCOM2 electrically connected to the light-emitting element 360.

FIG. 25 illustrates an example in which a transistor is used as each of the switches SW1 and SW2.

A gate of the switch SW1 is connected to the wiring G1. One of a source and a drain of the switch SW1 is connected to the wiring S1, and the other is connected to one electrode of the capacitor C1 and one electrode of the liquid crystal element 340. The other electrode of the capacitor C1 is connected to the wiring CSCOM. The other electrode of the liquid crystal element 340 is connected to the wiring VCOM1.

A gate of the switch SW2 is connected to the wiring G2. One of a source and a drain of the switch SW2 is connected to the wiring S2, and the other is connected to one electrode of the capacitor C2 and gates of the transistor M. The other electrode of the capacitor C2 is connected to one of a source and a drain of the transistor M and the wiring ANO. The other of the source and the drain of the transistor M is connected to one electrode of the light-emitting element 360. Furthermore, the other electrode of the light-emitting element 360 is connected to the wiring VCOM2.

FIG. 25 illustrates an example where the transistor M includes two gates between which a semiconductor is provided and which are connected to each other. This structure can increase the amount of current flowing through the transistor M.

The wiring G1 can be supplied with a signal for changing the on/off state of the switch SW1. A predetermined potential can be supplied to the wiring VCOM1. The wiring S1 can be supplied with a signal for changing the orientation of liquid crystals of the liquid crystal element 340. A predetermined potential can be supplied to the wiring CSCOM.

The wiring G2 can be supplied with a signal for changing the on/off state of the switch SW2. The wiring VCOM2 and the wiring ANO can be supplied with potentials having a difference large enough to make the light-emitting element 360 emit light. The wiring S2 can be supplied with a signal for changing the conduction state of the transistor M.

In the pixel 410 of FIG. 25, for example, an image can be displayed in the reflective mode by driving the pixel with the signals supplied to the wiring G1 and the wiring S1 and utilizing the optical modulation of the liquid crystal element 340. In the case where an image is displayed in the transmissive mode, the pixel is driven with the signals supplied to the wiring G2 and the wiring S2 and the light-emitting element 360 emits light. In the case where both modes are performed at the same time, the pixel can be driven with the signals supplied to the wiring G1, the wiring G2, the wiring S1, and the wiring S2.

Figure 26A:
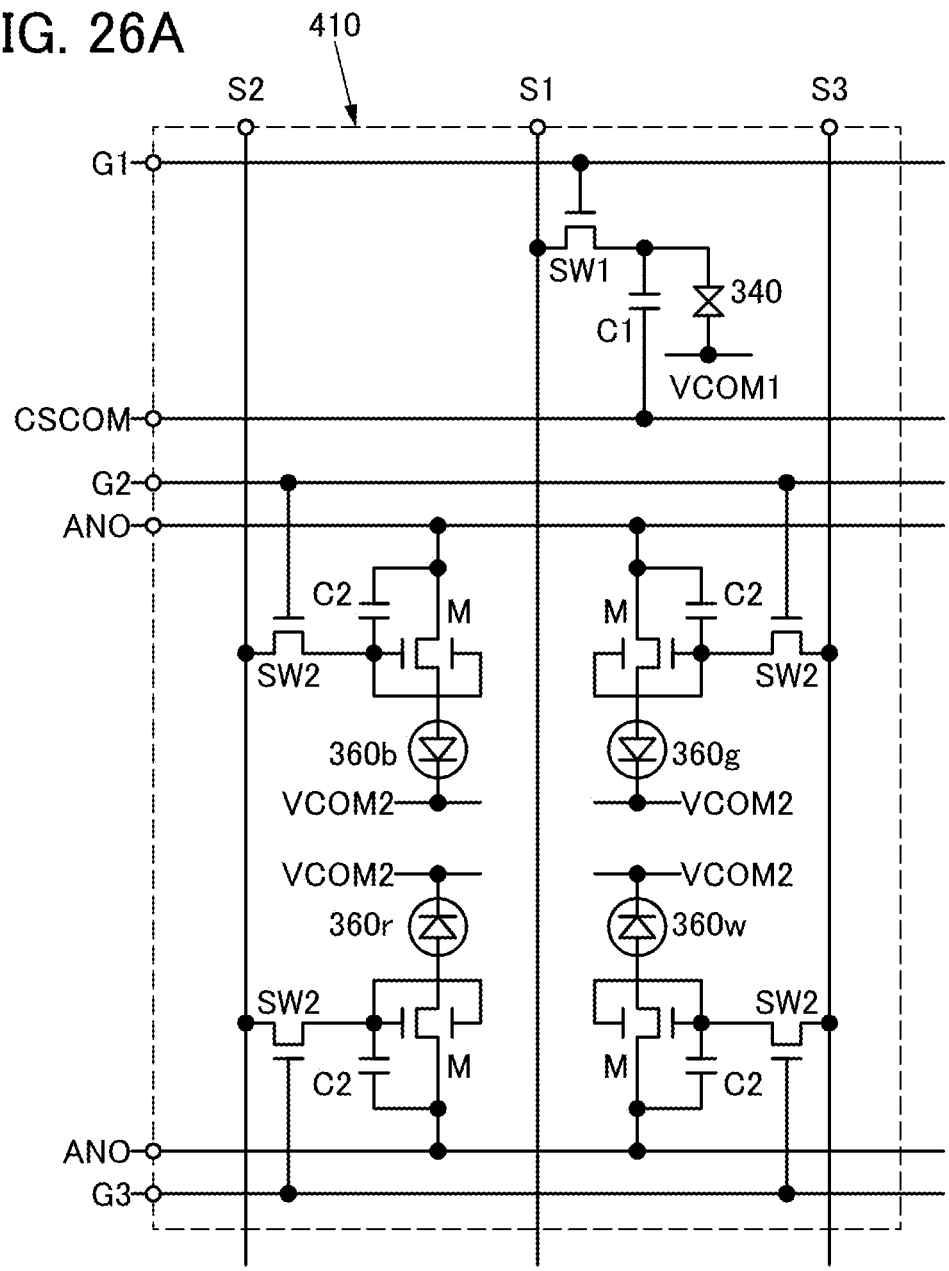
FIG. 26A is a circuit diagram illustrating an example of a pixel circuit in a display device.

Although FIG. 25 illustrates an example in which one liquid crystal element 340 and one light-emitting element 360 are provided in one pixel 410, one embodiment of the present invention is not limited thereto. FIG. 26A illustrates an example in which one liquid crystal element 340 and four light-emitting elements 360 (light-emitting elements 360r, 360g, 360b, and 360w) are provided in one pixel 410. The pixel 410 illustrated in FIG. 26A differs from that in FIG. 25 in being capable of displaying a full-color image with the use of the light-emitting elements by one pixel.

In FIG. 26A, in addition to the wirings in FIG. 25, a wiring G3 and a wiring S3 are connected to the pixel 410.

In the example in FIG. 26A, light-emitting elements emitting red light (R), green light (G), blue light (B), and white light (W) can be used as the four light-emitting elements 360, for example. Furthermore, as the liquid crystal element 340, a reflective liquid crystal element emitting white light can be used. Thus, in the case of displaying an image in the reflective mode, a white image can be displayed with high reflectivity. In the case of displaying an image in the transmissive mode, an image can be displayed with a higher color rendering property at low power consumption.

Figure 26B:
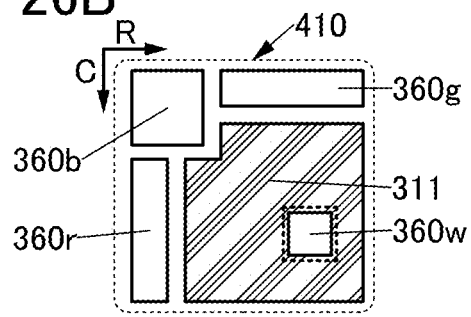
FIG. 26B illustrates an example of a pixel.

FIG. 26B illustrates a structure example of the pixel 410 corresponding to FIG. 26A. The pixel 410 includes the light-emitting element 360w overlapping with the opening included in the electrode 311 and the light-emitting element 360r, the light-emitting element 360g, and the light-emitting element 360b which are arranged in the periphery of the electrode 311. It is preferable that the light-emitting elements 360r, 360g, and 360b have almost the same light-emitting area.

This embodiment can be combined with any other embodiment as appropriate.

Embodiment 4

Described in this embodiment is a metal oxide applicable to a transistor disclosed in one embodiment of the present invention. In particular, details about a metal oxide and a cloud-aligned composite (CAC)-OS are described below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, an element M (M is gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium) may be contained.

For example, an In-M-Zn oxide with the CAC-OS composition has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and an oxide of the element M ($MO_{X3}$, where X3 is a real number greater than 0) or an M-Zn oxide ($M_{X4}Zn_{Y4}O_{Z4}$, where X4, Y4, and Z4 are real numbers greater than 0), and a mosaic pattern is formed. $InO_{X1}$ or $In_{X2}Zn_{Y2}O_{Z2}$ forming the mosaic pattern is distributed in the film. This composition is also referred to as a cloud-like composition.

In other words, an In-M-Zn oxide with the CAC-OS composition is a metal oxide in which a region including $MO_{X3}$ as a main component and a region including $InO_{X1}$ or $In_{X2}Zn_{Y2}O_{Z2}$ as a main component are mixed. Accordingly, the metal oxide is referred to as a composite metal oxide in some cases. Note that in this specification, for example, when the atomic ratio of In to an element M in a first region is higher than the atomic ratio of In to an element M in a second region, the first region has higher In concentration than the second region.

Note that in the metal oxide having the CAC-OS composition, a stacked-layer structure including two or more films with different atomic ratios is not included. For example, a two-layer structure of a film including In as a main component and a film including Ga as a main component is not included.

Specifically, of the CAC-OS, an In—Ga—Zn oxide with the CAC composition (such an In—Ga—Zn oxide may be particularly referred to as CAC-IGZO) is described. In the CAC-OS of an In—Ga—Zn oxide, materials are separated into $InO_{X1}$ or $In_{X2}Zn_{Y2}O_{Z2}$, and gallium oxide ($GaO_{X5}$, where X5 is a real number greater than 0) or gallium zinc oxide ($Ga_{X6}Zn_{Y6}O_{Z6}$, where X6, Y6, and Z6 are real numbers greater than 0), for example, and a mosaic pattern is formed. $InO_{X1}$ or $In_{X2}Zn_{Y2}O_{Z2}$ forming the mosaic pattern is a cloud-like metal oxide.

In other words, an In—Ga—Zn oxide including a CAC-OS is a composite metal oxide having a composition in which a region including $GaO_{X5}$ as a main component and a region including $In_{X2}Zn_{Y2}O_{Z2}$ or $InO_{X1}$ as a main component are mixed. A boundary between the region including $GaO_{X5}$ as a main component and the region including $In_{X2}Zn_{Y2}O_{Z2}$ or $InO_{X1}$ as a main component is not clearly observed in some cases.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a layered crystal structure in which a plurality of IGZO nanocrystals have c-axis alignment and are connected in the a-b plane direction without alignment.

In this specification and the like, CAC-IGZO can be defined as a metal oxide containing In, Ga, Zn, and O in the state where a plurality of regions containing Ga as a main component and a plurality of regions containing In as a main component are each dispersed randomly forming a mosaic pattern.

The crystallinity of the In—Ga—Zn oxide including a CAC-OS can be analyzed by electron diffraction. For example, a ring-like region with high luminance is observed in an electron diffraction pattern image. Furthermore, a plurality of spots are observed in the ring-like region in some cases.

The In—Ga—Zn oxide including a CAC-OS has a structure different from that of an IGZO compound in which metal elements are evenly distributed, and has characteristics different from those of the IGZO compound. That is, in the In—Ga—Zn oxide including a CAC-OS, regions including $GaO_{X5}$ or the like as a main component and regions including $In_{X2}Zn_{Y2}O_{Z2}$ or $InO_{X1}$ as a main component are separated to form a mosaic pattern.

In the case where aluminum, silicon, boron, yttrium, tin, copper, vanadium, beryllium, titanium, iron, nickel, germanium, zirconium, molybdenum, lanthanum, cerium, neodymium, hafnium, tantalum, tungsten, or magnesium is contained instead of gallium in a CAC-OS, nanoparticle regions including the metal element as a main component are observed in part of the CAC-OS and nanoparticle regions including In as a main component are observed in part thereof, and these nanoparticle regions are randomly dispersed to form a mosaic pattern in the CAC-OS.

The conductivity of a region including $In_{X2}Zn_{Y2}O_{Z2}$ or $InO_{X1}$ as a main component is higher than that of a region including $GaO_{X5}$ or the like as a main component. In other words, when carriers flow through regions including $In_{X2}Zn_{Y2}O_{Z2}$ or $InO_{X1}$ as a main component, conductivity is exhibited. Accordingly, when regions including $In_{X2}Zn_{Y2}O_{Z2}$ or $InO_{X1}$ as a main component are distributed in a metal oxide like a cloud, high field-effect mobility ($\mu$) can be achieved.

In contrast, the insulating property of a region including $GaO_{X5}$ or the like as a main component is higher than that of a region including $In_{X2}Zn_{Y2}O_{Z2}$ or $InO_{X1}$ as a main component. In other words, when regions including $GaO_{X5}$ or the like as a main component are distributed in a metal oxide, leakage current can be suppressed and favorable switching operation can be achieved.

Accordingly, when an In—Ga—Zn oxide including a CAC-OS is used for a semiconductor element, the insulating property derived from $GaO_{X5}$ or the like and the conductivity derived from $In_{X2}Zn_{Y2}O_{Z2}$ or $InO_{X1}$ complement each other, whereby a high on-state current ($I_{on}$), high field-effect mobility ($\mu$), and a low off-state current ($I_{off}$) can be achieved.

A semiconductor element that includes an In—Ga—Zn oxide including a CAC-OS has high reliability. Thus, the In—Ga—Zn oxide including a CAC-OS is suitably used in a variety of semiconductor devices typified by a display.

This embodiment can be combined with any other embodiment as appropriate.

Embodiment 5

In this embodiment, a display module and electronic devices of embodiments of the present invention are described.

Figure 27:
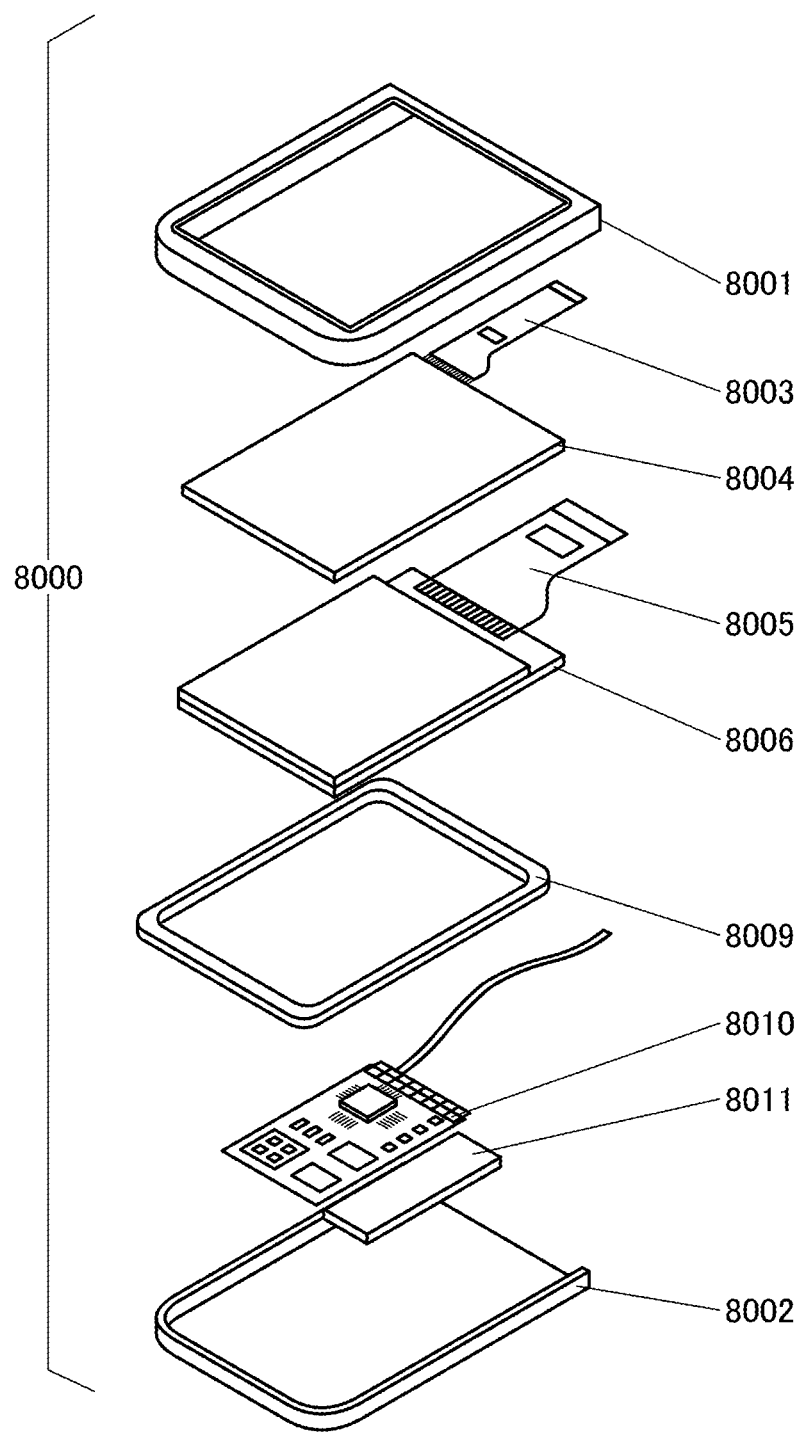
FIG. 27 illustrates an example of a display module.

In a display module 8000 in FIG. 27, a touch panel 8004 connected to an FPC 8003, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for, for example, the display panel 8006. Thus, the display module can be manufactured with high yield.

The shape and size of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. Instead of providing the touch panel 8004, the display panel 8006 may have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

According to one embodiment of the present invention, highly reliable electronic devices having curved surfaces can be manufactured. According to one embodiment of the present invention, flexible and highly reliable electronic devices can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 28A:
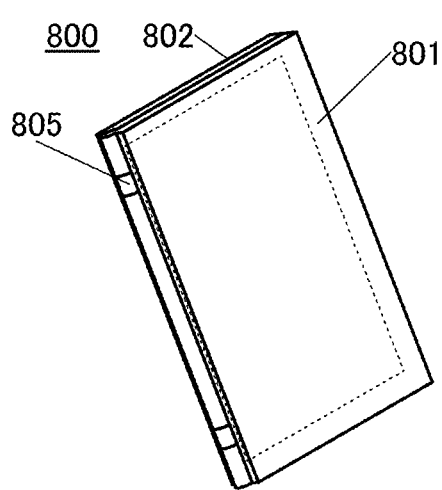
FIGS. 28A to 28D illustrate examples of electronic devices.
Figure 28B:
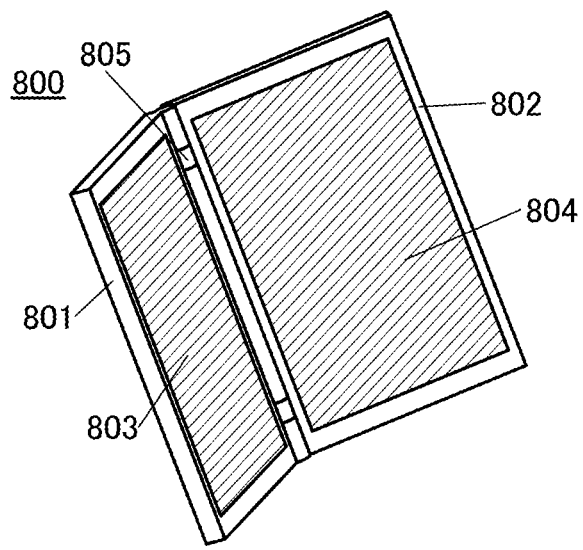

A portable information terminal 800 illustrated in FIGS. 28A and 28B includes a housing 801, a housing 802, a display portion 803, a display portion 804, a hinge portion 805, and the like.

The housing 801 and the housing 802 are joined together with the hinge portion 805. The portable information terminal 800 can be opened as illustrated in FIG. 28B from a closed state (FIG. 28A).

The display device manufactured using one embodiment of the present invention can be used for at least one of the display portion 803 and the display portion 804. Thus, the portable information terminal can be manufactured with high yield.

The display portion 803 and the display portion 804 can each display at least one of a text, a still image, a moving image, and the like. When a text is displayed on the display portion, the portable information terminal 800 can be used as an e-book reader.

Since the portable information terminal 800 is foldable, the portable information terminal 800 has high portability and excellent versatility.

A power button, an operation button, an external connection port, a speaker, a microphone, or the like may be provided for the housing 801 and the housing 802.

Figure 28C:
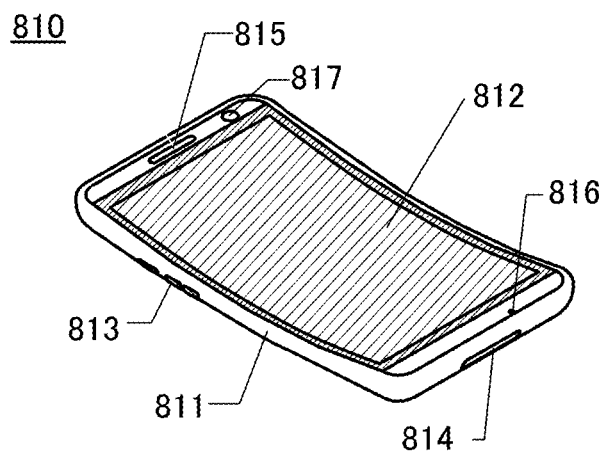

A portable information terminal 810 illustrated in FIG. 28C includes a housing 811, a display portion 812, an operation button 813, an external connection port 814, a speaker 815, a microphone 816, a camera 817, and the like.

The display device manufactured using one embodiment of the present invention can be used for the display portion 812. Thus, the portable information terminal can be manufactured with high yield.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 28D:
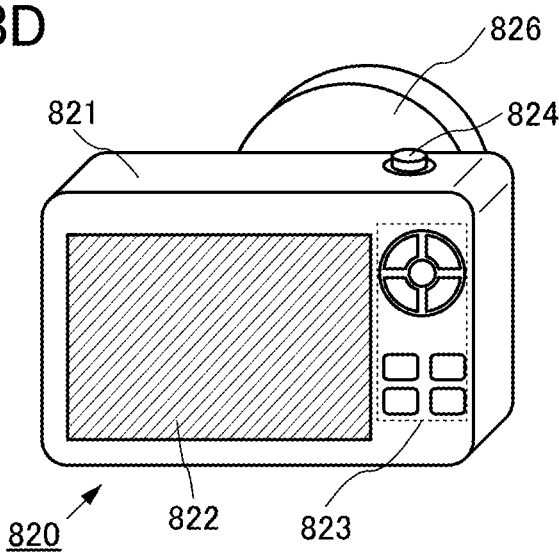

A camera 820 illustrated in FIG. 28D includes a housing 821, a display portion 822, operation buttons 823, a shutter button 824, and the like. Furthermore, an attachable lens 826 is attached to the camera 820.

The display device manufactured using one embodiment of the present invention can be used for the display portion 822. Thus, the camera can be manufactured with high yield.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which has a function of a touch panel.

Note that a stroboscope, a viewfinder, or the like can be additionally attached to the camera 820. Alternatively, these may be incorporated into the housing 821.

FIGS. 29A to 29E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using one embodiment of the present invention can be favorably used for the display portion 9001. Thus, the electronic devices can be manufactured with high yield.

The electronic devices illustrated in FIGS. 29A to 29E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 29A to 29E are not limited to the above, and the electronic devices may have other functions.

Figure 29A:
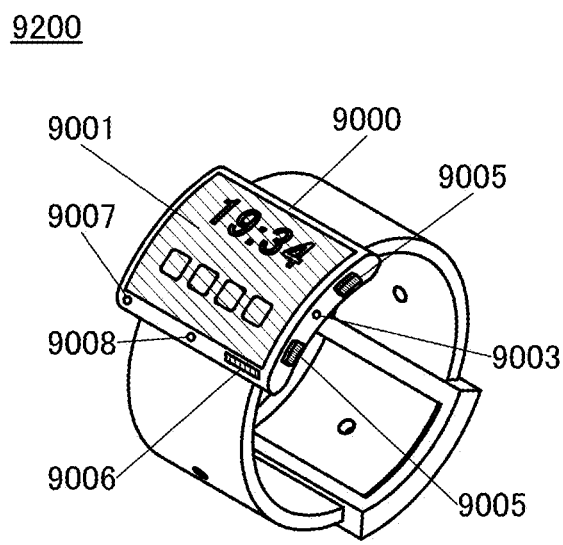
FIGS. 29A to 29E illustrate examples of electronic devices.
Figure 29B:
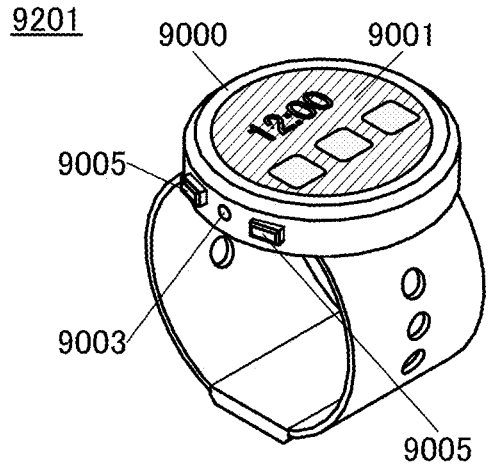

FIG. 29A is a perspective view of a watch-type portable information terminal 9200. FIG. 29B is a perspective view of a watch-type portable information terminal 9201.

The portable information terminal 9200 illustrated in FIG. 29A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 29A, the display surface of the display portion 9001 is not curved in the portable information terminal 9201 illustrated in FIG. 29B. Furthermore, the external state of the display portion of the portable information terminal 9201 is a non-rectangular shape (a circular shape in FIG. 29B).

Figure 29C:
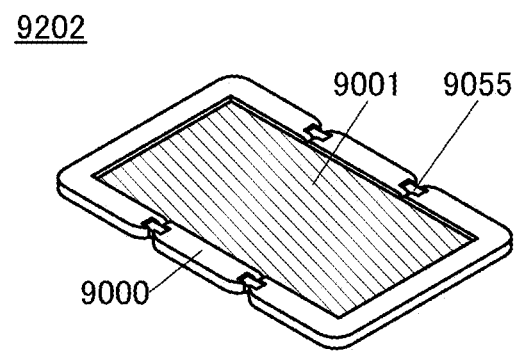
Figure 29D:
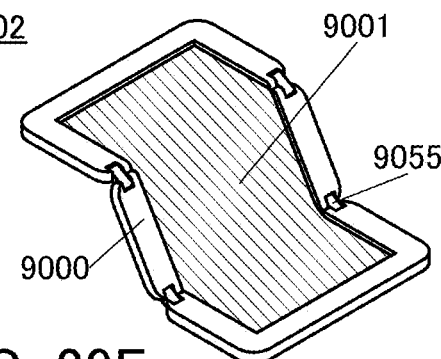
Figure 29E:
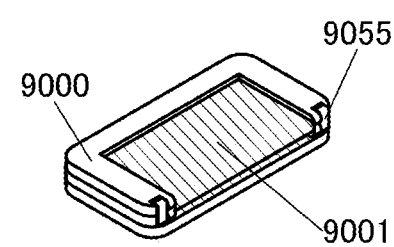

FIGS. 29C to 29E are perspective views of a foldable portable information terminal 9202. FIG. 29C is a perspective view illustrating the portable information terminal 9202 that is opened. FIG. 29D is a perspective view illustrating the portable information terminal 9202 that is being opened or being folded. FIG. 29E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

Example 1

In this example, three kinds of samples were fabricated and analyzed by thermal desorption spectroscopy (TDS).

[Fabrication of Sample]

Sample A was fabricated by forming an approximately 600-nm-thick silicon oxynitride film over a glass substrate by a plasma CVD method. The silicon oxynitride film was formed by a plasma CVD method under the following conditions: the flow rates of an $SiH_4$ gas and an $N_2O$ gas were 75 sccm and 1200 sccm, respectively, the power supply was 120 W, the pressure was 70 Pa, and the substrate temperature was 330° C.

Sample B was fabricated by forming an approximately 100-nm-thick film of indium tin oxide containing silicon (ITSO) over a glass substrate by a sputtering method. The ITSO film was formed by a sputtering method under the following conditions: the flow rates of an Ar gas and an $O_2$ gas were 125 sccm and 3 sccm, respectively, the power supply was 3.2 kW, the pressure was 0.23 Pa, and the substrate temperature was 25° C. (room temperature).

Sample C was formed in the following manner: an approximately 600-nm-thick silicon oxynitride film was formed over a glass substrate by a plasma CVD method and an approximately 30-nm-thick ITSO film was formed over the silicon oxynitride film by a sputtering method. Conditions for forming the silicon oxynitride film were similar to those used for Sample A. Conditions for forming the ITSO film were similar to those used for Sample B.

[TDS Analysis]

Figure 30A:
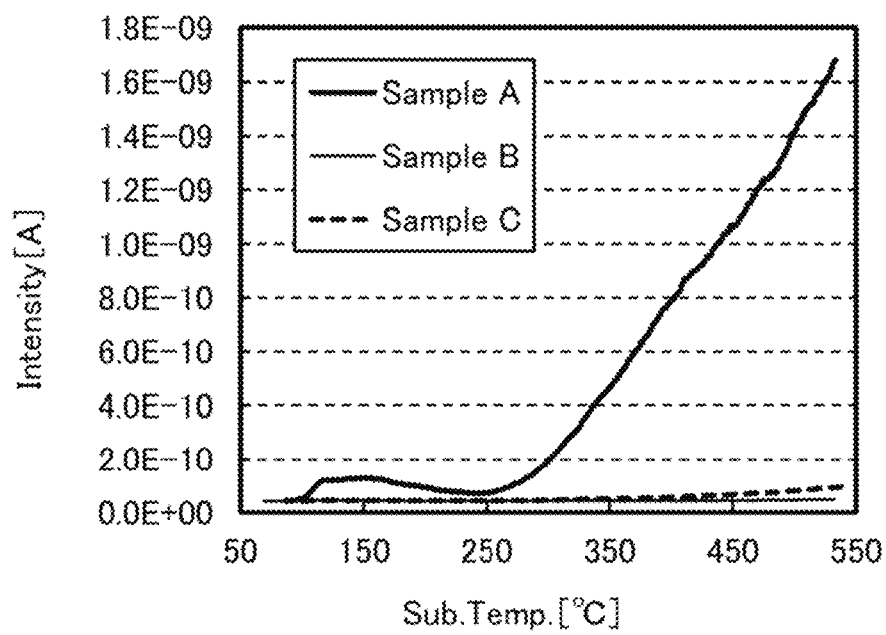
FIGS. 30A and 30B show TDS results of samples in Example 1.

For Samples A to C, the temperature dependence of the intensity at which the mass-to-charge ratio (m/z) of 2 corresponding to a hydrogen molecule was detected by TDS analysis was examined, and the results are shown in FIG. 30A.

Figure 30B:
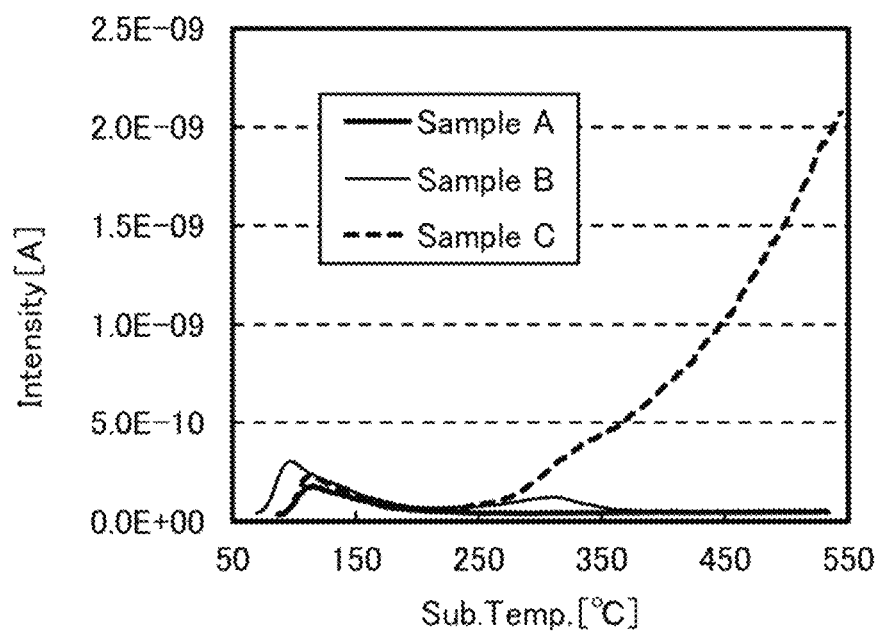

For Samples A to C, the temperature dependence of the intensity at which the mass-to-charge ratio (m/z) of 18 corresponding to a water molecule was detected by TDS analysis was examined, and the results are shown in FIG. 30B.

Almost no hydrogen was detected from Sample B and Sample C.

In Sample A in which the silicon oxynitride film was formed, the amount of detected hydrogen started to increase from approximately 250° C., and a larger amount of hydrogen was detected at higher temperatures. This shows that hydrogen is released from the silicon oxynitride film when heat treatment is performed at higher than or equal to 250° C.

In Sample C in which the ITSO film was formed over the silicon oxynitride film, the amount of detected water started to increase from approximately 250° C., and a larger amount of water was released at higher temperatures. This shows that water is released when heat treatment is performed on Sample C at higher than or equal to 250° C.

The results shown in FIGS. 30A and 30B suggest that hydrogen is released from the silicon oxynitride film when heat treatment is performed on Sample C at higher than or equal to 250° C. and that the released hydrogen and the oxygen in the ITSO film react with each other to produce water.

Example 2

In this example, the results of peeling a resin layer from a formation substrate are described.
[Fabrication of Sample]

A fabrication method of a sample of this example is described with reference to FIGS. 1A to 1F.

First, the hydrogen-containing layer 20 was formed over the formation substrate 14 (FIG. 1A). As the formation substrate 14, an approximately 0.7-mm-thick glass substrate was used. As the hydrogen-containing layer 20, an approximately 600-nm-thick silicon oxynitride film was formed. The silicon oxynitride film was formed by a plasma CVD method under the following conditions: the flow rates of an $SiH_4$ gas and an $N_2O$ gas were 75 sccm and 1200 sccm, respectively, the power supply was 120 W, the pressure was 70 Pa, and the substrate temperature was 330° C.

Then, the oxygen-containing layer 21 was formed over the hydrogen-containing layer 20 (FIG. 1A). As the oxygen-containing layer 21, an approximately 100-nm-thick film of indium tin oxide containing silicon (ITSO) was formed. The ITSO film was formed by a sputtering method under the following conditions: the flow rates of an Ar gas and an $O_2$ gas were 125 sccm and 3 sccm, respectively, the power supply was 3.2 kW, the pressure was 0.23 Pa, and the substrate temperature was 25° C. (room temperature).

Next, the first layer 24 was formed over the oxygen-containing layer 21 (FIG. 1B). The first layer 24 was formed using a material containing a non-photosensitive and soluble polyimide resin. Specifically, the first layer 24 was formed by a spin coating method at room temperature under the following conditions: the application amount was 40 ml, the application time was 12.5 sec, and the number of revolutions was 1000 rpm.

Subsequently, the first heat treatment was performed on the first layer 24, so that the resin layer 23 was formed (FIG. 1C). As the first heat treatment, baking was performed at 180° C. for 30 minutes while a mixed gas of a nitrogen gas and an oxygen gas (at 580 NL/min with an oxygen concentration of 20%) was supplied, followed by baking at 400° C. for one hour with supply of the same mixed gas. The resin layer 23 after the baking had a thickness of approximately 1.1 μm.

Next, the layer 25 to be peeled was formed over the resin layer 23 (FIG. 1D). The layer 25 to be peeled formed here had a stacked-layer structure with the assumption of the insulating layer 31 and the insulating layer 32 (the gate insulating layer of the transistor) that are illustrated in FIG. 2D. Specifically, an approximately 100-nm-thick silicon oxynitride film, an approximately 400-nm-thick silicon nitride film, and an approximately 50-nm-thick silicon oxynitride film were formed in that order over the resin layer 23. These films were formed by a plasma CVD method at a substrate temperature of 330° C.

Subsequently, the second heat treatment was performed. As the second heat treatment, baking was performed at 400° C. for one hour while a mixed gas of a nitrogen gas and an oxygen gas (at 580 NL/min with an oxygen concentration of 20%) was supplied.

Then, a UV-peeling tape was attached to the resin layer.

A peeling test was conducted on the sample of this example, in which the resin layer 23 was peeled from the formation substrate 14.

For the peeling test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. The sample had a size of 126 mm×25 mm.

Figure 31:
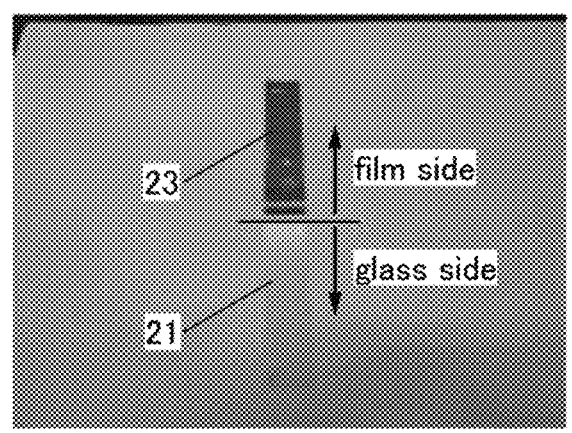
FIG. 31 is an external view photograph showing a result of a peeling test in Example 2.

FIG. 31 shows the result of peeling of the sample. In FIG. 31, the portion above the solid line is the substrate 75a side and the portion below the solid line is the formation substrate 14 side.

As shown in FIG. 31, the resin layer 23 remained on the substrate 75a side, which means that separation occurred at the interface between the oxygen-containing layer 21 and the resin layer 23.

Figure 32A:
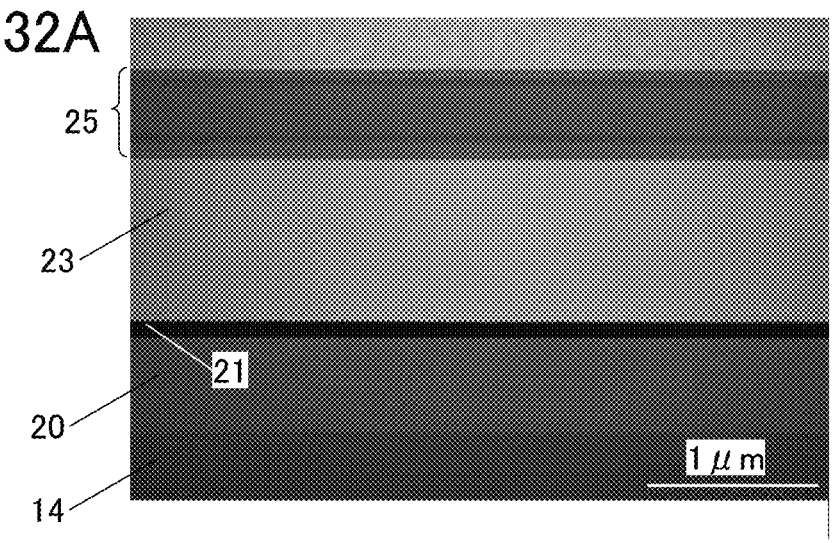
FIGS. 32A to 32C are cross-sectional STEM images of a sample in Example 2.
Figure 32B:
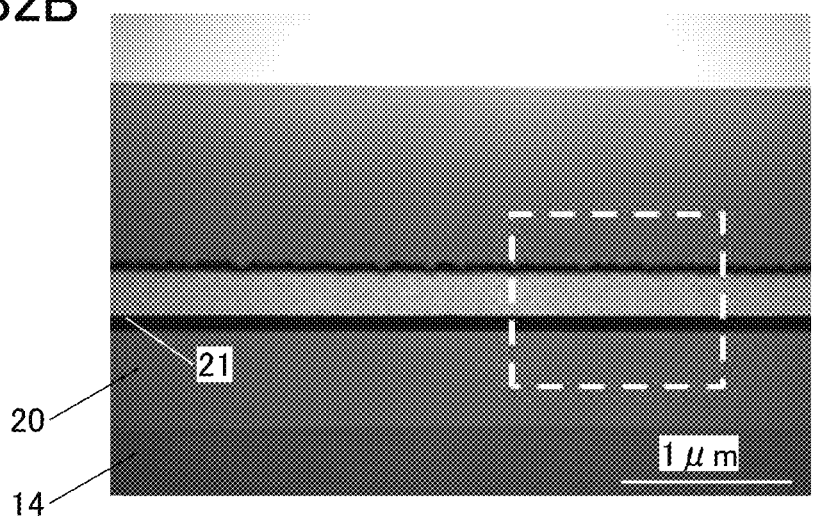
Figure 32C:
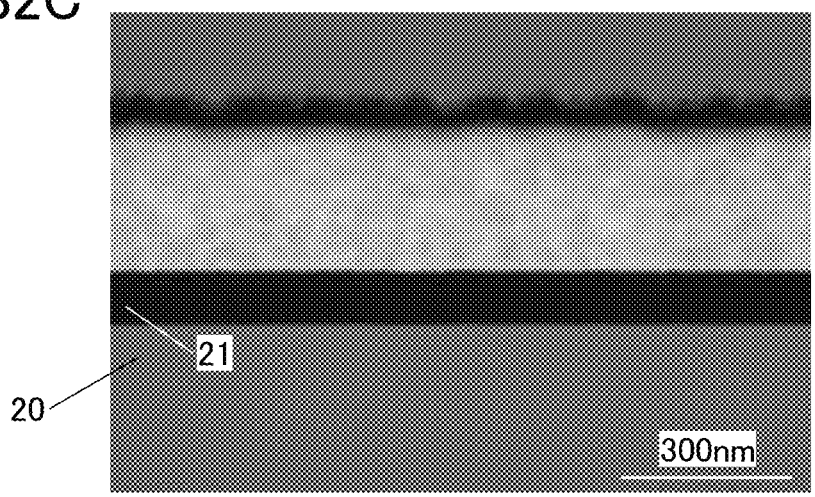

FIGS. 32A to 32C show the results of observation of the sample in this example by cross-sectional scanning transmission electron microscopy (STEM).

FIG. 32A is a cross-sectional STEM image of the sample before peeling. The sample is, specifically, the sample after the second heat treatment (see FIG. 1D). The layer over the layer 25 to be peeled is a coat layer that was formed for the observation.

FIGS. 32B and 32C are cross-sectional STEM images of the formation substrate 14 side after peeling. FIG. 32C is an enlarged image of the portion surrounded by the dotted line in FIG. 32B. The layer over the oxygen-containing layer 21 is a coat layer that was formed for the observation. The resin layer 23 was not observed between the oxygen-containing layer 21 and the coat layer.

Conduction at the peeling surface on the substrate 75a side after peeling was examined and there was no conduction. This suggests that almost no part of the oxygen-containing layer 21 remained at the peeling surface on the substrate 75a side.

The above results also revealed that separation occurred at the interface between the oxygen-containing layer 21 and the resin layer 23.

The results in Example 1 suggest that hydrogen is released from the hydrogen-containing layer 20 when the first heat treatment and the second heat treatment are performed and that the released hydrogen and the oxygen in the oxygen-containing layer 21 react with each other to produce water. In Example 2, it is probable that water existing between the oxygen-containing layer 21 and the resin layer 23 reduced adhesion therebetween, enabling separation at the interface therebetween.

REFERENCE NUMERALS

10A: display device, 10B: display device, 13: adhesive layer, 14: formation substrate, 20: hydrogen-containing layer, 21: oxygen-containing layer, 22: substrate, 23: resin layer, 24: first layer, 25: layer to be peeled, 28: adhesive layer, 29: substrate, 31: insulating layer, 32: insulating layer, 33: insulating layer, 34: insulating layer, 35: insulating layer, 40: transistor, 41: conductive layer, 43a: conductive layer, 43b: conductive layer, 43c: conductive layer, 44: metal oxide layer, 45: conductive layer, 49: transistor, 60: light-emitting element, 61: conductive layer, 62: EL layer, 63: conductive layer, 64: cut, 65: instrument, 66: laser light, 67:

irradiation region, 74: insulating layer, 75: protective layer, 75a: substrate, 75b: adhesive layer, 76: connector, 80: transistor, 81: conductive layer, 82: insulating layer, 83: metal oxide layer, 84: insulating layer, 85: conductive layer, 86a: conductive layer, 86b: conductive layer, 86c: conductive layer, 91: formation substrate, 92: hydrogen-containing layer, 93: resin layer, 94: oxygen-containing layer, 95: insulating layer, 96: partition, 97: coloring layer, 98: light-blocking layer, 99: adhesive layer, 112: liquid crystal layer, 113: electrode, 117: insulating layer, 121: insulating layer, 131: coloring layer, 132: light-blocking layer, 133a: alignment film, 133b: alignment film, 134: coloring layer, 135: polarizing plate, 141: adhesive layer, 142: adhesive layer, 170: light-emitting element, 180: liquid crystal element, 191: electrode, 192: EL layer, 193: electrode, 194: insulating layer, 201: transistor, 203: transistor, 204: connection portion, 205: transistor, 206: transistor, 207: connection portion, 211: insulating layer, 212: insulating layer, 213: insulating layer, 214: insulating layer, 216: insulating layer, 220: insulating layer, 221a: conductive layer, 221b: conductive layer, 222a: conductive layer, 222b: conductive layer, 223: conductive layer, 231: semiconductor layer, 242: connection layer, 243: connector, 252: connection portion, 300A: display device, 300B: display device, 300C: display device, 311: electrode, 311a: electrode, 311b: electrode, 340: liquid crystal element, 351: substrate, 360: light-emitting element, 360b: light-emitting element, 360g: light-emitting element, 360r: light-emitting element, 360w: light-emitting element, 361: substrate, 362: display portion, 364: circuit, 365: wiring, 372: FPC, 373: IC, 381: display portion, 382: driver circuit portion, 400: display device, 410: pixel, 451: opening, 800: portable information terminal, 801: housing, 802: housing, 803: display portion, 804: display portion, 805: hinge portion, 810: portable information terminal, 811: housing, 812: display portion, 813: operation button, 814: external connection port, 815: speaker, 816: microphone, 817: camera, 820: camera, 821: housing, 822: display portion, 823: operation button, 824: shutter button, 826: lens, 8000: display module, 8001: upper cover, 8002: lower cover, 8003: FPC, 8004: touch panel, 8005: FPC, 8006: display panel, 8009: frame, 8010: printed circuit board, 8011: battery, 9000: housing, 9001: display portion, 9003: speaker, 9005: operation key, 9006: connection terminal, 9007: sensor, 9008: microphone, 9055: hinge, 9200: portable information terminal, 9201: portable information terminal, 9202: portable information terminal.

This application is based on Japanese Patent Application serial no. 2016-156143 filed with Japan Patent Office on Aug. 9, 2016, the entire contents of which are hereby incorporated by reference.

The invention claimed is:

1. A manufacturing method of a semiconductor device, comprising the steps of:
   forming a hydrogen-containing layer over a substrate;
   forming an oxygen-containing layer over the hydrogen-containing layer;
   forming a first layer over the oxygen-containing layer with use of a material comprising a resin or a resin precursor;
   performing first heat treatment on the first layer in an oxygen-containing atmosphere to form a resin layer;
   forming an insulating layer covering an end portion of the resin layer so that a top surface of the oxygen-containing layer is in contact with the resin layer and with the insulating layer;
   forming a layer to be peeled over the insulating layer;
   making a cut in the layer to be peeled, the insulating layer, and the resin layer; and
   separating the resin layer and the oxygen-containing layer from each other,
   wherein the cut is made at a portion inward from the end portion of the resin layer,
   wherein the step of separating the resin layer and the oxygen-containing layer is performed without laser irradiation,
   wherein the hydrogen-containing layer is configured to release hydrogen by being heated, and
   wherein the oxygen-containing layer comprises a metal oxide containing indium, tin and silicon.

2. The manufacturing method of the semiconductor device, according to claim 1,
   wherein in the step of forming the layer to be peeled, a transistor is formed over the insulating layer, and
   wherein the layer to be peeled and the substrate are separated from each other after a separation trigger is formed by separation of at least part of the resin layer from the substrate.

3. The manufacturing method of the semiconductor device, according to claim 1, further comprising a step of performing second heat treatment in an oxygen-containing atmosphere after at least part of the layer to be peeled is formed.

4. The manufacturing method of the semiconductor device, according to claim 3,
   wherein the second heat treatment is performed at a temperature lower than or equal to a temperature of the first heat treatment.

5. The manufacturing method of the semiconductor device, according to claim 3,
   wherein the second heat treatment is performed while an oxygen-containing gas is supplied.

6. The manufacturing method of the semiconductor device, according to claim 1,
   wherein the first heat treatment is performed while an oxygen-containing gas is supplied.

7. The manufacturing method of the semiconductor device, according to claim 1,
   wherein the first heat treatment is performed at higher than or equal to 300° C. and lower than or equal to 450° C.

8. The manufacturing method of the semiconductor device, according to claim 1,
   wherein the hydrogen-containing layer comprises at least one of silicon oxide, silicon oxynitride, and amorphous silicon.

9. The manufacturing method of the semiconductor device, according to claim 1,
   wherein the first layer is formed with use of a solution with a viscosity of greater than or equal to 5 cP and less than 100 cP.

10. The manufacturing method of the semiconductor device, according to claim 1,
    wherein the first layer is formed with use of a spin coater.

11. The manufacturing method of the semiconductor device, according to claim 1,
    wherein the resin layer is formed to comprise a region with a thickness of greater than or equal to 1 μm and less than or equal to 3 μm.

12. The manufacturing method of the semiconductor device, according to claim 1,
    wherein the resin layer comprises a polyimide.

13. The manufacturing method of the semiconductor device, according to claim 1, wherein the layer to be peeled is formed at a temperature lower than or equal to the temperature of the first heat treatment.

14. A manufacturing method of a semiconductor device, comprising the steps of:

forming a hydrogen-containing layer over a substrate;

forming an oxygen-containing layer over the hydrogen-containing layer;

forming a first layer over the oxygen-containing layer with use of a material comprising a resin or a resin precursor;

performing heat treatment on the first layer in an oxygen-containing atmosphere to form a resin layer;

forming a layer to be peeled over the resin layer; and separating the resin layer and the oxygen-containing layer from each other, wherein the step of separating the resin layer and the oxygen-containing layer is performed without laser irradiation, wherein the hydrogen-containing layer is configured to release hydrogen by being heated, wherein the oxygen-containing layer comprises a metal oxide containing indium, and wherein the oxygen-containing layer is configured to release water to an interface between the resin layer and the oxygen-containing layer.

15. The manufacturing method of the semiconductor device, according to claim 14, wherein the water is produced by a reaction between the hydrogen released from the hydrogen-containing layer and oxygen contained in the oxygen-containing layer.

16. The manufacturing method of the semiconductor device, according to claim 14, wherein the metal oxide further contains tin and silicon.

* * * * *